(12) United States Patent
Yamanobe

(10) Patent No.: US 7,547,937 B2
(45) Date of Patent: Jun. 16, 2009

(54) SEMICONDUCTOR MEMORY DEVICE AND METHOD FOR MANUFACTURING THE SAME

(75) Inventor: Tomomi Yamanobe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 489 days.

(21) Appl. No.: 11/277,926

(22) Filed: Mar. 29, 2006

(65) Prior Publication Data

US 2006/0244025 A1 Nov. 2, 2006

(30) Foreign Application Priority Data

Apr. 27, 2005 (JP) ............................. 2005-129330

(51) Int. Cl.
*H01L 27/108* (2006.01)
(52) U.S. Cl. ................. 257/296; 257/306; 257/311; 257/E21.006; 257/E21.396; 438/386
(58) Field of Classification Search .............. 257/68, 257/71, 295–313, 905–908, E21.648, E21.008, 257/E21.396; 438/3, 238, 239, 386, 399
See application file for complete search history.

(56) References Cited

U.S. PATENT DOCUMENTS

| 5,289,416 A * | 2/1994 | Iwai et al. ............... 365/200 |
| 5,953,619 A | 9/1999 | Miyazawa et al. |
| 2002/0045311 A1 * | 4/2002 | Mikawa ................. 438/240 |

\* cited by examiner

*Primary Examiner*—Evan Pert
*Assistant Examiner*—Scott R Wilson
(74) *Attorney, Agent, or Firm*—Rabin & Berdo, P.C.

(57) ABSTRACT

A semiconductor memory device includes a first word-line, a first non-inverted bit-line, a first inverted bit-line, a first global interconnection layer, a first memory capacitor having a first storage electrode, a first counter electrode, and a first oxide dielectric film, a second memory capacitor having a second storage electrode, a second counter electrode, and a second oxide dielectric film, a first local interconnection layer including a first contact portion, a second contact portion, and a first non-contact portion, a first hydrogen barrier layer covering at least the first contact portion and the second contact portion of the first local interconnection layer, a first switching transistor having a first gate electrode, a second switching transistor having a second gate electrode, and a third switching transistor having a third gate electrode.

11 Claims, 42 Drawing Sheets

SEMICONDUCTOR MEMORY DEVICE AND METHOD FOR MANUFACTURING THE SAME

RELATED APPLICATIONS

The present application is related to commonly assigned and co-pending U.S. patent application titled "MEMORY CELL STRUCTURE AND SEMICONDUCTOR MEMORY DEVICE," filed on an even date herewith.

BACKGROUND OF THE INVENTION

Field of the Invention

The present invention relates to a semiconductor device that includes an oxide dielectric and a method for manufacturing the same, particularly (i) the surrounding structure of a local interconnection that electrically interconnects memory cells that include a metal oxide dielectric film and a method for manufacturing the same, and (ii) a semiconductor memory device that includes the surrounding structure of the local interconnection and a method for manufacturing the same.

In general, interconnections used in a semiconductor device can be classified as a global interconnection and a local interconnection. An electric connection over great distance is provided by a global interconnection. Therefore, a global interconnection is generally composed of a conductive material having a low resistance rate in order to reduce wiring delay. On the other hand, an electric connection over short distance is provided by a local interconnection, in contrast to the above described global interconnection. Because of this, a local interconnection has a lower level of demand for reducing wiring delay compared to the global interconnection. Therefore, the local interconnection can be composed of a conductive material having a resistance rate that is higher than that of the global interconnection.

The above described heretofore known points are hereinafter explained by using a semiconductor memory device as an example. The semiconductor memory device includes a two-dimensional matrix array of a plurality of memory cells. In addition, each memory cell is comprised of at least a capacitor and a switching transistor. Therefore, a memory cell array of a semiconductor memory device has a plurality of capacitors. It is preferable to increase the number of memory cells because storage capacity is increased by the increased number of memory cells. However, problems related to the wiring delay tend to be caused by the increase in the number of memory cells.

The amount of the wiring delay is increased by the increase in the capacitance connected to one wiring. In particular, when numerous capacitors are connected to one global interconnection and the total capacitance connected to the global interconnection grows large, a large wiring delay tends to be caused in the global interconnection. Therefore, the local interconnection that electrically connects a plurality of capacitors located within a local region of a memory cell is generally provided. Thus, the capacitance connected to the global interconnection is lowered by connecting the local interconnection to the global interconnection through a switching transistor. This structure makes it possible for a semiconductor memory device to have high speed operation properties.

The distance of the local interconnection is shorter than that of the global interconnection. Therefore, the demand for lowering the resistance rate of conductive material composed of the local interconnection is lower than that of the global interconnection. For example, the global interconnection can be composed of aluminum (Al). On the other hand, the local interconnection can be composed of titanium nitride (TiN). Japan Patent Application Publication JP-A-11-54716 (especially paragraph number 0035 and FIG. 13) discloses a local interconnection composed of titanium nitride (TiN).

Recently, demands for increasing the degree of integration of the above described memory cell array have been increasing. In order to increase the degree of integration of the memory cell array, technologies in which the capacitor obtains high capacitance and each memory cell is miniaturized are in demand. It is widely known that metal oxide ferroelectrics or metal oxide high dielectrics are used as a capacitor dielectric comprising a capacitor in response to these demands.

On the other hand, it is also well known that the ferroelectric properties of the metal oxide ferroelectrics or the high dielectric properties of metal oxide high dielectrics are deteriorated by means of the reduction of the metal oxide ferroelectrics or the metal oxide high dielectrics. Specifically, reduction reactions are caused between hydrogen and the metal oxide ferroelectrics or the metal oxide high dielectrics, and thus the ferroelectric properties or the high dielectric properties are deteriorated. An upper electrode of a capacitor having a capacitor dielectric comprised of the metal oxide ferroelectrics or the metal oxide high dielectrics is connected to an interconnection layer through a contact hole. In general, after the interconnection layer is formed, an interlayer insulating film is formed above a capacitor and a conductive contact plug is formed in a contact hole that is formed in an interlayer insulation film with the chemical vapor deposition method (the CVD method). In this step, in which the CVD method is conducted, hydrogen that functions as the reducing agent is generated. In other words, hydrogen that functions as the reducing agent is generated in a manufacturing step, such as a step in which the CVD method is conducted, after an interconnection layer that has a contact with the upper electrode of the capacitor is formed.

However, the above described interconnection layer having a contact with the upper electrode is generally comprised of hydrogen permeability conductive substance, such as titanium nitride (TiN) and aluminum (Al). In addition, the above described upper electrode is comprised of a hydrogen permeability conductive substance. Therefore, hydrogen penetrates into a capacitor dielectric through the interconnection layer and the upper electrode in a contact hole. Thus, reduction reactions are generated between hydrogen and the metal oxide ferroelectric or the metal oxide high dielectric. As a result, there is a possibility that the ferroelectric properties or the high dielectric properties of the capacitor dielectric will deteriorate. This deterioration makes it difficult for a capacitor to obtain high capacitance. Consequently, it becomes difficult for each memory cell to be miniaturized and further difficult for the degree of integration of the memory cell array to be increased.

SUMMARY OF THE INVENTION

It is therefore an object of the present invention to resolve the above described problems, and to provide a semiconductor memory device without the above described problems.

According to the first aspect of the present invention, a semiconductor memory device is comprised of (a) a first word-line, (b) a first non-inverted bit-line, (c) a first inverted bit-line, (d) a first global interconnection layer, (e) a first memory capacitor that is comprised of a first storage electrode, a first counter electrode, and a first oxide dielectric film formed between the first storage electrode and the first counter electrode, (f) a second memory capacitor that is comprised of a second storage electrode, a second counter electrode, and a second oxide dielectric film formed between the second storage electrode and the second counter electrode, (g) a first local interconnection layer that has electric conductive properties and hydrogen permeability properties and includes a first contact portion that has a contact with the first counter electrode and separated from the first oxide dielectric film through the first counter electrode, a second contact portion that has a contact with the second counter electrode and separated from the second oxide dielectric film through the second counter electrode, and a first non-contact portion that connects the first contact portion and the second contact portion and separated from the first memory capacitor and the second memory capacitor, (h) a first hydrogen barrier layer that has electric insulation properties and hydrogen non-permeability properties and covers at least the first contact portion and the second contact portion of the first local interconnection layer, (i) a first switching transistor that has a first gate electrode electrically connected to the first word-line and electrically connects the first non-inverted bit-line and the first storage electrode, (j) a second switching transistor that has a second gate electrode electrically connected to the first word-line and electrically connects the first inverted bit-line and the second storage electrode, and (k) a third switching transistor that has a third gate electrode electrically connected to the first word-line and electrically connects the first local interconnection layer and the first global interconnection layer.

In addition, it is an object of the present invention to provide a memory cell structure without the above described problems.

According to the second aspect of the present invention, a memory cell structure is comprised of (a) a first memory capacitor that is formed within a first local area and comprised of a first lower electrode, a first upper electrode, and a first oxide dielectric film formed between the first lower electrode and the upper electrode, (b) a second memory capacitor that is separated from the first memory capacitor and formed within the first local area and comprised of a second lower electrode, a second upper electrode, and a second oxide dielectric film formed between the second lower electrode and the second upper electrode, (c) a first local interconnection layer that has electric conductive properties and hydrogen permeability properties and is formed only within the first local area and comprised of a first contact portion that has a contact with the first upper electrode and is separated from the first oxide dielectric film through the first upper electrode, a second contact portion that has a contact with the second upper electrode and is separated from the second oxide dielectric film through the second upper electrode, and a first non-contact portion that connects the first contact portion and the second contact portion and is separated from the first memory capacitor and the second memory capacitor, and (d) a first hydrogen barrier layer that has electric isolation properties and hydrogen non-permeability properties and covers at least the first contact portion and the second contact portion of the first local interconnection layer.

According to the present invention, a hydrogen barrier structure is provided, which prevents or inhibits hydrogen that is supplied as the reducing agent when a layer structure is formed in the reducing atmosphere after an oxide dielectric is formed from diffusing into the oxide dielectric. In addition, a conductor that has electrical conductive properties and hydrogen permeability properties exists adjacent to the oxide dielectric. Furthermore, an interconnection layer is formed which includes a contact portion having contact with the oxide dielectric, and has electrical conductive properties and hydrogen permeability properties. According to this structure, once hydrogen enters the wiring layer, the wiring layer gives the hydrogen a diffusion pathway. In addition, there is a possibility for hydrogen to diffuse into the conductor through the contact portion. Furthermore, there is a possibility that hydrogen diffuses into the oxide dielectric substance from the dielectric substance, and the oxide dielectric is reduced by the hydrogen. Therefore, according to the present invention, a hydrogen barrier layer that has electric insulation properties and hydrogen non-permeability properties is formed to cover at least the contact portion of the interconnection layer. Then, a layer structure is formed in the reduction atmosphere. The contact portion of the interconnection layer is at least covered with the hydrogen barrier layer. Therefore, it is possible to prevent or inhibit hydrogen from diffusing into the oxide dielectric through the contact portion and the conductor.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of the original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. Here, the present invention is applied to a metal oxide ferroelectric capacitor in a FeRAM memory cell.

In the present application, the term "local interconnection" means an interconnection that is formed in a specific local area and provides electrical interconnections among a plurality of elements formed within the specific local area. On the other hand, the term "global interconnection" means an interconnection which is formed not only within a specific local area but also other areas and provides (i) electrical interconnections among a plurality of elements which are formed outside the specific local area but not localized in one local area that is different from the specific local area, or (ii) electrical interconnections between elements formed within the specific local area and elements formed outside the specific local area.

First Embodiment

In the first embodiment of the present invention, a semiconductor memory device includes a two-dimensional matrix array of a FeRAM cell having a ferroelectric capacitor and a logical circuit formed adjacent to the two-dimensional matrix array.

Semiconductor Memory Device Structure

Figure 1:
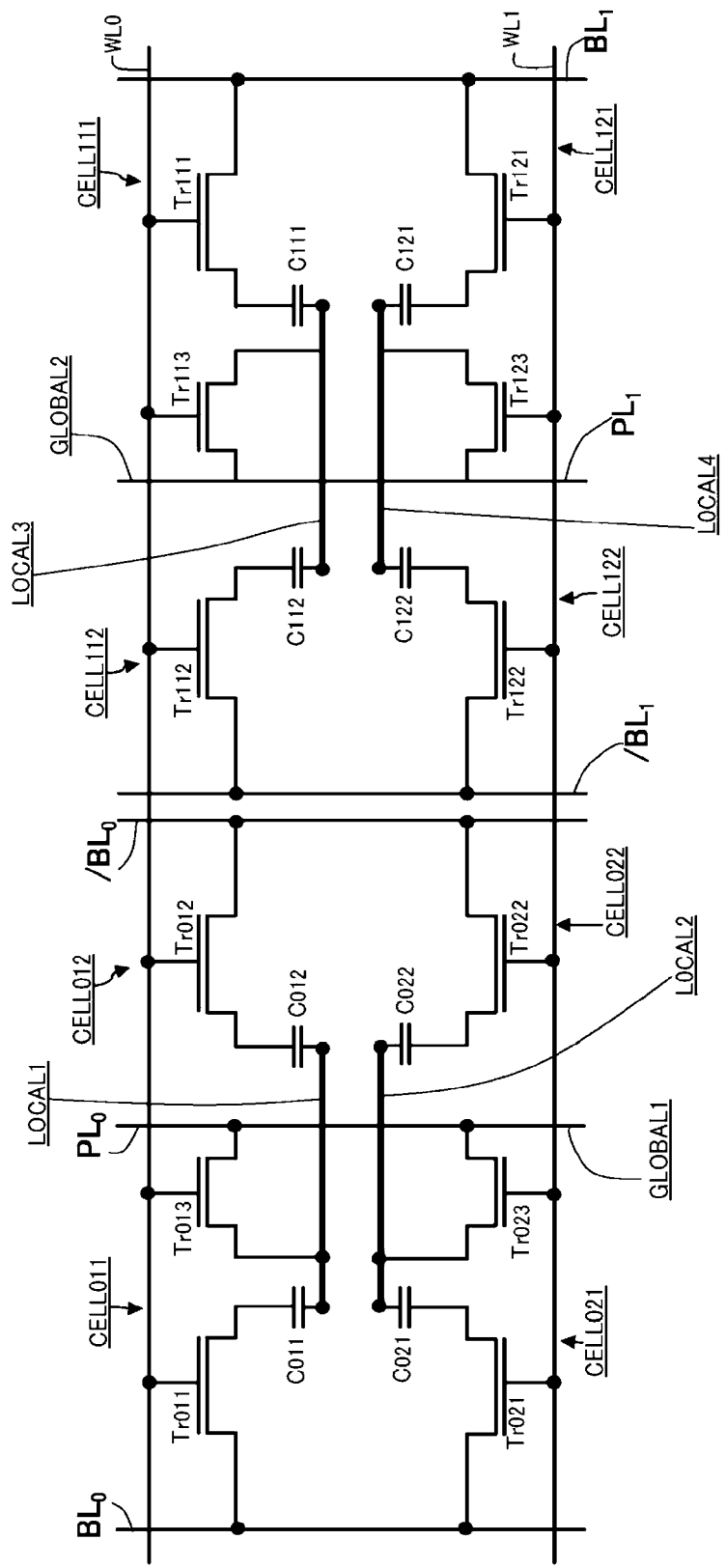
FIG. 1 is a partial equivalent circuit schematic showing a portion of the structure of a two-dimensional matrix array of FeRAM cell included in a semiconductor device in accordance with a first embodiment of a present invention.

FIG. 1 is a partial equivalent circuit schematic showing a portion of the structure of a two-dimensional matrix array of FeRAM cells included in a semiconductor memory device in accordance with the first embodiment of the present invention. The two-dimensional matrix array of FeRAM cells included in a semiconductor memory device in accordance with the first embodiment of the present invention includes a plurality of pairs of bit-lines, a plurality of word-lines, and FeRAM cells formed in a plurality of intersections between the plurality of bit-lines and the plurality of word-lines. Each FeRAM cell is comprised of a switching transistor and a memory capacitor.

Each memory capacitor is comprised of a storage electrode, a counter electrode, and a capacitor dielectric film formed between the storage electrode and the counter electrode. The switching transistor can be comprised of a field-effect transistor, more typically a MOS transistor. A control electrode of the field-effect transistor (i.e., a gate electrode) is connected to a word-line and receives a control signal transmitted through the word-line. The storage electrode of the above described memory capacitor is connected to a bit-line through the switching transistor. The storage electrode receives data transmitted through the bit-line and stores the data.

A pair of bit-lines is comprised of a bit-line that transmits data, and an inverted bit-line that transmits inverted data that is formed by inverting the data transmitted by the bit-line. One FeRAM cell is connected to a bit-line and stores data that is transmitted by the bit-line. Another FeRAM cell is located adjacent to the above described FeRAM cell. This FeRAM cell is connected to an inverted bit-line that is paired with a bit-line and stores inverted data that is transmitted by the inverted bit-line. In other words, two FeRAM cells are located adjacent to each other and paired. In addition, the two FeRAM cells are connected to two bit-lines that are located adjacent to each other and paired. Each of the gate electrodes of the switching transistor included in each of a pair of FeRAM cells is connected to one mutual word-line, and receives a mutual control signal that is transmitted by the mutual word-line.

In the first embodiment of the present invention, one local interconnection is connected to each of two bit-lines that are formed adjacent to each other and paired, and provides electrical interconnections between counter electrodes in a memory capacitor included in each of a pair of FeRAM cells that are located adjacent to each other. In other words, counter electrodes in a memory capacitor included in each of a pair of FeRAM cells are electrically connected to each other through a local interconnection. Furthermore, the local interconnection is connected to a global interconnection through another switching transistor that is different from a switching transistor included in each of the above described pair of FeRAM cells. The global interconnection is comprised of a plate-line. The switching transistor located between this plate-line functions as a global interconnection, and the above described local interconnection has a gate electrode. This gate electrode is connected to the above described mutual word-line to which the gate electrode in a switching transistor included in each of the above described pair of FeRAM cells is connected, and receives a mutual control signal that is transmitted by the mutual word-line. In other words, the gate electrode in the switching transistor included in each of the above described pair of FeRAM cells, and the gate electrode in the switching transistor located between the plate-line functioning as a global interconnection and the local interconnection, are connected to a mutual word-line. Thus these three switching transistors are controlled by the mutual control signal.

Therefore, the switching transistor included in each of the pair of FeRAM cells and the switching transistor located between the local interconnection and the plate-line are in a conduction state by means of a mutual control signal. Therefore, when data comprised of a non-inverted signal and inverted data comprised of an inverted signal are written to or read out from a storage electrode in a memory capacitor that is included in each of a pair of FeRAM cells, counter electrodes in the memory capacitor are electrically connected to a plate-line functioning as a global interconnection, and the plate-line has capacitance provided by the memory capacitor. However, a memory capacitor is not electrically connected to this plate-line functioning as a global interconnection except when data is written to and read out from the memory capacitor. Therefore, the global interconnection comprised of a plate-line essentially does not have a problem of outstanding wring delay. On the other hand, two memory capacitors are always electrically connected to each of the local interconnections. However, the distance of each of the local interconnections is much shorter than that of each of the global interconnections. Therefore, the local interconnections essentially do not have a problem of outstanding wiring delay.

FIG. 1 shows the structure of eight adjacent FeRAM cells, that is, the first to eighth FeRAM cells CELL011, CELL012, CELL021, CELL022, CELL111, CELL112, CELL121, and CELL 122.

The first FeRAM cell CELL011 and the second FeRAM cell CELL012 are connected to a pair of bit-line BL0 and an inverted bit-line /BL0, respectively, and mutually connected to a word-line WL0. In addition, the first FeRAM cell CELL011 and the second FeRAM cell CELL012 are mutually connected to a first local interconnection LOCAL1. The first local interconnection LOCAL1 is connected to a first global interconnection GLOBAL1 that is comprised of a plate-line PL0 through a switching transistor Tr013. The switching transistor Tr013 includes a gate electrode that is connected to a word-line WL0.

The first FeRAM cell CELL011 is comprised of a pair of a switching transistor Tr011 and a memory capacitor C011. The switching transistor Tr011 has a gate electrode that is connected to a word-line WL0 and receives a transmitted control signal through the word-line WL0. The memory capacitor C011 is comprised of a storage electrode, a counter electrode, and a capacitor dielectric film formed between the storage electrode and the counter electrode. The storage electrode is connected to the bit-line BL0 through the switching transistor Tr011 and receives and stores transmitted data through the bit-line BL0. The counter electrode of the memory capacitor C011 is connected to a counter electrode of a memory capacitor C012 through a first local interconnection LOCAL1 and also connected to a first global interconnection GLOBAL1 comprised of the plate-line PL0 through the first local interconnection LOCAL1 and the switching transistor Tr013.

The second FeRAM cell CELL012 is comprised of a pair of a switching transistor Tr012 and the memory capacitor C012. The switching transistor Tr012 includes a gate electrode which is connected to the word-line WL0, and receives transmitted control signal through the word-line WL0. The memory capacitor C012 is comprised of a storage electrode, a counter electrode, and a capacitor dielectric film that is formed between the storage electrode and the counter electrode. The storage electrode is connected to the inverted bit-line /BL0 through a switching transistor Tr012, and receives and stores transmitted data through the inverted bit-line /BL0. The counter electrode of the memory capacitor C012 is connected to the counter electrode of the memory capacitor C011 through the first local interconnection LOCAL1, and also connected to the first global interconnection GLOBAL1 comprised of the plate-line PL0 through the first local interconnection LOCAL1 and the switching transistor Tr013.

When data of the bit-line BL0 and inverted data of the inverted bit-line /BL0 are written to or read out from the storage electrodes of a pair of the memory capacitors C011 and C012, the counter electrodes of the memory capacitors C011 and C012 are electrically connected to the plate-line PL0 functioning as the first global interconnection GLOBAL1, and the plate-line PL0 has a capacitance which is provided by the memory capacitors C011 and C012. However, the memory capacitors C011 and C012 are not electrically connected to the plate-line PL0 functioning as the first global interconnection GLOBAL1 except when data is written to and read out from the memory capacitors C011 and C012. Therefore, the first global interconnection GLOBAL1 comprised of the plate-line PL0 essentially does not have a problem of significant wiring delay. On the other hand, the memory capacitors C011 and C012 are always connected to the first local interconnection LOCAL1. However, the length of the first local interconnection LOCAL1 is much shorter than that of the first global interconnection GLOBAL1. Therefore, the first local interconnection LOCAL1 essentially does not have a problem of significant wiring delay.

The third FeRAM cell CELL021 and the fourth FeRAM cell CELL022 are connected to a pair of the bit-line BL0 and the inverted bit-line /BL0, respectively, and also mutually connected to a word-line WL1. In addition, the third FeRAM cell CELL021 and the fourth FeRAM cell CELL022 are mutually connected to a second local interconnection LOCAL2. The second local interconnection LOCAL2 is connected to the first global interconnection GLOBAL1 comprised of the plate-line PL0 through a switching transistor Tr023. The switching transistor Tr023 has a gate electrode which is connected to the word-line WL1.

The third FeRAM cell CELL021 is comprised of a pair of a switching transistor Tr021 and a memory capacitor C021. The switching transistor Tr021 has a gate electrode which is connected to the word-line WL1, and receives a control signal that is transmitted through the word-line WL1. The memory capacitor C021 is comprised of a storage electrode, a counter electrode, and a capacitor dielectric film that is formed between the storage electrode and the counter electrode. The storage electrode is connected to the bit-line BL0 through the switching transistor Tr021 and receives and stores transmitted data through the bit-line BL0. The counter electrode of the memory capacitor C021 is electrically connected to the counter electrode of a memory capacitor C022 through the second local interconnection LOCAL2, and also connected to the first global interconnection GLOBAL1 comprised of the plate-line PL0 through the second local interconnection LOCAL2 and the switching transistor Tr023.

The fourth FeRAM cell CELL022 is comprised of a pair of a switching transistor Tr022 and the memory capacitor C022. The switching transistor Tr022 has a gate electrode which is connected to the word-line WL1, and receives the transmitted control signal through the word-line WL1. The memory capacitor C022 is comprised of a storage electrode, a counter electrode, and a capacitor dielectric film that is formed between the storage electrode and the counter electrode. The storage electrode is connected to the inverted bit-line /BL0 through the switching transistor Tr022, and receives and stores transmitted data through the inverted bit-line /BL0. The counter electrode of the memory capacitor C022 is connected to the counter electrode of the memory capacitor C021 through the second local interconnection LOCAL2, and also connected to the first global interconnection GLOBAL1 comprised of the plate-line PL0 through the second local interconnection LOCAL2 and the switching transistor Tr023.

When data of the bit-line BL0 and inverted data of the inverted bit-line /BL0 are written to or read out from the storage electrodes of a pair of the memory capacitors C021 and C022, the counter electrodes of the memory capacitors C021 and C022 are electrically connected to the plate-line PL0 functioning as the first global interconnection GLOBAL1, and the plate-line PL0 has a capacitance which is provided by the memory capacitors C021 and C022. However, the memory capacitors C021 and C022 are not electrically connected to the plate-line PL0 functioning as the first global interconnection GLOBAL1 except when data is written to and read out from the memory capacitors C021 and C022. Therefore, the first global interconnection GLOBAL1 comprised of the plate-line PL0 essentially does not have a problem of significant wiring delay. On the other hand, the memory capacitors C021 and C022 are always connected to the second local interconnection LOCAL2. However, the length of the second local interconnection LOCAL2 is much shorter than that of the first global interconnection GLOBAL1. Therefore, the second local interconnection LOCAL2 essentially does not have a problem of significant wiring delay.

The fifth FeRAM cell CELL111 and the sixth FeRAM cell CELL112 are connected to a pair of a bit-line BL1 and an inverted bit-line /BL1, respectively, and also mutually connected to the word-line WL0. In addition, the fifth FeRAM cell CELL111 and the sixth FeRAM cell CELL112 are mutually connected to a third local interconnection LOCAL3. The third local interconnection LOCAL3 is connected to a second global interconnection GLOBAL2 comprised of a plate-line PL1 through a switching transistor Tr113. The switching transistor Tr113 has a gate electrode which is connected to the word-line WL0.

The fifth FeRAM cell CELL111 is comprised of a pair of a switching transistor Tr111 and a memory capacitor C111. The switching transistor Tr111 has a gate electrode which is connected to the word-line WL0, and receives a control signal that is transmitted through the word-line WL0. The memory capacitor C111 is comprised of a storage electrode, a counter electrode, and a capacitor dielectric film that is formed between the storage electrode and the counter electrode. The storage electrode is connected to the bit-line BL1 through the switching transistor Tr111 and receives and stores data that is transmitted through the bit-line BL1. The counter electrode of the memory capacitor C111 is electrically connected to the counter electrode of a memory capacitor C112 through the third local interconnection LOCAL3, and also connected to the second global interconnection GLOBAL2 comprised of the plate-line PL1 through the third local interconnection LOCAL3 and the switching transistor Tr113.

The sixth FeRAM cell CELL112 is comprised of a pair of a switching transistor Tr112 and the memory capacitor C112. The switching transistor Tr112 has a gate electrode which is connected to the word-line WL0, and receives a control signal that is transmitted through the word-line WL0. The memory capacitor C112 is comprised of a storage electrode, a counter electrode, and a capacitor dielectric film that is formed between the storage electrode and the counter electrode. The storage electrode is connected to the inverted bit-line /BL1 through the switching transistor Tr112 and receives and stores data that is transmitted through the inverted bit-line /BL1. The counter electrode of the memory capacitor C112 is electrically connected to the counter electrode of the memory capacitor C111 through the third local interconnection LOCAL3, and also connected to the second global interconnection GLOBAL2 comprised of the plate-line PL1 through the third local interconnection LOCAL3 and the switching transistor Tr113.

When data of the bit-line BL1 and inverted data of the inverted bit-line /BL1 are written to or read out from the storage electrodes of a pair of the memory capacitors C111 and C112, the counter electrodes of the memory capacitors C111 and C112 are electrically connected to the plate-line PL1 functioning as the second global interconnection GLOBAL2, and the plate-line PL1 has a capacitance which is provided by the memory capacitors C111 and C112. However, the memory capacitors C111 and C112 are not electrically connected to the plate-line PL1 functioning as the second global interconnection GLOBAL2 except when data is written to and read out from the memory capacitors C111 and C112. Therefore, the second global interconnection GLOBAL2 comprised of the plate-line PL1 essentially does not have a problem of significant wiring delay. On the other hand, the memory capacitors C111 and C112 are always connected to the third local interconnection LOCAL3. However, the length of the third local interconnection LOCAL3 is much shorter than that of the second global interconnection GLOBAL2. Therefore, the third local interconnection LOCAL3 essentially does not essentially have a problem of significant wiring delay.

The seventh FeRAM cell CELL121 and the eighth FeRAM cell CELL122 are connected to a pair of the bit-line BL1 and the inverted bit-line /BL1, respectively, and also mutually connected to the word-line WL1. In addition, the seventh FeRAM cell CELL121 and the eighth FeRAM cell CELL122 are mutually connected to a fourth local interconnection LOCAL4. The fourth local interconnection LOCAL4 is connected to the second global interconnection GLOBAL2 comprised of the plate-line PL1 through a switching transistor Tr123. The switching transistor Tr123 has a gate electrode which is connected to the word-line WL1.

The seventh FeRAM cell CELL121 is comprised of a pair of a switching transistor Tr121 and a memory capacitor C121. The switching transistor Tr121 has a gate electrode which is connected to the word-line WL1, and receives control signal that is transmitted through the word-line WL1. The memory capacitor C121 is comprised of a storage electrode, a counter electrode, and a capacitor dielectric film that is formed between the storage electrode and the counter electrode. The storage electrode is connected to the bit-line BL1 through the switching transistor Tr121 and receives and stores data that is transmitted through the bit-line BL1. The counter electrode of the memory capacitor C121 is electrically connected to the counter electrode of a memory capacitor C122 through the fourth local interconnection LOCAL4, and also connected to the second global interconnection GLOBAL2 comprised of the plate-line PL1 through the fourth local interconnection LOCAL4 and the switching transistor Tr123.

The eighth FeRAM cell CELL122 is comprised of a pair of a switching transistor Tr122 and the memory capacitor C122. The switching transistor Tr122 has a gate electrode which is connected to the word-line WL1, and receives control signal that is transmitted through the word-line WL1. The memory capacitor C122 is comprised of a storage electrode, a counter electrode, and a capacitor dielectric film that is formed between the storage electrode and the counter electrode. The storage electrode is connected to the inverted bit-line /BL1 through the switching transistor Tr122 and receives and stores data that is transmitted through the inverted bit-line /BL1. The counter electrode of the memory capacitor C122 is electrically connected to the counter electrode of the memory capacitor C121 through the fourth local interconnection LOCAL4, and also connected to the second global interconnection GLOBAL2 comprised of the plate-line PL1 through the fourth local interconnection LOCAL4 and the switching transistor Tr123.

When data of the bit-line BL1 and inverted data of the inverted bit-line /BL1 are written to or read out from the storage electrodes of a pair of the memory capacitors C121 and C122, the counter electrodes of the memory capacitors C121 and C122 are electrically connected to the plate-line PL1 functioning as the second global interconnection GLOBAL2, and the plate-line PL1 has a capacitance which is provided by the memory capacitors C121 and C122. However, the memory capacitors C121 and C122 are not electrically connected to the plate-line PL1 functioning as the second global interconnection GLOBAL2 except when data is written to and read out from the memory capacitors C121 and C122. Therefore, the second global interconnection GLOBAL2 comprised of the plate-line PL1 essentially does not have a problem of significant wiring delay. On the other hand, the memory capacitors C121 and C122 are always connected to the fourth local interconnection LOCAL4. However, the length of the fourth local interconnection LOCAL4 is much shorter than that of the second global interconnection GLOBAL2. Therefore, the fourth local interconnection LOCAL4 essentially does not essentially have a problem of significant wiring delay.

As described above, a portion of the structure of the two-dimensional matrix array of the FeRAM cells, which are included in the semiconductor memory device in accordance with the first embodiment of the present invention, is explained in reference to the partial equivalent circuit schematic shown in FIG. 1. With reference to the figures, a protective structure in which a metal oxide dielectric in the ferroelectric included in the FeRAM is protected from reduction by hydrogen is hereinafter explained in detail as follows.

Figure 2:
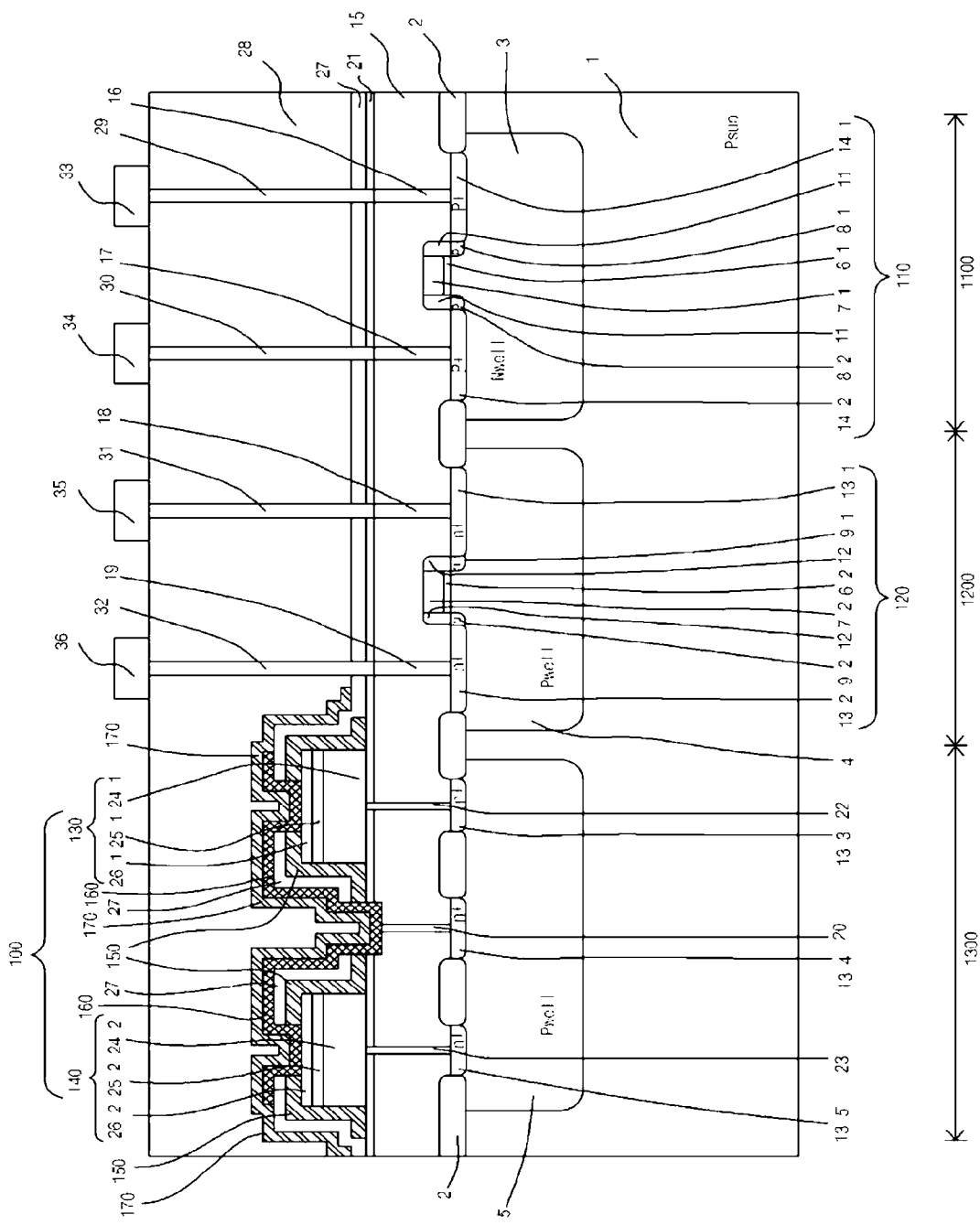
FIG. 2 is a partial vertical cross-section diagram showing a pair of FeRAM cells that have a ferroelectric capacitor in a FeRAM cell included in a semiconductor device in accordance with the first embodiment of the present invention, and a p-channel MOS transistor and a N-channel MOS transistor in a logical circuit included in the semiconductor device in accordance with the first embodiment of the present invention.

FIG. 2 is a partial vertical cross-section diagram showing a pair of FeRAM cells having a ferroelectric capacitor included in a semiconductor memory device in accordance with the first embodiment of the present invention, and a p-channel MOS transistor and a n-channel MOS transistor, both of which are included in a logical circuit in the semiconductor memory device.

As described above, the semiconductor memory device in accordance with the first embodiment of the present invention includes a two-dimensional matrix array of FeRAM cells and a logical circuit located adjacent to this matrix array. The two-dimensional matrix array of the FeRAM cells includes a plurality of pairs of the FeRAM cells that were described above in reference to FIG. 1. FIG. 2 shows the pair of the FeRAM cells, and the p-channel MOS transistor and the n-channel MOS transistor in the logical circuit formed adjacent to the pair of the FeRAM cells.

The semiconductor memory device is formed on a p-type single crystal semiconductor substrate 1. This p-type single crystal semiconductor substrate includes a first element region 1100, a second element region 1200, and a third element region 1300. The first element region 1100 includes a p-channel MOS transistor 110. The second element region 1200 includes a n-channel MOS transistor 120. The third element region 1300 includes the above described pair of FeRAM cells 100. The pair of FeRAM cells 100 shown in FIG. 2 corresponds to a pair of the first FeRAM cell CELL011 and the second FeRAM cell CELL012, a pair of the third FeRAM cell CELL021 and the fourth FeRAM cell CELL022, a pair of the fifth FeRAM cell CELL111 and the sixth FeRAM cell CELL112, or a pair of the seventh FeRAM cell CELL121 and the eighth FeRAM cell CELL122, all of which are shown in FIG. 1. The structures of these pairs of FeRAM cells are identical. FIG. 2 also shows either of the source/drain regions of a switching transistor in the FeRAM cell and either of the source/drain regions of a switching transistor that is formed between a local interconnection and a plate-line functioning as a global interconnection.

Figure 3:
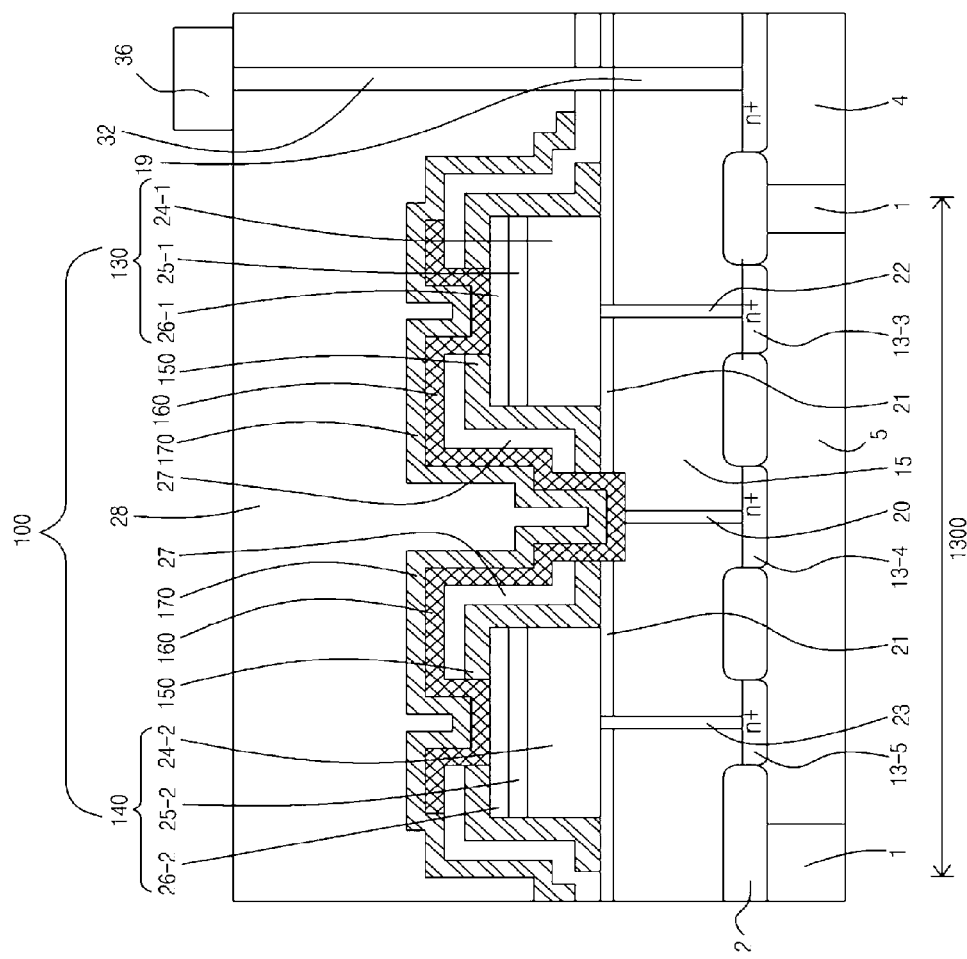
FIG. 3 is a partial enlarged vertical cross-section diagram of the pair of FeRAM cells shown in FIG. 2.

FIG. 3 is a partial enlarged vertical cross-section diagram of a pair of the FeRAM cells shown in FIG. 2. In reference to FIGS. 2 and 3, a portion of the structure of the semiconductor memory device in accordance with the first embodiment of the present invention is hereinafter explained in detail.

The principal surface of a p-type single crystal semiconductor substrate 1 includes an element isolation region comprised of a field oxide film 2 and an active region defined by the field oxide film 2. In addition, as described above, the p-type single crystal semiconductor substrate 1 includes the first element region 1100, the second element region 1200, and the third element region 1300. A n-type well 3 is formed in the first element region 1100, and the p-channel MOS transistor 110 is formed in the n-type well 3. A p-type well 4 is formed in the second element region 1200, and the n-channel MOS transistor 120 is formed in the p-type well 4. A p-type well 5 is formed in the third element region 1300, and a pair of the FeRAM cells 100 is formed in the p-type well 5. The p-type well 4 is separated from the n-type well 3, and the p-type well 5 is separated from the p-type well 4. The p-type well 4 is allocated between the n-type well 3 and the p-type well 5.

The p-channel MOS transistor 110 includes $P^+$ high concentration impurity diffusion regions 14-1 and 14-2, $P^-$ low concentration impurity diffusion regions 8-1 and 8-2, a first gate insulation film 6-1, a first gate electrode 7-1, and a first sidewall insulation film 11. The $P^+$ high concentration impurity diffusion regions 14-1 and 14-2 comprise source/drain regions. The $P^+$ high concentration impurity diffusion regions 14-1 and 14-2 are formed to be separated from each other in the n-type well 3. The $P^-$ low concentration impurity diffusion regions 8-1 and 8-2 are formed adjacent to the inner side of the $P^+$ high concentration impurity diffusion regions 14-1 and 14-2, respectively, and formed to be separated from each other in the n-type well 3. A first gate insulation film 6-1 is formed on the channel region that is defined between the $P^-$ low concentration impurity diffusion regions 8-1 and 8-2. A first gate electrode 7-1 is formed on the first gate insulation film 6-1. The first sidewall insulation film 11 is formed on the sidewall of the first gate electrode 7-1. The $P^-$ low concentration impurity diffusion regions 8-1 and 8-2 overlaps with the first sidewall insulation film 11 in the horizontal direction. The $P^+$ high concentration impurity diffusion regions 14-1 and 14-2 are offset from the first gate electrode 7-1 through the $P^-$ low concentration impurity diffusion regions 8-1 and 8-2, both of which are located immediately below the first sidewall insulation film 11, and thus reduces the electric field generated at the bottom corner of the first gate electrode 7-1.

Furthermore, in the present application, the term "first horizontal direction" means a direction that is parallel to the principal surface of the p-type single crystal semiconductor substrate 1, in other words, a direction in which two capacitors in a pair of the FeRAM cells 100 are separated from each other.

In addition, the n-channel MOS transistor 120 includes $N^+$ high concentration impurity diffusion regions 13-1 and 13-2, $N^-$ low concentration impurity diffusion regions 9-1 and 9-2, a second gate insulation film 6-2, a second gate electrode 7-2, and a second sidewall insulation film 12. $N^+$ high concentration impurity diffusion regions 13-1 and 13-2 comprise source/drain regions. The $N^+$ high concentration impurity diffusion regions 13-1 and 13-2 are formed to be separated from each other in the p-type well 4. The $N^-$ low concentration impurity diffusion regions 9-1 and 9-2 are formed adjacent to the inner side of the $N^+$ high concentration impurity diffusion regions 13-1 and 13-2, respectively and formed to be separated from each other in the p-type well 4. The second gate insulation film 6-2 is formed on the channel region in the p-type well 4 that is defined between the $N^-$ low concentration impurity diffusion regions 9-1 and 9-2. The second gate electrode 7-2 is formed on the second gate insulation film 6-2. The second sidewall insulation film 12 is formed on the sidewall of the second gate electrode 7-2. The $N^-$ low concentration impurity diffusion regions 9-1 and 9-2 overlaps with the second sidewall insulation film 12 in the first horizontal direction. The $N^+$ high concentration impurity diffusion regions 13-1 and 13-2 are offset from the second gate electrode 7-2 through the $N^-$ low concentration impurity diffusion regions 9-1 and 9-2, both of which are located immediately below the second sidewall insulation film 12, and thus reduces the electric field generated at the bottom corner of the second gate electrode 7-2.

A pair of FeRAM cells 100 is formed on the p-type well 5. The pair of the FeRAM cells 100 is comprised of a first FeRAM cell and a second FeRAM cell. The first FeRAM cell is comprised of a pair of a switching transistor and a first capacitor 130. The second FeRAM cell is comprised of a pair of a switching transistor and a second capacitor 140. Both of the first and second FeRAM cells are stack-type memory cells. In other words, the first capacitor 130 and the second capacitor 140 are formed above a corresponding switching transistor, respectively.

The switching transistor in the first FeRAM cell and the switching transistor in the second FeRAM cell are formed to be separated from each other in the p-type well 5. In addition, a switching transistor that is located between a local interconnection and a plate-line functioning as a global interconnection is formed in the p-type well 5. The switching transistor that is located between the local interconnection and the plate-line functioning as the global interconnection is formed between the switching transistor in the above described first FeRAM cell and the switching transistor in the above described second FeRAM cell, and is separated from these switching transistors through the field oxide film 2. A $N^+$ high concentration impurity diffusion region 13-3 is formed in the p-type well 5, and comprises either of the source/drain regions of the switching transistor in the first FeRAM cell. A $N^+$ high concentration impurity diffusion region 13-4 is separated form the above described $N^+$ high concentration impurity diffusion region 13-3 through the field oxide film 2, and formed in the p-type well 5. $N^+$ high concentration impurity diffusion region 13-4 comprises either of the source/drain regions of the switching transistor that is located between the local interconnection and the plate-line functioning as he global interconnection. A $N^+$ high concentration impurity diffusion region 13-5 is separated from the $N^+$ high concentration impurity diffusion region 13-4 through the field oxide film 2, and formed in the p-type well 5. The $N^+$ high concentration impurity diffusion region 13-5 comprises either of the source/drain regions of the switching transistor in the second FeRAM cell.

A first interlayer insulation film 15 is formed on the p-type single crystal semiconductor substrate 1, the field oxide film 2, the p-channel MOS transistor 110, the n-channel MOS transistor 120, the switching transistors in the first and second FeRAM cells, and the switching transistor that is located between the local interconnection and the plate-line functioning as the global interconnection.

In addition, a first conductive contact plug 16 is formed in the first interlayer insulation film 15. More specifically, the first conductive contact plug 16 penetrates the first interlayer insulation film 15 and has a contact with the $P^+$ high concentration impurity diffusion region 14-1 of the p-channel MOS transistor 110. A second conductive contact plug 17 is formed in the first interlayer insulation film 15. More specifically, the second conductive contact plug 17 penetrates the first interlayer insulation film 15 and has a contact with the $P^+$ high concentration impurity diffusion region 14-2 of the p-channel MOS transistor 110. Furthermore, a third conductive contact plug 18 is formed in the first interlayer insulation film 15. More specifically, the third conductive contact plug 18 penetrates the first interlayer insulation film 15, and has a contact with the $N^+$ high concentration impurity diffusion region 13-1 of the n-channel MOS transistor 120. In addition, a fourth conductive contact plug 19 is formed in the first interlayer insulation film 15. More specifically, the fourth conductive contact plug 19 penetrates the first interlayer insulation film 15, and has a contact with the $N^+$ high concentration impurity diffusion region 13-2 of the n-channel MOS transistor 120. Furthermore, a fifth conductive contact plug 20 is formed in the first interlayer insulation film 15. More specifically, the fifth conductive contact plug 20 penetrates the first interlayer insulation film 15, and has a contact with the $N^+$ concentration impurity diffusion region 13-4 of the switching transistor that is located between the local interconnection and the plate-line functioning as the global interconnection.

A second interlayer insulation film 21 is formed on the first interlayer insulation film 15. Furthermore, a sixth conductive contact plug 22 is formed in a laminated body that is comprised of the first interlayer insulation film 15 and the second interlayer insulation film 21. More specifically, the sixth conductive contact plug 22 penetrates the laminated body that is comprised of the first interlayer insulation film 15 and the second interlayer insulation film 21, and has a contact with the $N^+$ high concentration impurity diffusion region 13-3 of the switching transistor of the first FeRAM cell. In addition, a seventh conductive contact plug 23 is formed in the laminated body that is comprised of the first interlayer insulation film 15 and the second interlayer insulation film 21. More specifically, the seventh conductive contact plug 23 penetrates the laminated body that is comprised of the first interlayer insulation film 15 and the second interlayer insulation film 21, and has a contact with the $N^+$ high concentration impurity diffusion region 13-5 of the switching transistor in the second FeRAM cell.

The first FeRAM cell includes the first capacitor 130 that is formed above the switching transistor. On the other hand, the second FeRAM cell includes the second capacitor 140 that is formed above the switching transistor. Both of the first capacitor 130 and the second capacitor 140 function as the memory capacitors that were described above in reference to FIG. 1.

The first capacitor 130 is comprised of a first lower electrode 24-1, a first upper electrode 26-1, and a first metal oxide ferroelectric film 25-1 that is formed between the first lower electrode 24-1 and the first upper electrode 26-1. The first lower electrode 24-1 and the first upper electrode 26-1 function as the storage electrode and the counter electrode, which were described above in reference to FIG. 1, respectively. The first lower electrode 24-1 functioning as a storage electrode is formed on the second interlayer insulation film 21 and the sixth conductive contact plug 22. Here, the first lower electrode 24-1 has a contact with the upper portion of the sixth conductive contact plug 22. The first lower electrode 24-1 is electrically connected to the $N^+$ high concentration impurity diffusion region 13-3 of the switching transistor in the first FeRAM cell through the sixth conductive contact plug 22. The switching transistor is connected to the bit-line that was described above in reference to FIG. 1. In addition, the switching transistor has a gate electrode (not shown in the figure), and the gate electrode is connected to the word-line that was described above in reference to FIG. 1.

The second capacitor 140 is comprised of a second lower electrode 24-2, a second upper electrode 26-2, and a second metal oxide ferroelectric film 25-2 that is formed between the second lower electrode 24-2 and the second upper electrode 26-2. The second lower electrode 24-2 and the second upper electrode 26-2 function as the storage electrode and the counter electrode, which were described above in reference to FIG. 1, respectively. The second lower electrode 24-2 functioning as a storage electrode is formed on the second interlayer insulation film 21 and the seventh conductive contact plug 23. Here, the second lower electrode 24-2 has a contact with the upper portion of the seventh conductive contact plug 23. The second lower electrode 24-2 is electrically connected to the $N^+$ high concentration impurity diffusion region 13-5 of the switching transistor in the second FeRAM cell through the seventh conductive contact plug 23. The switching transistor is connected to the bit-line that was described above in reference to FIG. 1. The switching transistor has a gate electrode (not shown in the figure), and the gate electrode is connected to the word-line that was described above in reference to FIG. 1.

A first insulating hydrogen barrier layer 150 is formed in the semiconductor memory device. The first insulating hydrogen barrier layer 150 has electrical insulation properties and hydrogen non-permeability properties. The first insulating hydrogen barrier layer 150 is formed along the sidewall and the upper surface of the first capacitor 130 and the second capacitor 140, respectively, and also formed on portions of the second interlayer insulation film 21, which corresponds to the surrounding portions of the first capacitor 130 and the second capacitor 140, for the purpose of covering the first capacitor 130 and the second capacitor 140. Here, the first insulating hydrogen barrier layer 150 has contacts with the sidewall and the upper surface of the first capacitor 130 and the second capacitor 140.

Furthermore, a third interlayer insulation film 27 is formed in the semiconductor memory device. The third interlayer insulation film 27 is formed on the first insulating hydrogen barrier layer 150 and the second interlayer insulation film 21. In addition, two contact holes are formed on a portion of the upper surface of the first upper electrode 26-1 functioning as the counter electrode of the first capacitor 130, and on a portion of the upper surface of the second upper electrode 26-2 functioning as a counter electrode of the second capacitor 140, respectively. More specifically, these two contact holes penetrate a laminated body that is comprised of the third interlayer insulation film 27 and the first insulating hydrogen barrier layer 150, and reaches the portion of the upper surface of the first upper electrode 26-1 and the portion of the upper surface of the second upper electrode 26-2. Furthermore, another contact hole is formed on the above described fifth conductive contact plug 20 between the first capacitor 130 and the second capacitor 140. This contact hole penetrates the laminated body that is comprised of the third interlayer insulation film 27, the first insulating hydrogen barrier layer 150, and the second interlayer insulation film 21, and reaches the upper portion of the first interlayer insulation film 15. Therefore, the bottom surface of the contact hole is located below the upper surface of the first interlayer insulation film 15.

In addition, a first local interconnection layer 160 is formed in the semiconductor memory device. The first local interconnection layer 160 has electrical conductive properties and hydrogen permeability properties. The first local interconnection layer 160 is formed within the third element region 1300. More specifically, the first local interconnection layer 160 is formed on the third interlayer insulation film 27 and in the above described three contact holes. In other words, as shown in FIGS. 2 and 3, the first local interconnection layer 160 is formed on the first capacitor 130 and the second capacitor 140, formed between the first capacitor 130 and the second capacitor 140, and in the above described three contact holes.

The first local interconnection layer 160 has an electrical contact with the first upper electrode 26-1 functioning as the counter electrode of the first capacitor 130 through the above described contact hole. Furthermore, the first local interconnection layer 160 has an electrical contact with the second upper electrode 26-2 functioning as the counter electrode of the second capacitor 140 through the above described contact hole. In addition, the first local interconnection layer 160 is formed between the first capacitor 130 and the second capacitor 140, and has an electrical contact with the fifth conductive contact plug 20 through the above described contact hole that is located on the above described fifth conductive contact plug 20.

As described above, the fifth conductive contact plug 20 has a contact with the $N^+$ high concentration impurity diffusion region 13-4. The $N^+$ high concentration impurity diffusion region 13-4 comprises either of the source/drain regions of the switching transistor that is formed between the local interconnection and the plate-line functioning as a global interconnection. Therefore, the first local interconnection layer 160 is electrically connected to the plate-line functioning as a global interconnection through the fifth conductive contact plug 20 and the switching transistor. In other words, the first local interconnection layer 160 provides an electrical connection between a counter electrode that is comprised of the first upper electrode 26-1 in the first capacitor 130 and a counter electrode that is comprised of the second upper electrode 26-2 in the second capacitor 140, and provides electrical connection between these counter electrodes and the switching transistor. Therefore, counter electrodes in the first capacitor 130 and the second capacitor 140 are electrically connected to the global interconnection comprised of the plate-line through the first local interconnection layer 160 and the switching transistor.

As described above in reference to FIG. 1, the gate electrode of the switching transistor that is formed between the first local interconnection layer 160 and the global interconnection that is comprised of the plate-line is connected to the mutual word-line to which the gate electrode of the switching transistor connected to the first capacitor 130 and the second capacitor 140, respectively, is connected. Therefore, these three switching transistors are controlled by a mutual control signal. Because of this, when data is written to or read out from the first lower electrode 24-1 functioning as the storage electrode in the first capacitor 130 and the second lower electrode 24-2 functioning as the storage electrode in the second capacitor 140, the first upper electrode 26-1 functioning as the counter electrode in the first capacitor 130 and the second upper electrode 26-2 functioning as the counter electrode in the second capacitor 140 are electrically connected to the global interconnection comprised of the plate-line. On the other hand, when data is not written to or not read out from the first and second lower electrodes 24-1 and 24-2, the first and second upper electrodes 26-1 and 26-2 are electrically separated from the global interconnection. In other words, except when data is written to and read out from the memory capacitors, the memory capacitors are not electrically connected to the global interconnection comprised of the plate-line. Because of this, there is no possibility that the global interconnection comprised of the plate-line will have a significant problem with wiring delay. On the other hand, the first capacitor 130 and the second capacitor 140 are always electrically connected to the first local interconnection layer 160. However, the interconnection of the first local interconnection layer 160 is formed only within the third element region 1300 in which the pair of FeRAM cells 100 are formed. Therefore, the distance of the interconnection of the first local interconnection layer 160 is much shorter than that of the global interconnection. Because of this, there is essentially no possibility that the global interconnection comprised of the plate-line will have a significant problem with wiring delay.

In addition, a second insulating hydrogen barrier layer 170 is formed in the semiconductor memory device. The second insulating hydrogen barrier layer 170 has electrical insulation properties and hydrogen non-permeability properties. The second insulating hydrogen barrier layer 170 is formed in the third element region 1300, more specifically, both on the first local interconnection layer 160 formed within the third element region 1300 and the third interlayer insulation film 27, and thus the whole of the first local interconnection layer 160 is completely covered with the second insulating hydrogen barrier layer 170. Furthermore, a portion of the third interlayer insulation film 27, which is not covered with the first local interconnection layer 160 and also formed on the first insulating hydrogen barrier layer 150, is covered with the second insulating hydrogen barrier layer 170.

Moreover, a fourth interlayer insulation film 28 is formed in the semiconductor memory device. The fourth interlayer insulation film 28 is formed on the third interlayer insulation film 27 within the first element region 1100 and the second element region 1200. In addition, the fourth interlayer insulation film 28 is formed on the second insulating hydrogen barrier layer 170 within the third element region 1300. The whole of the first local interconnection layer 160 is completely separated from the fourth interlayer insulation film 28, which may work as a hydrogen diffusion pathway, through the second insulating hydrogen barrier layer 170. Furthermore, a portion of the third interlayer insulation film 27, which is not covered with the first local interconnection layer 160 and formed adjacent to the first insulating hydrogen barrier layer 150, is completely separated from the fourth interlayer insulation film 28, which may work as a hydrogen diffusion pathway, through the second insulating hydrogen barrier layer 170.

In addition, a eighth conductive contact plug 29 and a ninth conductive contact plug 30 are formed within the first element region 1100. The eighth conductive contact plug 29 penetrates the fourth interlayer insulation film 28, the third interlayer insulation film 27, and the second interlayer insulation film 21, and has a contact with the upper portion of the above described first conductive contact plug 16. The eighth conductive contact plug 29 is electrically connected to the $P^+$ high concentration impurity diffusion region 14-1 in the p-channel MOS transistor 110 through the above described first conductive contact plug 16. Also, a ninth conductive contact plug 30 penetrates the fourth interlayer insulation film 28, the third interlayer insulation film 27, and the second interlayer insulation film 21, and has a contact with the upper portion of the above described second conductive contact plug 17. The ninth conductive contact plug 30 is electrically connected to the $P^+$ high concentration impurity diffusion region 14-2 in the p-channel MOS transistor 110 through the second conductive contact plug 17.

Furthermore, a tenth conductive contact plug 31 and an eleventh conductive contact plug 32 are formed in the second element region 1200. The tenth conductive contact plug 31 penetrates the fourth interlayer insulation film 28, the third interlayer insulation film 27, and the second interlayer insulation film 21, and has a contact with the upper portion of the above described third conductive contact plug 18. The tenth conductive contact plug 31 is electrically connected to $N^+$ high concentration impurity diffusion region 13-1 in the n-channel MOS transistor 120 through the above described third conductive contact plug 18. The eleventh conductive contact plug 32 penetrates the fourth interlayer insulation film 28, the third interlayer insulation film 27, and the second interlayer insulation film 21, and has a contact with the upper portion of the above described fourth conductive contact plug 19. The eleventh conductive contact plug 32 is electrically connected to the $N^+$ high concentration impurity diffusion region 13-2 in the n-channel MOS transistor 120 through the above described fourth conductive contact plug 19.

In addition, a first metal interconnection layer 33 and a second metal interconnection layer 34 are formed on the fourth interlayer insulation film 28 in the first element region 1100. The first metal interconnection layer 33 has a contact with the upper portion of the eighth conductive contact plug 29. The first metal interconnection layer 33 is electrically connected to the $P^+$ high concentration impurity diffusion region 14-1 in the p-channel MOS transistor 110 through the eighth conductive contact plug 29 and the above described first conductive contact plug 16. The second metal interconnection layer 34 is connected to the upper portion of the ninth conductive contact plug 30. The second metal interconnection layer 34 is electrically connected to the $P^+$ high concentration impurity diffusion region 14-2 in the p-channel MOS transistor 110 through the ninth conductive contact plug 30 and the above described second conductive contact plug 17.

Furthermore, a third metal interconnection layer 35 and a fourth metal interconnection layer 36 are formed on the fourth interlayer insulation film 28 in the second element region 1200. The third metal interconnection layer 35 has a contact with the upper portion of the tenth conductive contact plug 31. The third metal interconnection layer 35 is electrically connected to the $N^+$ high concentration impurity diffusion region 13-1 in the n-channel MOS transistor 120 through the tenth conductive contact plug 31 and the above described third conductive contact plug 18. The fourth metal interconnection layer 36 has a contact with the upper portion of the eleventh conductive contact plug 32. The fourth metal interconnection layer 36 is electrically connected to the $N^+$ high concentration impurity diffusion region 13-2 in the n-channel MOS transistor 120 through the eleventh conductive contact plug 32 and the above described fourth conductive contact plug 19.

In addition, a multi-layer wiring structure that is comprised of the first metal interconnection layer 33, the second metal interconnection layer 34, the third metal interconnection layer 35, and the fourth metal interconnection layer 36 and functions as the first level interconnection layer may be included in the semiconductor memory device in accordance with the first embodiment of the present invention.

FeRAM Cell Structure

As described above, the semiconductor memory device in accordance with the first embodiment of the present invention includes a pair of FeRAM cells 100. The pair of FeRAM cells 100 is comprised of a first FeRAM cell and a second FeRAM cell. The first FeRAM cell is comprised of a switching transistor and a first capacitor 130. The second FeRAM cell is comprised of a switching transistor and a second capacitor 140.

The first capacitor 130 is comprised of a first lower electrode 24-1, a first upper electrode 26-1, and a first metal oxide ferroelectric film 25-1 that is formed between these electrodes. The first lower electrode 24-1 is electrically connected to a $N^+$ high concentration impurity diffusion region 13-3 that comprises either of source/drain regions of the switching transistor through a sixth conductive contact plug 22. The first lower electrode 24-1 functions as a storage electrode that stores data of a bit-line.

The second capacitor 140 is comprised of a second lower electrode 24-2, a second upper electrode 26-2, and a second metal oxide ferroelectric film 25-2 that is formed between these electrodes. The second lower electrode 24-2 is electrically connected to a $N^+$ high concentration impurity diffusion region 13-5 that comprises either of source/drain regions of the switching transistor through a seventh conductive contact plug 23. The second lower electrode 24-2 functions as a storage electrode that stores data of a bit-line.

As described above, the first capacitor 130 and the second capacitor 140 includes the first lower electrode 24-1 and the second lower electrode 24-2, respectively. It is preferable for the first lower electrode 24-1 and the second lower electrode 24-2 to include Pt type material or Ir type material, such as at least one of platinum (Pt), iridium (Ir), and iridium dioxide ($IrO_2$). The first lower electrode 24-1 and the second lower electrode 24-2 can be comprised of a single layer structure or a multi-layer structure. For example, the single layer structure can be comprised of a single layer including at least one of Pt, Ir, and $IrO_2$. For example, the multi-layer structure can be comprised of a first layer (i.e., a bottom layer) comprised of titanium aluminum nitride (TiAlN), a second layer that is formed on the first layer and comprised of Ir, a third layer that is formed on the second layer and comprised of $IrO_2$, and a fourth layer that is formed on the third layer and comprised of Pt. Here, the first layer that is formed as a bottom layer and comprised of TiAlN functions as a hydrogen barrier film that has hydrogen barrier properties.

Furthermore, as described above, the first capacitor 130 and the second capacitor 140 include the first upper electrode 26-1 and the second upper electrode 26-2, respectively. It is preferable for the first upper electrode 26-1 and the second upper electrode 26-2 to include Pt type material or Ir type material, such as at least one of Pt, Ir, and $IrO_2$.

In addition, as described above, the first capacitor 130 and the second capacitor 140 include the first metal oxide ferroelectric film 25-1 and the second metal oxide ferroelectric film 25-2, respectively. As a typical example, the material that can be used for the first metal oxide ferroelectric film 25-1 and the second metal oxide ferroelectric film 25-2 can be comprised of any of heretofore known various types of metal oxide ferroelectrics. For example, the following material can be provided as a typical example: $SrBi_2Ta_2O_9$ that is a Bi-layered compound, material formed by changing the composition of $SrBi_2Ta_2O_9$, a series of a group of compounds that is replaced by additives typified by Nb and hereinafter called SBT, $Pb(Zr_{1-x}, Ti_x)O_3$, material formed by changing the composition of $Pb(Zr_{1-x}, Ti_x)O_3$, a series of group of compounds that is replaced by additives typified by lanthanum (La) or calcium (Ca) and hereinafter called PZT. In addition, material formed by adding La to bismuth titanium oxide, and a solid solution formed by adding other dielectric material to the above described ferroelectric material, can be provided as an example of the material that is used at an examination stage. Any of the above described materials are common in that they have ferroelectric properties as an oxide dielectric crystal. In the first embodiment of the present invention, the metal oxide ferroelectric film is formed by spin-coating SBT and by crystallizing the spin-coated SBT with calcination.

Furthermore, the first upper electrode 26-1 in the first capacitor 130 has electric conductivity properties and hydrogen permeability properties. The first upper electrode 26-1 in the first capacitor 130 has a contact with a first contact of the first local interconnection layer 160 in the contact hole. In addition, the first upper electrode 26-2 in the second capacitor 140 has electric conductivity properties and hydrogen permeability properties. The first electrode 26-2 in the second capacitor 140 has a contact with a second contact of the first local interconnection layer 160 in the contact hole. Therefore, the first local interconnection layer 160 provides an electrical interconnection between the first upper electrode 26-1 in the first capacitor 130 and the first upper electrode 26-2 in the second capacitor 140.

The above described first local interconnection layer 160 is comprised of a material that has electrical conductivity properties and hydrogen permeability properties. Titanium nitride (TiN) can be provided as a typical example of the material comprising the above described first local interconnection layer 160. However, the material comprising the first local interconnection layer 160 is not necessarily limited to TiN.

The above described first insulating hydrogen barrier layer 150 and the second insulating hydrogen barrier layer 170 can be comprised of material that has electric insulation properties and hydrogen non-permeability properties. As a typical example, alumina ($Al_2O_3$), silicon nitride (SiN), silicon oxide nitride (SiON), titanium dioxide ($TiO_2$), and tantalum oxides ($TaO_x$(x>0)) can be used as the material, but the material is not necessarily limited to $Al_2O_3$, SiN, SiON, $TiO_2$, and $TaO_x$. In the first embodiment of the present invention, the first insulating hydrogen barrier film 150 and the second insulating hydrogen barrier layer 170 are comprised of $Al_2O_3$. For example, the above described first insulating hydrogen barrier film 150 and the second insulating hydrogen barrier layer 170 can be formed with the CVD method.

The above described first to eleventh conductive plugs 16, 17, 18, 19, 20, 22, 23, 29, 30, 31, and 32 are comprised of various conductive materials. As a typical example, tungsten (W) and polysilicon can be used for these plugs. The first to eleventh conductive plugs 16, 17, 18, 19, 20, 22, 23, 29, 30, 31, and 32 can be formed with the CVD method. Also, the third interlayer insulation film 27 and the fourth interlayer insulation film 28 can be formed with the CVD method.

Hydrogen Barrier Structure

According to the first embodiment of the present invention, the third and fourth interlayer insulation films 27 and 28, and the eighth to eleventh conductive plugs 29, 30, 31, and 32 are formed with the CVD method after the first capacitor 130 and the second capacitor 140 are formed. In addition, the fourth interlayer insulation film 28 and the eighth to eleventh conductive plugs 29, 30, 31, and 32 are formed with the CVD method after the first local interconnection layer 160 is formed. The steps of the CVD method are conducted in a reducing atmosphere. Because of this, hydrogen provided in these steps of the CVD method will diffuse and function as a reducing agent. Therefore, it is necessary to prevent the first metal oxide ferroelectric film 25-1 that is included in the first capacitor 130 and the second metal oxide ferroelectric film 25-2 that is included in the second capacitor 140 from being reduced by the hydrogen. Not only the boundary between the first capacitor 130 and the outer region and the boundary between the second capacitor 140 and the outer region, but also the above described first local interconnection layer 160, are thought to be a hydrogen diffusion pathway (or a hydrogen entry pathway). Therefore, it is necessary to prevent hydrogen from diffusing into the first metal oxide ferroelectric film 25-1 sequentially through the diffusion pathway comprised of the first local interconnection layer 160, the contact portion between the first local interconnection layer 160 and the first upper electrode 26-1, and the first upper electrode 26-1. In addition, it is necessary to prevent hydrogen from diffusing into the second metal oxide ferroelectric film 25-2 sequentially through the diffusion pathway comprised of the first local interconnection layer 160, the contact portion between the first local interconnection layer 160 and the first upper electrode 26-2, and the second upper electrode 26-2.

Here, the first local interconnection layer 160 is comprised of an interconnection that is formed only within the third element region 1300, and exclusively used for providing an interconnection between the first upper electrode 26-1 in the first capacitor 130 included in the first FeRAM cell comprising one of the pair of FeRAM cells 100 and the second upper electrode 26-2 in the second capacitor 140 included in the second FeRAM cell comprising one of the pair of FeRAM cells 100. This leased interconnection exclusively used for providing the interconnection is different from a general global interconnection in that this interconnection provides an electrical interconnection limited for a specific region. In other words, this leased interconnection that is formed only in the specific region can be a hydrogen diffusion pathway. Therefore, it is necessary to prevent hydrogen from entering this diffusion pathway.

According to the first embodiment of the present invention, it is meaningful to break the hydrogen diffusion pathway through the first local interconnection layer 160 by forming not only the first insulating hydrogen barrier layer 150 that covers the first capacitor 130 and the second capacitor 140, but also the second insulating hydrogen barrier layer 170 that covers the above described first and second contact portions of the first local interconnection layer 160 with the first upper electrode 26-1 and the second upper electrode 26-2. Hydrogen functioning as a reducing agent will be reliably prevented from diffusing into the first metal oxide ferroelectric film 25-1 and the second metal oxide ferroelectric film 25-2 by the combination of the above described first insulating hydrogen barrier layer 150 and the above described second insulating hydrogen barrier layer 170. The first insulating hydrogen barrier layer 150 that has hydrogen non-permeability properties (i.e., hydrogen barrier properties) is formed to have contacts with (i) a portion of the upper surface of the first capacitor 130 except for the contact portion between the first local interconnection layer 160 and the first capacitor 130, (ii) a portion of the upper surface of the second capacitor 140 except for the contact portion between the first local interconnection layer 160 and the second capacitor 140, (iii) the lateral surface of the first capacitor 130, and (iv) the lateral surface of the second capacitor 140. On the other hand, hydrogen functioning as a reducing agent is provided when the third and fourth insulation films 27 and 28, and the eighth to eleventh conductive plugs 29, 30, 31, and 32 are formed above and outside the first capacitor 130 and the second capacitor 140 with the CVD method in the reducing atmosphere. Hydrogen will be reliably prevented from diffusing into the first metal oxide ferroelectric film 25-1 sequentially through a portion of the upper surface of the first capacitor 130 except for the contact portion between the first local interconnection layer 160 and the first capacitor 130, and the lateral surface of the first capacitor 130 due to the existence of the first insulating hydrogen barrier layer 150 that has hydrogen barrier properties. In addition, hydrogen will be reliably prevented from diffusing into the second metal oxide ferroelectric film 25-2 sequentially through a portion of the upper surface of the second capacitor 140 except for the contact portion between the first local interconnection layer 160 and the second capacitor 140, and the lateral surface of the second capacitor 140, due to the existence of the first insulating hydrogen barrier layer 150 that has hydrogen barrier properties.

However, as described above, the first local interconnection layer 160 has hydrogen permeability properties. Therefore, it is necessary to prevent hydrogen from diffusing into the first upper electrode 26-1 and the second upper electrode 26-2 through the contact portion between the first upper electrode 26-1 and the first local wring layer 160 and the contact portion between the second upper electrode 26-2 and the first local interconnection layer 160. Therefore, in the first embodiment of the present invention, not only the first insulating hydrogen barrier layer 150 but also the second insulating hydrogen barrier layer 170 is formed in the semiconductor memory device.

As described above, the second insulating hydrogen barrier layer 170 is formed all over the third element region 1300, more specifically, formed on the first local interconnection layer 160 and the third interlayer insulation film 27 within the third element region 1300. Therefore, the whole of the first local interconnection layer 160 is completely covered with the second insulating hydrogen barrier layer 170. Because of this, hydrogen will be reliably prevented from diffusing into the first upper electrode 26-1 and the second upper electrode 26-2 sequentially through the first local interconnection layer 160 and the contact portion between the first local interconnection layer 160 and the first upper electrode 26-1 and through the first local interconnection layer 160 and the contact between the first local interconnection layer 160 and the second upper electrode 26-2, respectively, due to the existence of the second insulating hydrogen barrier layer 170.

Furthermore, a portion of the third interlayer insulation film 27, which is not covered with the first local interconnection layer 160 and located adjacent to the first insulating hydrogen barrier layer 150, is covered with the second insulating hydrogen barrier layer 170. Therefore, hydrogen will be reliably prevented from diffusing into the first upper electrode 26-1 and the second upper electrode 26-2 sequentially through the third interlayer insulation film 27, the first local interconnection layer 160, and the contact portion between the first local interconnection layer 160 and the first upper electrode 26-1, and through the third interlayer insulation film 27, the first local interconnection layer 160, and the contact portion between the first local interconnection layer 160 and the second upper electrode 26-2, by the second insulating hydrogen barrier layer 170.

On the other hand, as described above, the first lower electrode 24-1 and the second lower electrode 24-2 can be comprised of a multi-layer structure. The multi-layer structure includes the bottom layer (i.e., the first layer) that is comprised of TiAlN. TiAlN has electric conductive properties and hydrogen non-permeability properties (i.e., hydrogen barrier properties). Therefore, if the first lower electrode 24-1 and the second lower electrode 24-2 include films that have electric conductive properties and hydrogen non-permeability properties (i.e., hydrogen barrier properties), hydrogen will be reliably prevented from diffusing into the first metal oxide ferroelectric film 25-1 and the second metal oxide ferroelectric film 25-2 from the bottom portion of the first capacitor 130 and the bottom portion of the second capacitor 140, respectively.

Therefore, hydrogen that is provided in the above described steps of the CVD method and functions as the reducing agent will be reliably prevented from diffusing into the first metal oxide ferroelectric film 25-1 and the second metal oxide ferroelectric film 25-2 due to the existence of the first insulating hydrogen barrier layer 150 and the second insulating hydrogen barrier layer 170, both of which have hydrogen barrier properties. Because of this, the first metal oxide ferroelectric film 25-1 and the second metal oxide ferroelectric film 25-2 will be reliably prevented from being reduced and thus ferroelectric properties of these films will be reliably prevented from being deteriorated.

As described above, in the first embodiment of the present invention, the second insulating hydrogen barrier layer 170 completely covers the whole of the first local interconnection layer 160 and also covers a portion of the third interlayer insulation film 27 that is not covered with the first local interconnection layer 160 and located adjacent to the first insulating hydrogen barrier layer 150. Therefore, even though the above described first insulating hydrogen barrier layer 150 allows diffusion of hydrogen through the contact holes, the second insulating hydrogen barrier layer 170 prevents diffusion of hydrogen through the contact portion between the first local interconnection layer 160 and the first upper electrode 26-1 and the contact portion between the first local interconnection layer 160 and the second upper electrode 26-2.

Alternative Embodiment

As described above, the second insulating hydrogen barrier layer 170 is formed to prevent diffusion of hydrogen through the contact between the first local interconnection layer 160 and the first upper electrode 26-1 and the contact between the first local interconnection layer 160 and the second upper electrode 26-2. Therefore, the second insulation hydrogen barrier layer 170 is not necessarily formed to completely cover the whole of the first local interconnection layer 160 and a portion of the third interlayer insulation film 27 which is not covered by the first local interconnection layer 160, in other words, a portion of the third interlayer insulation film 27 which is formed adjacent to the first insulation hydrogen barrier layer 150.

The second insulating hydrogen barrier layer 170 is not necessarily formed to cover a portion of the third interlayer insulation film 27 which is not covered by the first local interconnection layer 160, in other words, a portion of the third interlayer insulation film 27 which is formed adjacent to the first insulating hydrogen barrier layer 150, if diffusion of hydrogen through the contact between the local interconnection layer 160 and the first upper electrode 26-1 and the contact between the first local interconnection layer 160 and the second upper electrode 26-2 can be prevented. In addition, the second insulating hydrogen barrier 170 is not necessarily formed to cover the whole of the first local interconnection layer 160. For example, the second insulating hydrogen barrier layer 170 may be formed to cover the portions of the first local interconnection layer 160 which have contacts with the first upper electrode 26-1 and the second upper electrode 26-2. Thus, diffusion of hydrogen through the contact portion between the first local interconnection layer 160 and the first upper electrode 26-1 and the contact portion between the first local interconnection layer 160 and the second upper electrode 26-2 may be inhibited. In other words, the second insulating hydrogen barrier layer 170 may be formed to cover at least the portions of the first local interconnection layer 160 which have contacts with the first upper electrode 26-1 and the second upper electrode 26-2.

According to the present invention, a hydrogen barrier structure is provided to prevent or inhibit the dielectrics comprising the insulators in the first capacitor 130 and the second capacitor 140 from being deteriorated by a reduction reaction with hydrogen. Therefore, the insulators in the first capacitor 130 and the second capacitor 140 are not necessarily limited to metal oxide ferroelectrics, and may be either oxide ferroelectrics or oxide high dielectrics. In other words, it is meaningful to apply a hydrogen barrier structure in accordance with the present invention to a semiconductor memory device, if the insulators in the first capacitor 130 and the second capacitor 140 are comprised of oxide dielectrics.

Manufacturing method of semiconductor memory device

Figure 4:
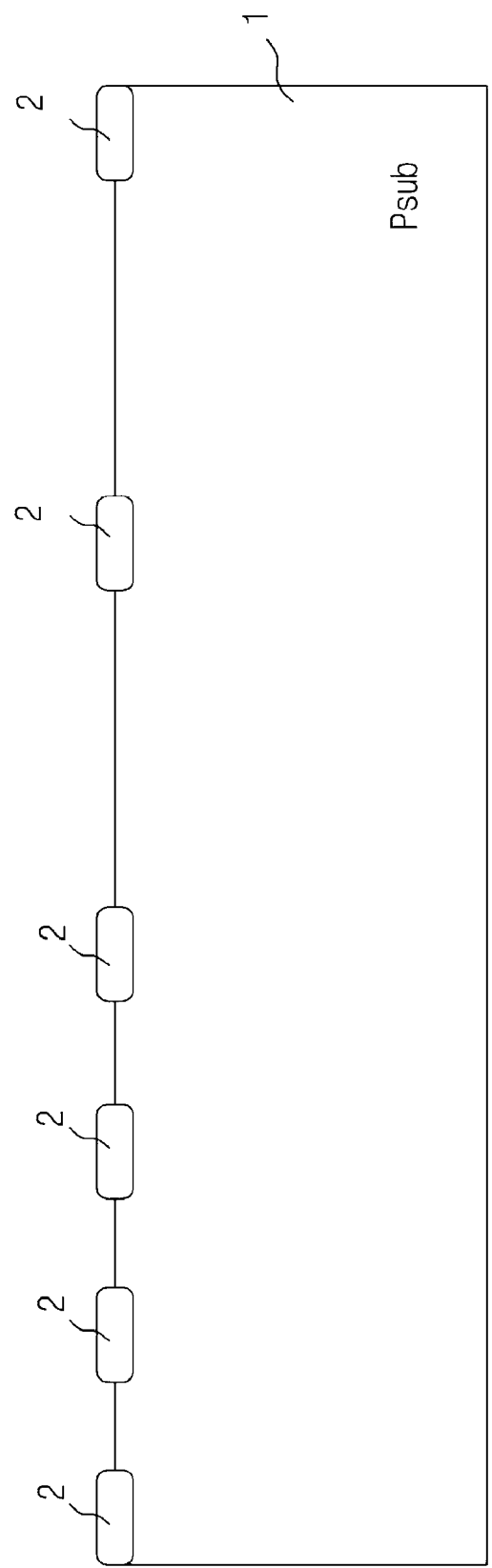
FIG. 4 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

FIGS. 4 to 42 are partial vertical diagrams showing a manufacturing process of a semiconductor memory device in accordance with the first embodiment of the present invention. As shown in FIG. 4, a field oxide film 2 is formed on the element isolation region of a p-type single crystal semiconductor substrate 1 (or p-type single crystal silicon substrate 1) with the local oxidation of silicon method (the LOCOS method). Thus active region is defined by the field oxide film 2. Here, the active region is a region in which a semiconductor memory device is formed.

Figure 5:
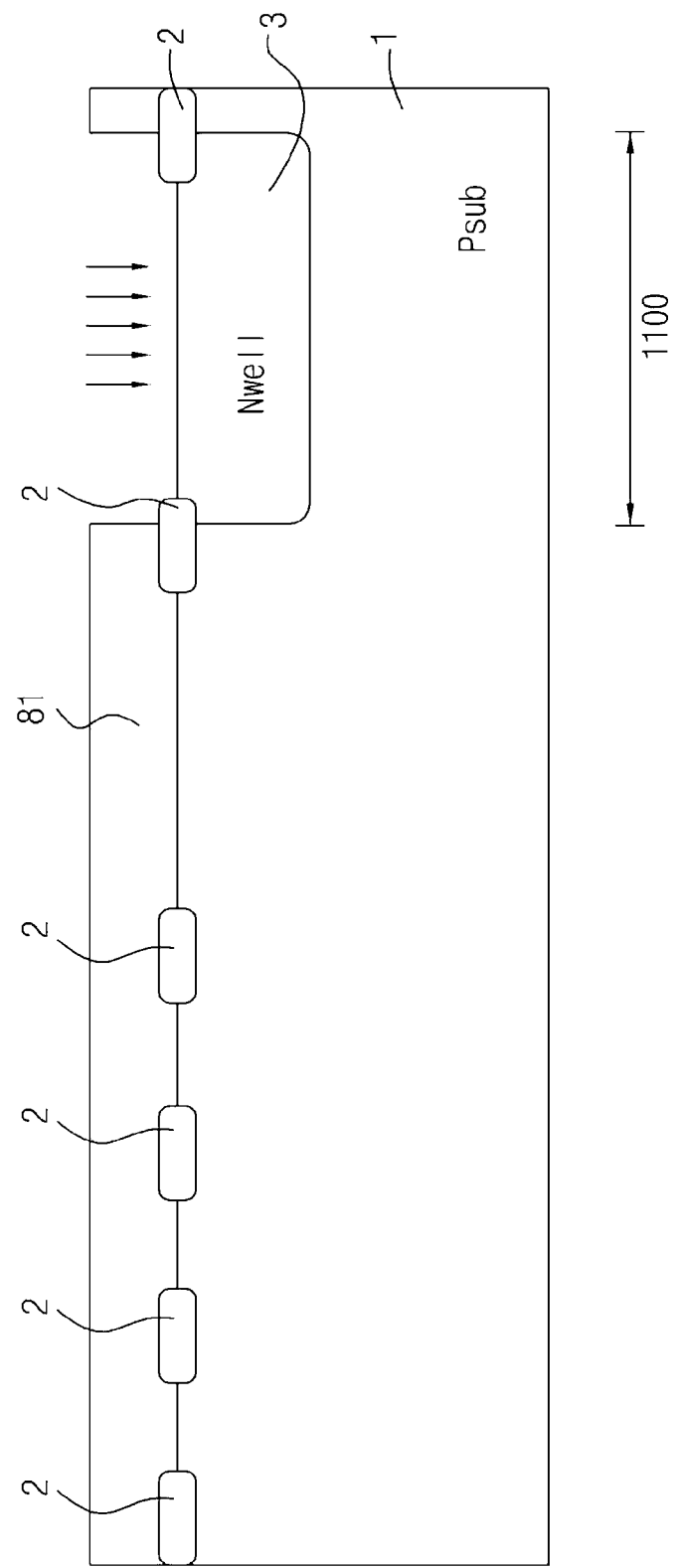
FIG. 5 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 5, a resist pattern 81 is formed on the p-type single crystal silicon substrate 1 and the field oxide film 2 with a heretofore known lithography technique. The resist pattern 81 has an opening on a first element region 1100 of the p-type single crystal silicon substrate 1. In addition, n-type impurity phosphorus (P) is selectively implanted into the p-type single crystal silicon substrate 1 in the vertical direction by using the resist pattern 81 as a mask with an acceleration energy of 1000 keV and a dose amount of $5.0\times10^{12}$ cm$^{-2}$. Thus n-type well 3 is selectively formed in the first element region 1100.

Figure 6:
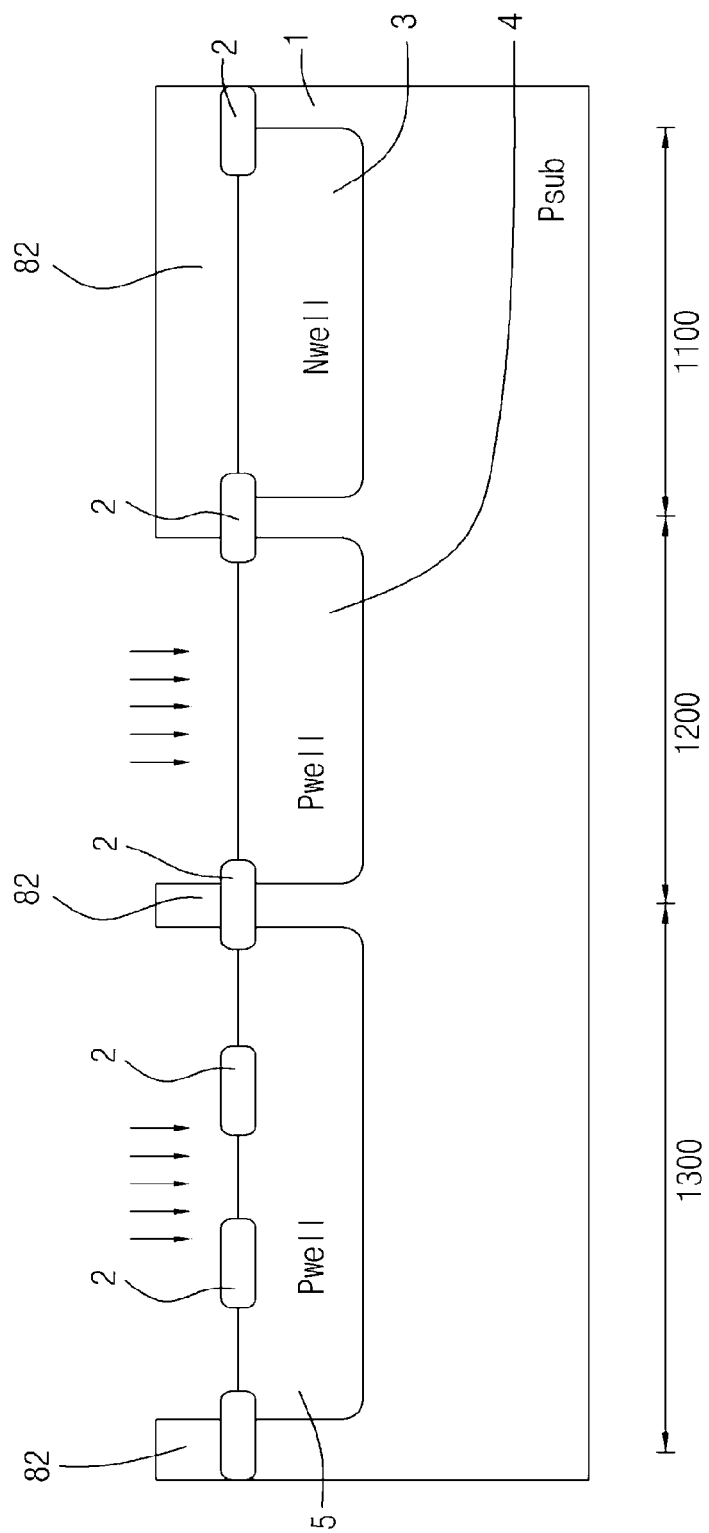
FIG. 6 is a partial vertical cross-section diagram showing a step of a manufacturing process of the semiconductor memory device, which includes the pair of FeRAM cells having a ferroelectric capacitor and a P-channel MOS transistor and a N-channel MOS transistor in a logical circuit in accordance with the first embodiment of the present invention.

As shown in FIG. 6, the resist pattern 81 is eliminated with a heretofore known method. Then a resist pattern 82 is formed on the p-type single crystal silicon substrate 1 and the field oxide film 2 with a heretofore known lithography technique. The resist pattern 82 has openings on a second element region 1200 and a third element region 1300, both of which are located in the p-type single crystal silicon substrate 1. P-type impurity boron (B) is selectively implanted into the p-type single crystal silicon substrate 1 in the vertical direction by using the resist pattern 82 as a mask with an acceleration energy of 600 keV and a dose amount of $5.0\times10^{12}$ cm$^{-2}$. Thus a p-type well 4 and a p-type well 5 are selectively formed in the second element region 1200 and the third element region 1300 in the p-type single crystal silicon substrate 1, respectively.

Figure 7:
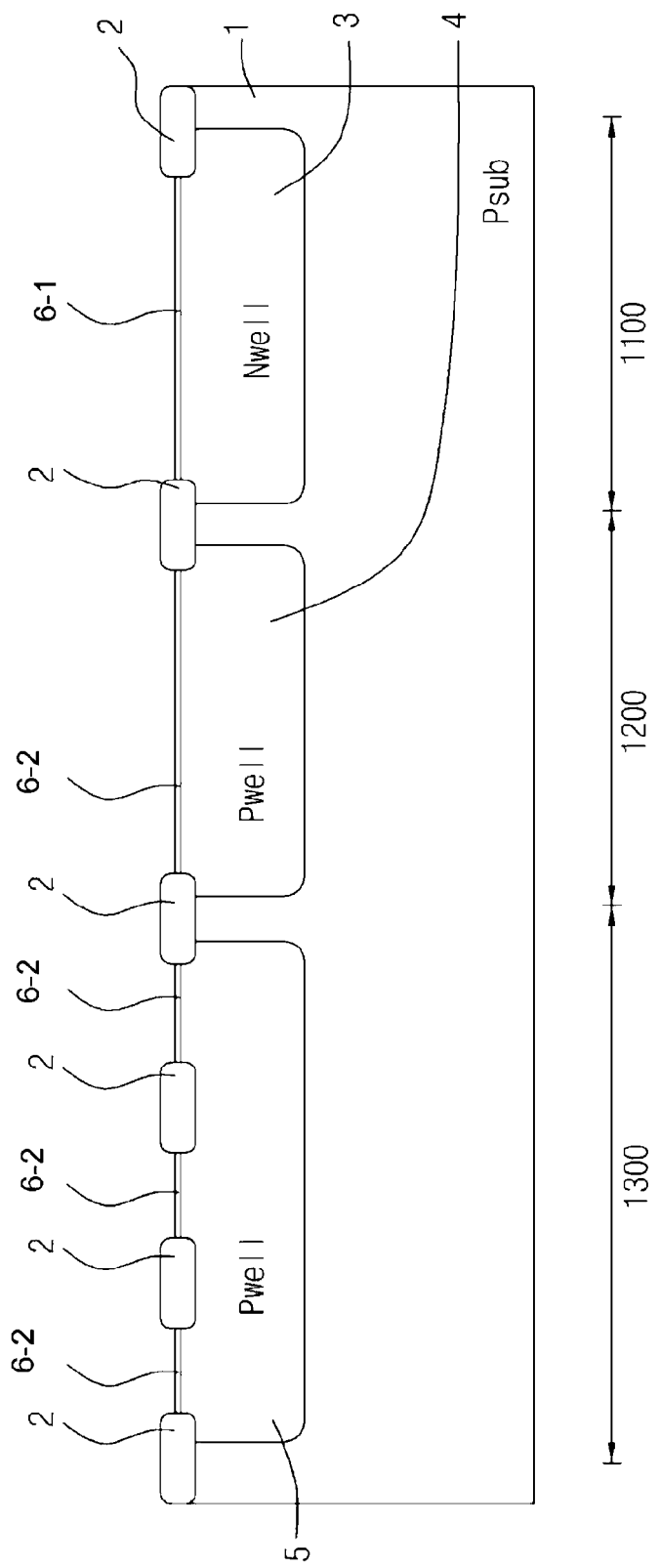
FIG. 7 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 7, the resist pattern 82 is eliminated with a heretofore known method. Then, a first gate insulation film 6-1 of 60 Å in thickness is formed on the surface of the n-type well 3 with a heretofore known selective oxidation method. Next, a second insulation film 6-2 of 55 Å in thickness is formed on the surface of the p-type well 5 and the p-type well 4, respectively, with a heretofore known selective oxidation method.

Figure 8:
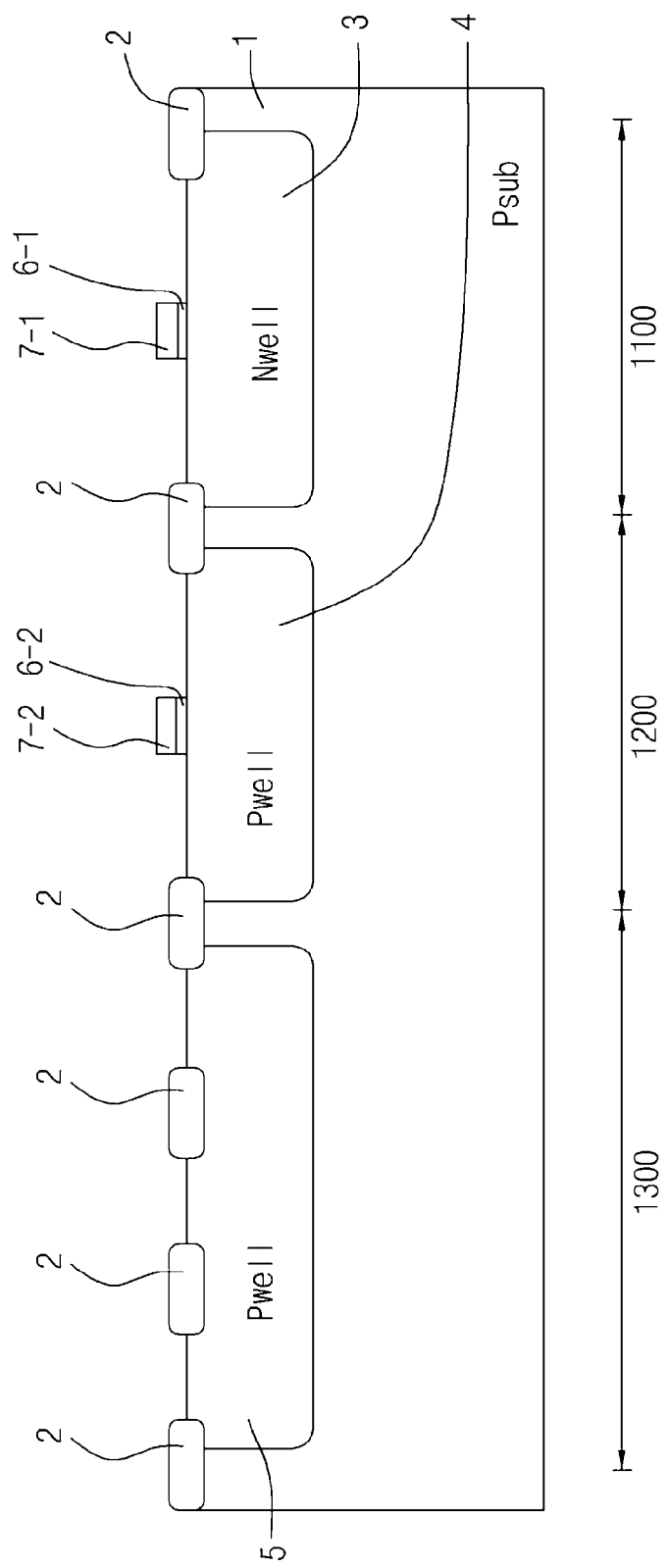
FIG. 8 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 8, a polysilicon film in which impurities of 1200 Å in thickness is doped is formed on the first gate insulation film 6-1, the second insulation film 6-2, and the field oxide film 2 with the CVD method. As a result, a laminated body comprised of the first gate insulation film 6-1 and a polysilicon film, and a laminated body comprised of the second insulation film 6-2 and a polysilicon film are formed. Then, patterning is conducted for these laminated bodies. As a result, a first gate structure comprised of a first gate insulation film 6-1 and a first gate electrode 7-1 is selectively formed on the n-type well 3, and a second gate structure comprised of the second insulation film 6-2 and the second gate electrode 7-2 is selectively formed on the p-type well 4. Furthermore, a plurality of pairs of a gate insulation film and a gate electrode are formed on the p-type well 5. However, they are not shown in FIG. 8 because they do not exist in the vertical cross-section position shown in FIG. 8.

Figure 9:
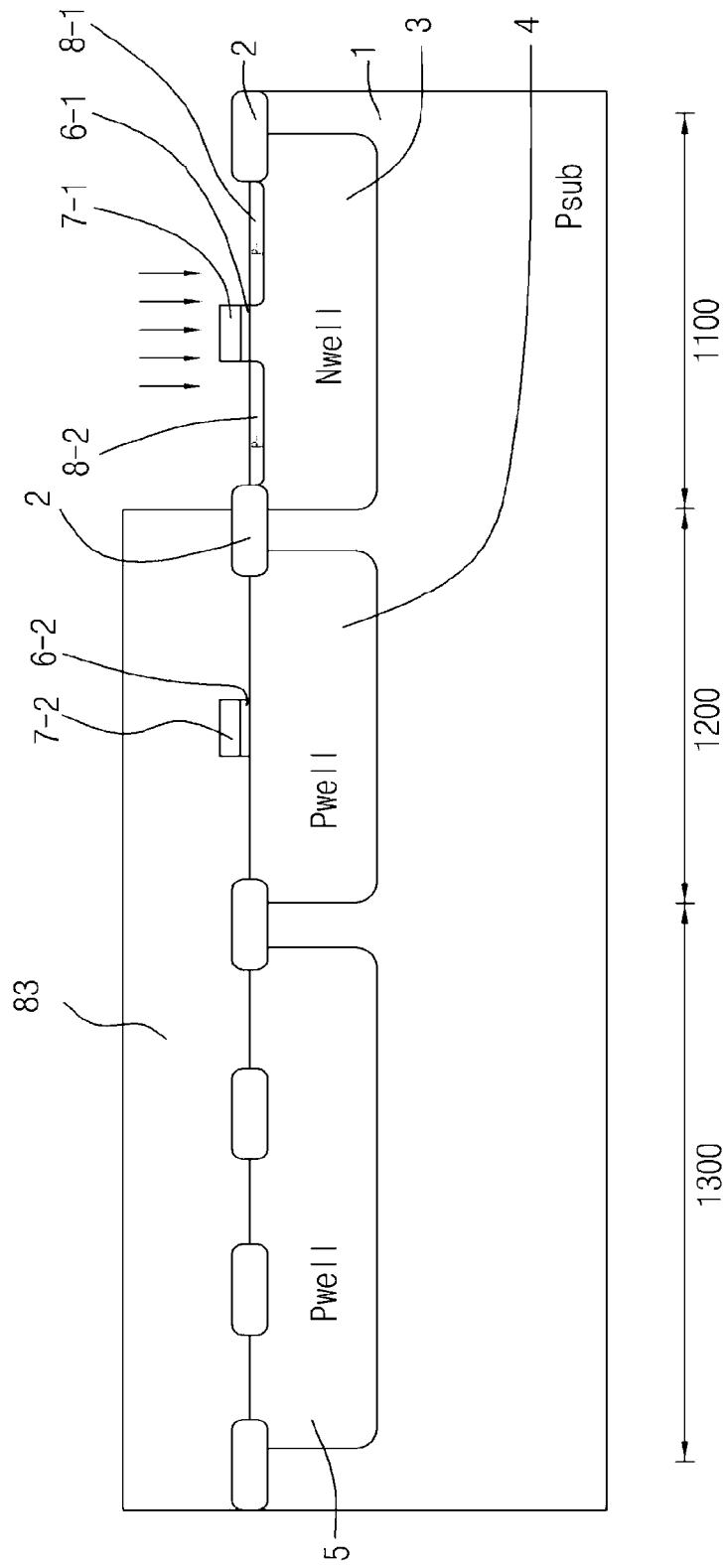
FIG. 9 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 9, a resist pattern 83 is formed on the p-type single crystal semiconductor substrate 1 (more specifically, the p-type wells 4 and 5), the first gate structure, and the field oxide film 2 with a heretofore known lithography technique. The resist pattern 83 has an opening on the first element region 1100 in the p-type single crystal semiconductor substrate 1. Then, p-type impurity difluoroborane (BF$_2^+$) is selectively implanted into the n-type well 3 in the vertical direction by using the resist pattern 83, the field oxide film 2, and the first gate electrode 7-1 as masks with an acceleration energy of 15 keV and a dose amount of $3.0\times10^{13}$ cm$^{-2}$. Thus, a P$^-$ low concentration impurity diffusion region 8-1 and a P$^-$ low concentration impurity diffusion region 8-2 are selectively formed in the n-type well 3. These P$^-$ low concentration impurity diffusion regions 8-1 and 8-2 are self-aligned with the first gate electrode 7-1.

Figure 10:
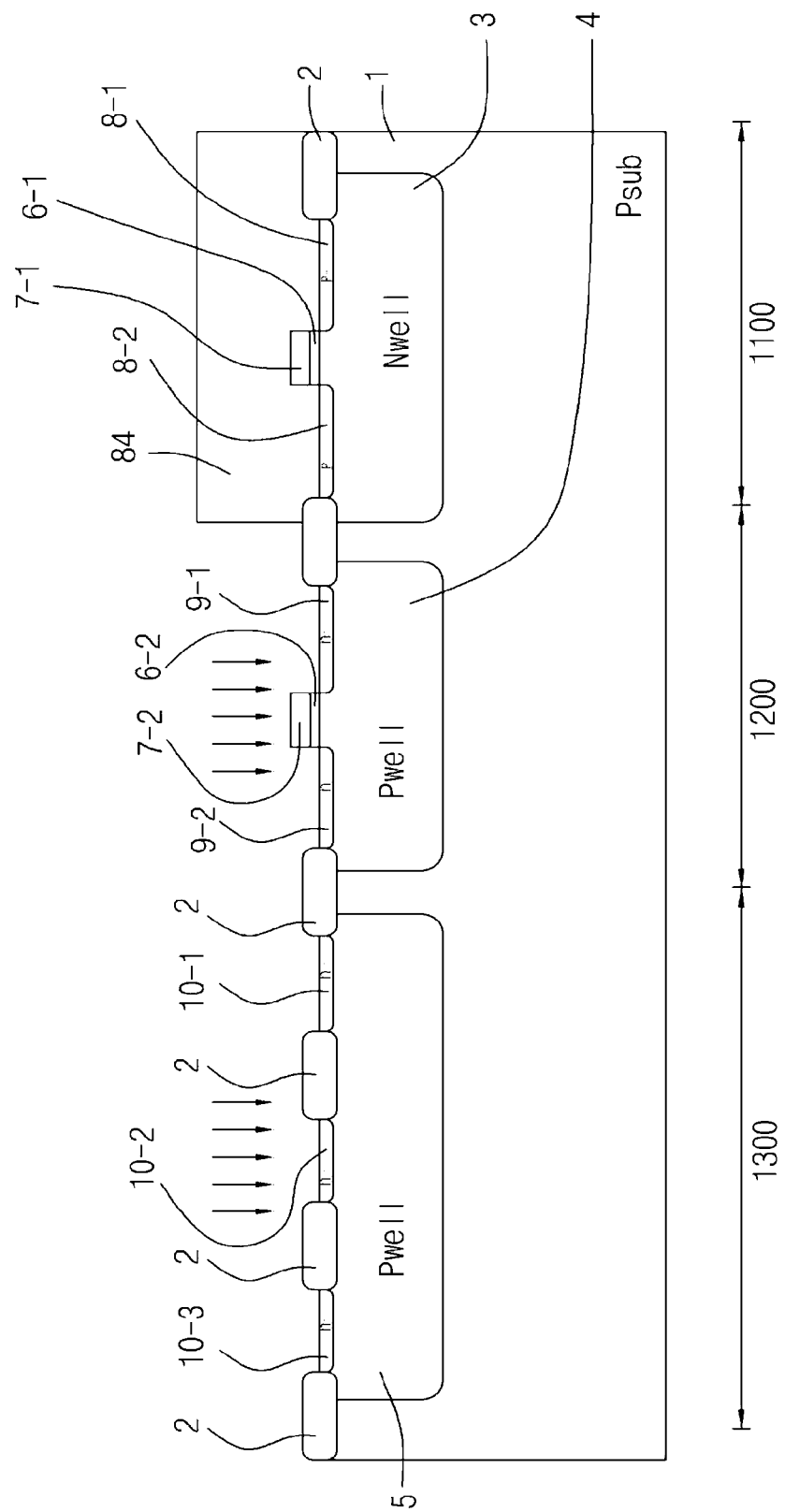
FIG. 10 is a partial vertical cross-section diagram showing a step of a manufacturing process of the semiconductor memory device, which includes the pair of FeRAM cells having a ferroelectric capacitor, and a p-channel MOS transistor and a n-channel MOS transistor in a logical circuit in accordance with the first embodiment of the present invention.

As shown in FIG. 10, the resist pattern 83 is eliminated with a heretofore known method. Then, a resist pattern 84 is formed on the p-type single crystal semiconductor substrate 1 (more specifically, the P$^-$ low concentration impurity diffusion regions 8-1 and 8-2), the first gate structure, and the field oxide film 2 with a heretofore known lithography technique. The resist pattern 84 has an opening astride the second element region 1200 and the third element region 1300 in the p-type single crystal semiconductor substrate 1. N-type impurity arsenic (As$^+$) is selectively implanted into the p-type well 4 and the p-type well 5 in the vertical direction by using the resist pattern 84, the field oxide film 2, and second gate electrode 7-2 as masks with an acceleration energy of 30 keV and a dose amount of $4.0\times10^{13}$ cm$^{-2}$. Thus, a N$^-$ low concentration impurity diffusion region 9-1 and a N$^-$ low concentration impurity diffusion region 9-2 are selectively formed in the p-type well 4, and a P$^-$ low concentration impurity diffusion region 10-1, a P$^-$ low concentration impurity diffusion region 10-2, and a P$^-$ low concentration impurity diffusion region 10-3 are selectively formed in the p-type well 5. Here, the N$^-$ low concentration impurity diffusion regions 9-1 and 9-2 are self-aligned with the second gate electrode 7-2.

Figure 11:
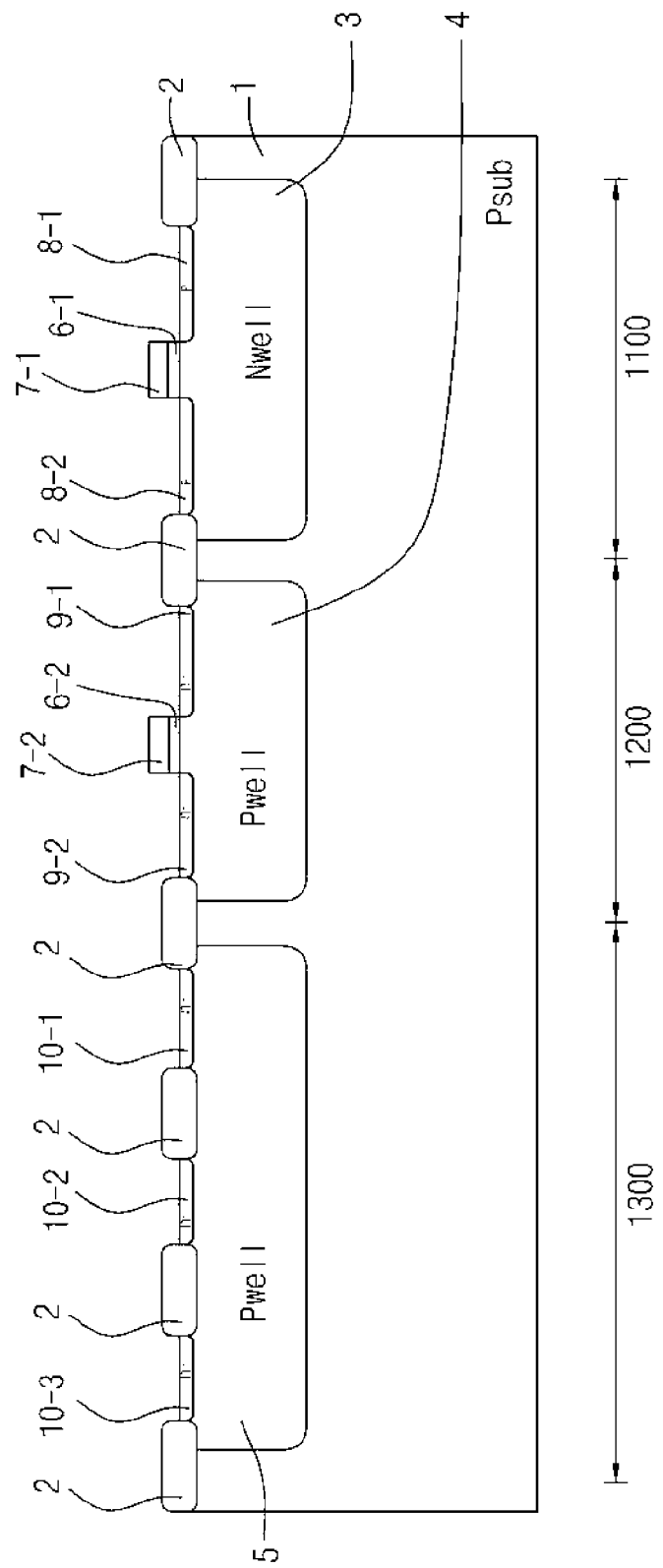
FIG. 11 is a partial vertical cross-section diagram showing a step of a manufacturing process of the semiconductor memory device, which includes the pair of FeRAM cell having a ferroelectric capacitor and a p-channel MOS transistor and a n-channel MOS transistor in a logical circuit in accordance with the first embodiment of the present invention.

As shown in FIG. 11, the resist pattern 84 is eliminated with a heretofore known method.

Figure 12:
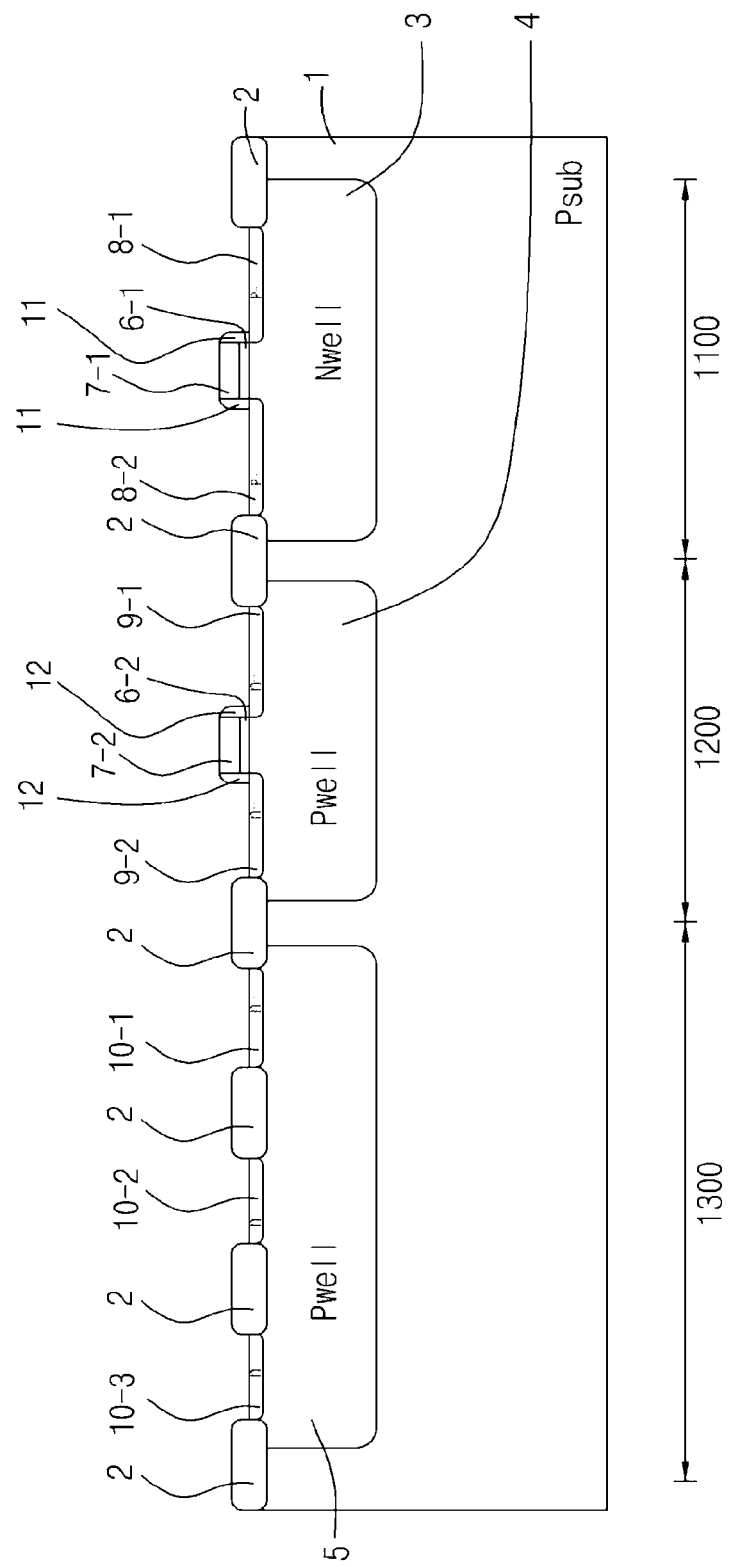
FIG. 12 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 12, a first sidewall insulation film 11 and a second sidewall insulation film 12 are formed on the sidewalls of the above described first gate structure and the sidewalls of the above described second gate structure, respectively. Thus, a third gate structure comprised of the first gate insulation film 6-1, the first gate electrode 7-1, and the first sidewall insulation film 11 is formed on the n-type well 3, and a fourth gate structure comprised of the second insulation film 6-2, the second gate electrode 7-2, and the second sidewall insulation film 12 is formed on the p-type well 4.

Figure 13:
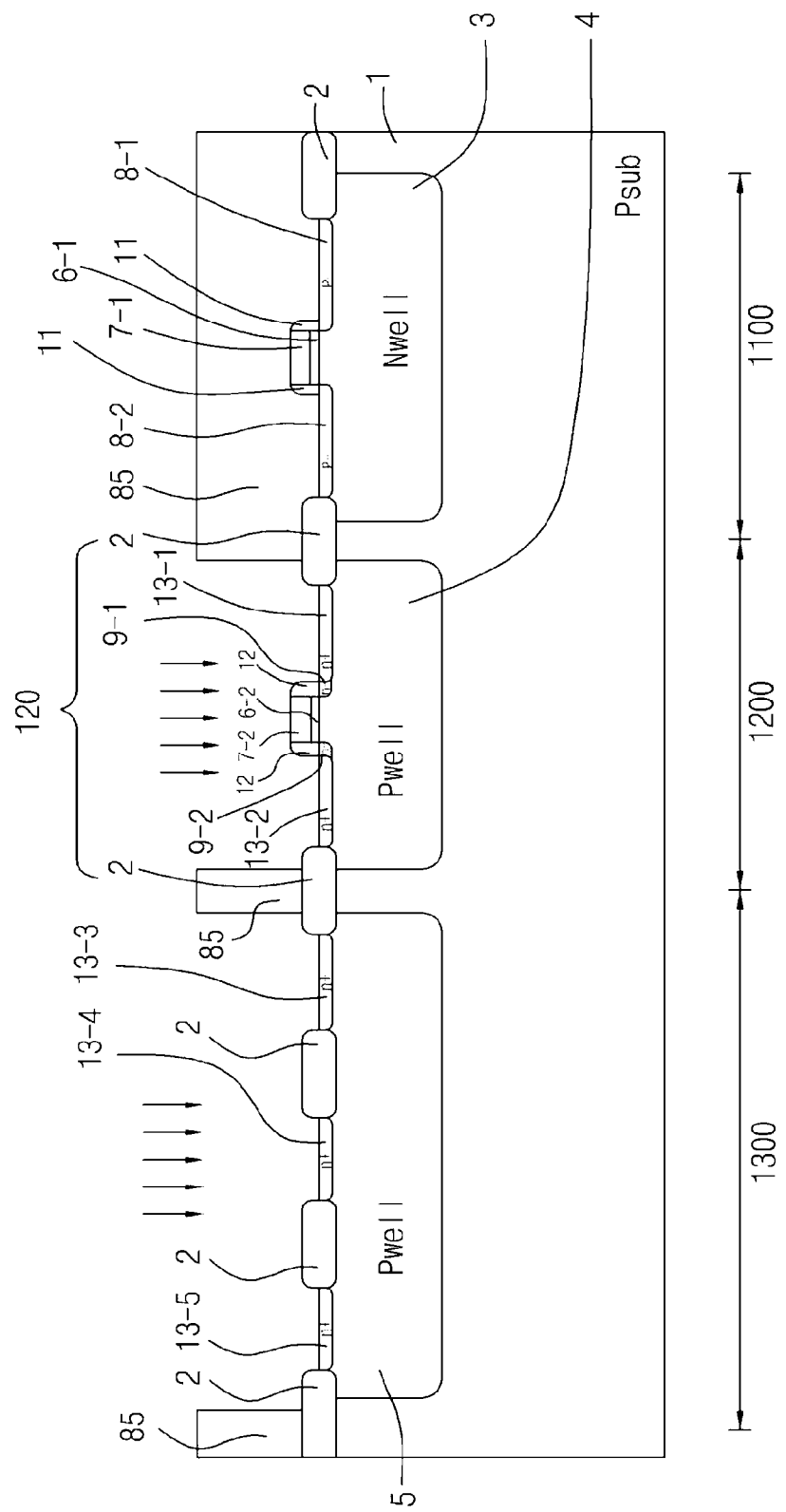
FIG. 13 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 13, a resist pattern 85 is formed on the p-type single crystal semiconductor substrate 1 (more specifically, the P$^-$ low concentration impurity diffusion regions 8-1 and 8-2), the third gate structure, and the field oxide film 2 with a heretofore known lithography technique. The resist pattern 85 has openings on the second element region 1200 and the third element region 1300 in the p-type single crystal semiconductor substrate 1, respectively. Also, n-type impurity arsenic (As$^+$) is selectively implanted into the p-type well 4 and the p-type well 5 in the vertical direction by using the resist pattern 85, the field oxide film 2, and the fourth gate structure comprised of the second insulation film 6-2, the second gate electrode 7-2, and the second sidewall insulation film 12 as masks with an acceleration energy of 50 keV and a dose amount of $3.0\times10^{15}$ cm$^{-2}$. In addition, an N$^+$ high concentration impurity diffusion region 13-1 and an N$^+$ high concentration impurity diffusion region 13-2 are selectively formed in the p-type well 4, and an N$^+$ high concentration impurity diffusion region 13-3, an N$^+$ high concentration impurity diffusion region 13-4, and an N$^+$ high concentration impurity diffusion region 13-5 are selectively formed in the p-type well 5. Here, the N⁺ high concentration impurity diffusion region 13-1 and the N⁺ high concentration impurity diffusion region 13-2 are self-aligned with the fourth gate structure.

Figure 14:
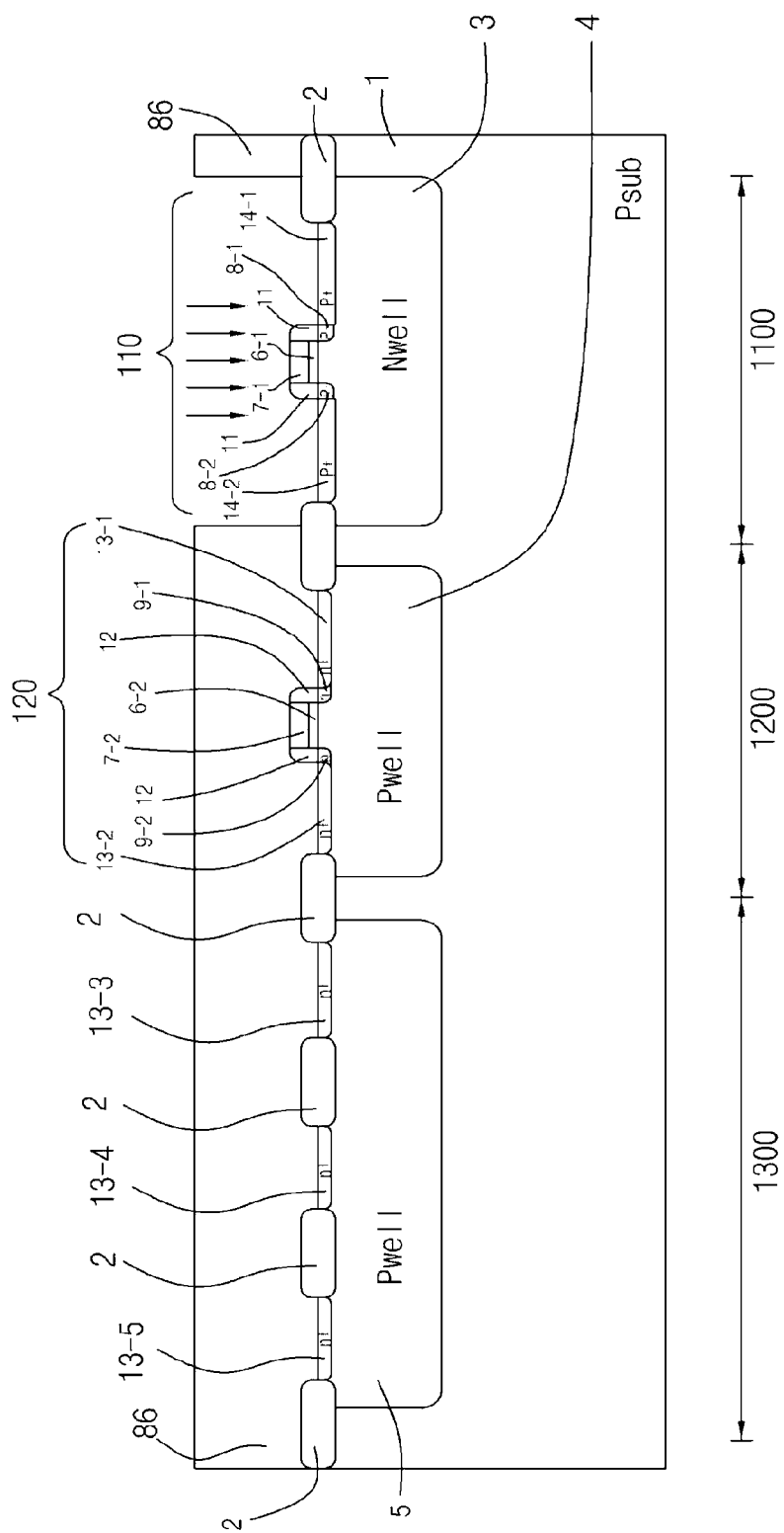
FIG. 14 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 14, the resist pattern 85 is eliminated with a heretofore known method. Then, a resist pattern 86 is formed on the p-type single crystal semiconductor substrate 1 (more specifically, the N⁺ high concentration impurity diffusion regions 13-1, 13-2, 13-3, 13-4, and 13-5), the fourth gate structure, and the field oxide film 2. The resist pattern 86 has an opening on the first element region 1100 in the p-type single crystal semiconductor substrate 1. P-type impurity difluoroborane ($BF_2^+$) is selectively implanted into the n-type well 3 in the vertical direction by using the resist pattern 86, the field oxide film 2, and the first gate structure comprised of the first gate insulation film 6-1 and the first gate electrode 7-1 as masks with an acceleration energy of 40 keV and a dose amount of $4.0 \times 10^{15}$ cm$^{-2}$. Thus, a P⁺ high concentration impurity diffusion region 14-1 and a P⁺ high concentration impurity diffusion region 14-2 are selectively formed in the n-type well 3. Here, the P⁺ high concentration impurity diffusion region 14-1 and the P⁺ high concentration impurity diffusion region 14-2 are self-aligned with the third gate structure that is comprised of the first gate insulation film 6-1, the first gate electrode 7-1, and the first sidewall insulation film 11. Then, rapid thermal annealing (RTA) is conducted in a nitrogen ($N_2$) atmosphere at 1050 degrees Celsius for 10 seconds. Thus, the following impurities are activated: (i) p-type impurities in P⁻ low concentration impurity diffusion regions 8-1 and 8-2, and P⁺ high concentration impurity diffusion regions 14-1 and 14-2, which are formed in the n-type well 3, (ii) n-type impurities in the N⁻ low concentration impurity diffusion regions 9-1 and 9-2 and N⁺ high concentration impurity diffusion regions 13-1 and 13-2, which are formed in the p-type well 4, and (iii) n-type impurities in the N⁺ high concentration impurity diffusion regions 13-3, 13-4, and 13-5, which are formed in the p-type well 5.

Figure 15:
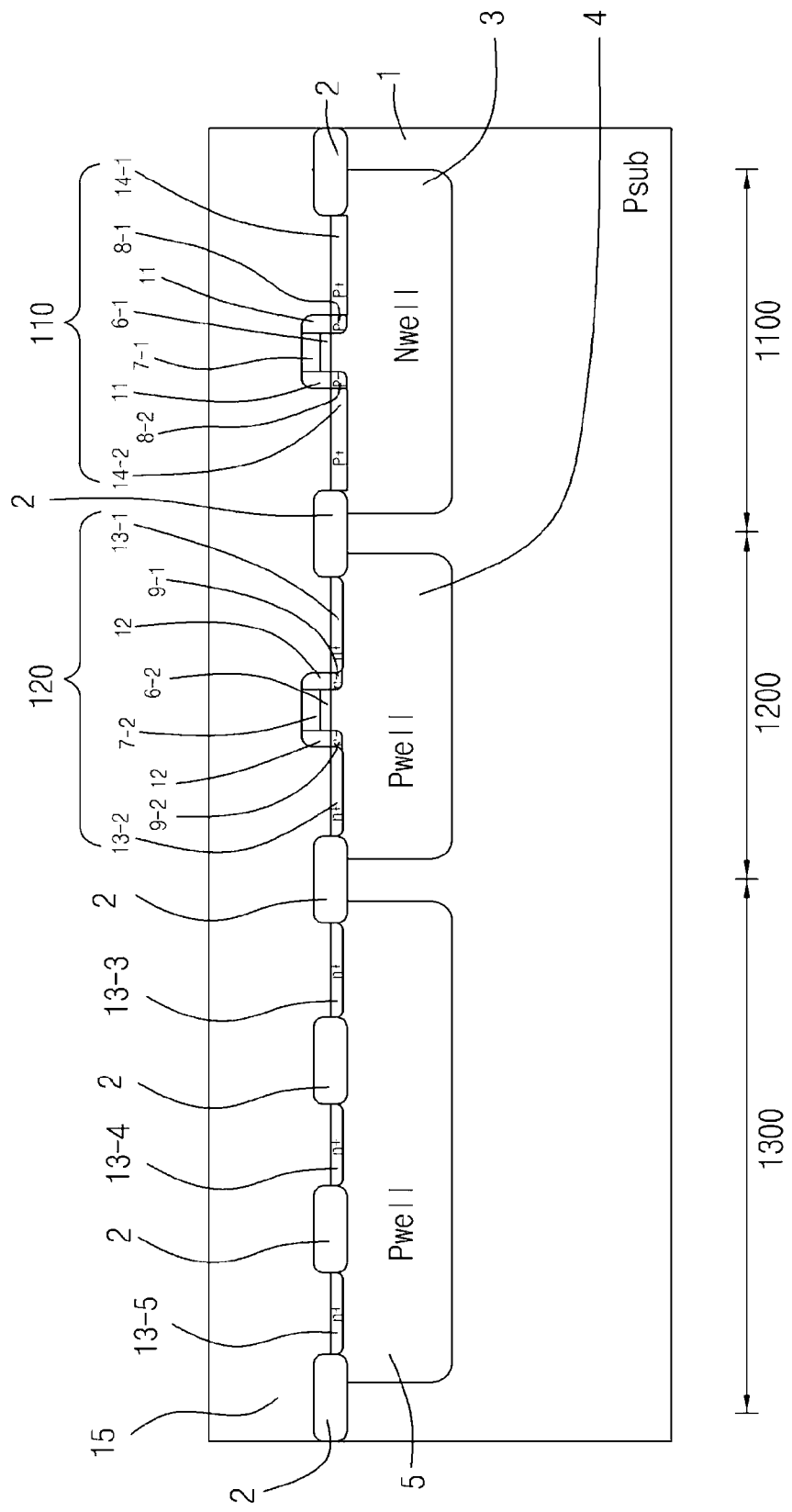
FIG. 15 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 15, the resist pattern 86 is eliminated with a heretofore known method. Then, a first interlayer insulation film 15 is formed above the p-type single crystal semiconductor substrate 1, that is, astride the field oxide film 2, the third and fourth structures, the N⁺ high concentration impurity diffusion regions 13-1, 13-2, 13-3, 13-4, and 13-5, and the P⁺ high concentration impurity diffusion regions 14-1 and 14-2 with the CVD method. Next, the upper surface of the first interlayer insulation film 15 is planarized with the chemical mechanical polishing method (the CMP method). The first interlayer insulation film 15 can be comprised of heretofore known various interlayer insulation film materials. As a typical example, non-doped silicate glass (NSG) can be used to comprise the first interlayer insulation film 15.

Figure 16:
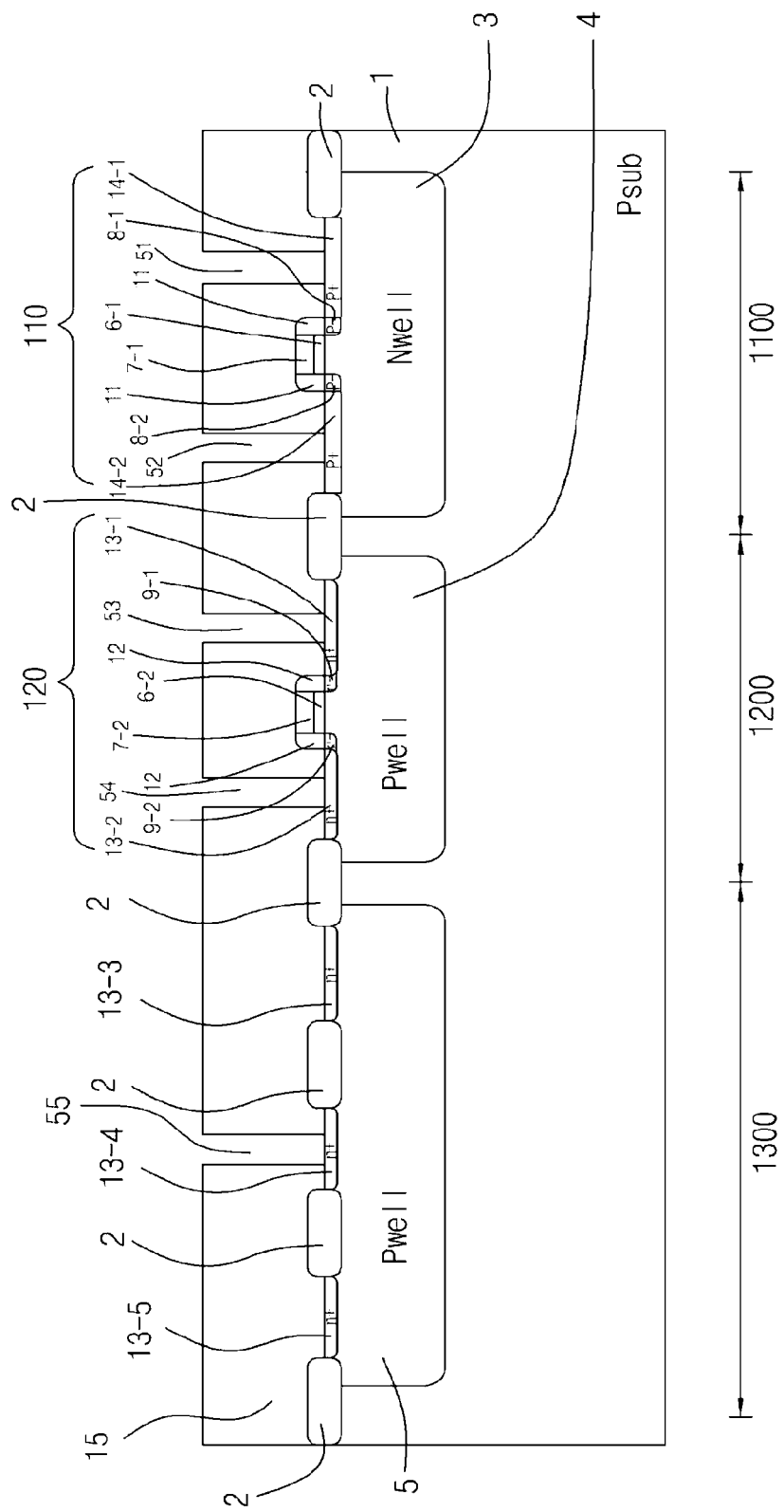
FIG. 16 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Then, a resist pattern is formed on the first interlayer insulation film 15 with a heretofore known lithography technique. This resist pattern has openings above the P⁺ high concentration impurity diffusion regions 14-1 and 14-2, and the N⁺ high concentration impurity diffusion regions 13-1, 13-2, and 13-4. Then, etching is conducted with respect to the first interlayer insulation film 15 by using this resist pattern as a mask. As shown in FIG. 16, the first interlayer insulation film 15 is selectively eliminated, and a first contact hole 51, a second contact hole 52, a third contact hole 53, a fourth contact hole 54, and a fifth contact hole 55 are formed in the first interlayer insulation film 15.

Here, a portion of the surface of the P⁺ high concentration impurity diffusion region 14-1 is exposed by the first contact hole 51. A portion of the surface of the P⁺ high concentration impurity diffusion region 14-2 is exposed by the second contact hole 52. A portion of the surface of the N⁺ high concentration impurity diffusion region 13-1 is exposed by the third contact hole 53. A portion of the surface of the N⁺ high concentration impurity diffusion region 13-2 is exposed by the fourth contact hole 54. A portion of the surface of the N⁺ high concentration impurity diffusion region 13-4 is exposed by the fifth contact hole 55.

Figure 17:
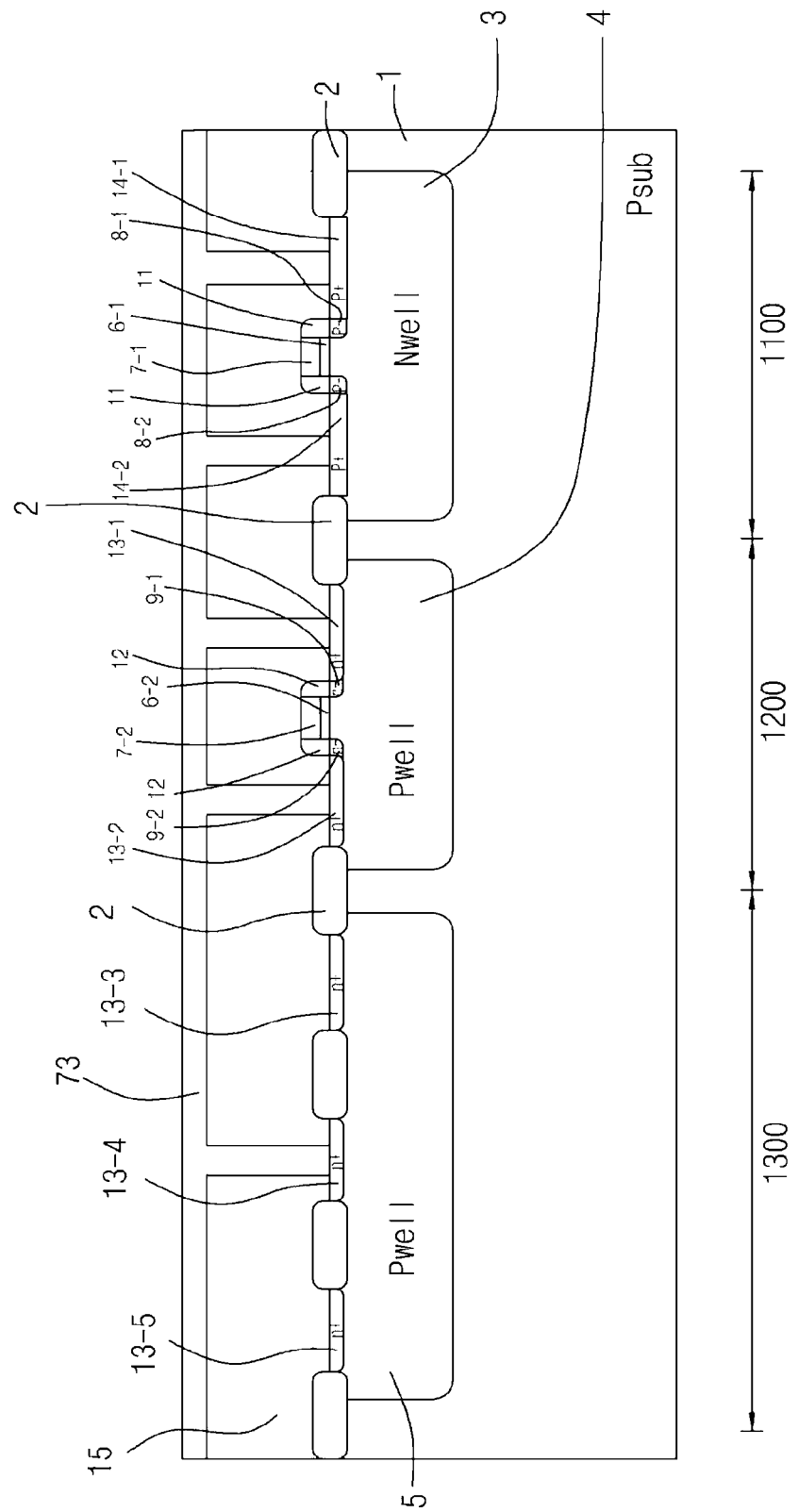
FIG. 17 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Then this resist pattern is eliminated with a heretofore known method. As shown in FIG. 17, a first conductive film 73 is formed on the first interlayer insulation film 15 and in the first to fifth contact holes 51, 52, 53, 54, and 55. More specifically, the first to fifth contact holes 51, 52, 53, 54, and 55 are completely filled with the first conductive film 73. The first conductive film 73 can be comprised of a heretofore known material and a heretofore known lamination structure. For example, the first conductive film 73 may be comprised of a laminated body that is comprised of a titanium layer of 150 Å in thickness formed with the CVD method, a titanium nitride layer of 200 Å in thickness formed on the titanium layer with the CVD method, and a tungsten layer of 4000 Å in thickness formed on the titanium nitride layer with the CVD method.

Figure 18:
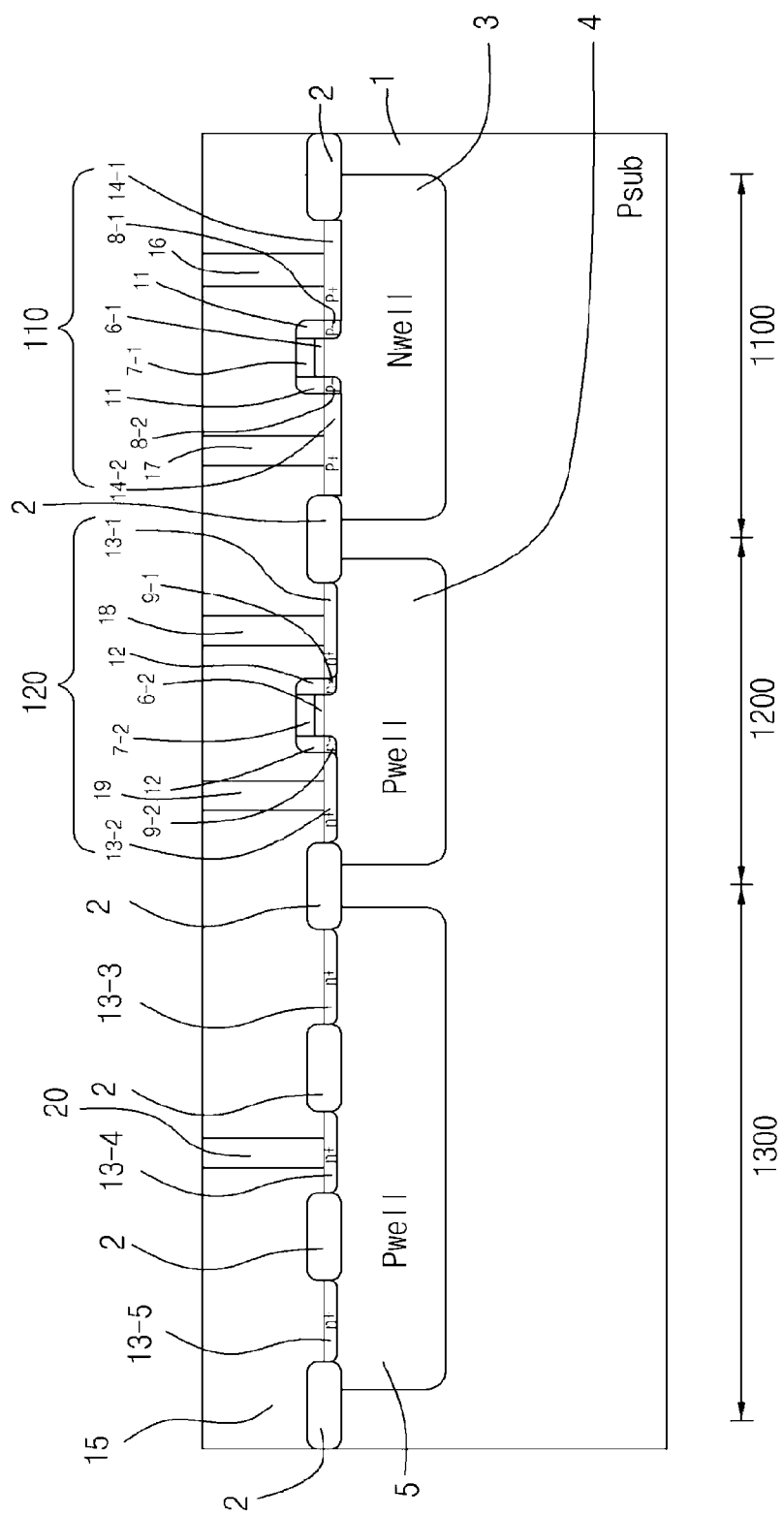
FIG. 18 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 18, the first conductive film 73 is etched back with the CMP method. Thus a portion of the first conductive film 73, which is formed on the surface of the first interlayer insulation film 15, is eliminated. On the other hand, portions of the first conductive film 73, which are formed in the first to fifth contact holes 51, 52, 53, 54, and 55 are left. Thus first to fifth conductive contact plugs 16, 17, 18, 19, and 20 are formed in the first to fifth contact holes 51, 52, 53, 54, and 55, respectively. In addition, the first conductive contact plug 16 has an electric contact with the P⁺ high concentration impurity diffusion region 14-1. The second conductive contact plug 17 has an electric contact with the P⁺ high concentration impurity diffusion region 14-2. The third conductive contact plug 18 has an electric contact with the N⁺ high concentration impurity diffusion region 13-1. The fourth conductive contact plug 19 has an electric contact with the N⁺ high concentration impurity diffusion region 13-2. The fifth conductive contact plug 20 has an electric contact with the N⁺ high concentration impurity diffusion region 13-4. One planar surface is formed by the upper surface of the first interlayer insulation film 15 and the upper surfaces of the first to fifth conductive contact plugs 16, 17, 18, 19, and 20.

Figure 19:
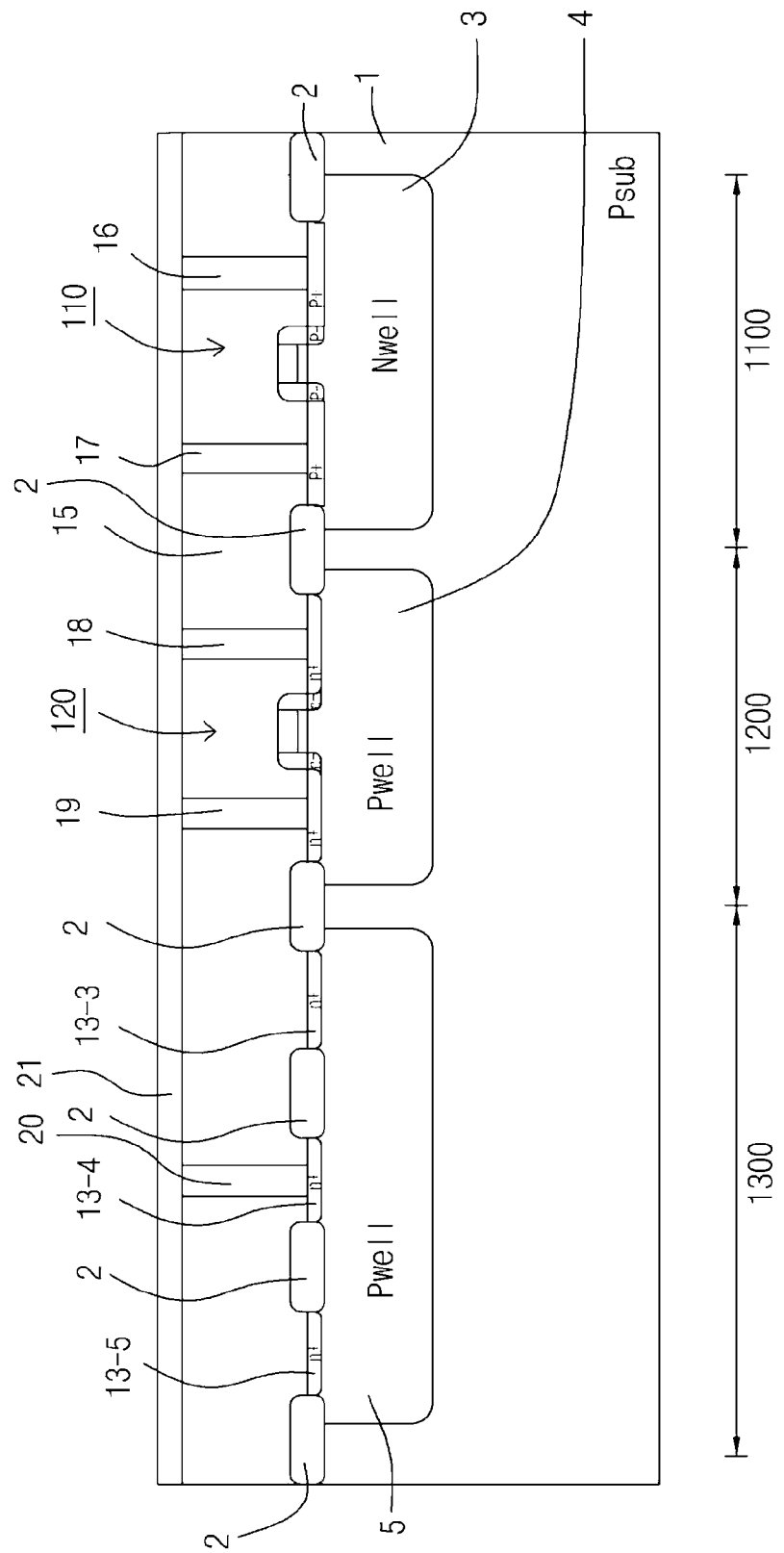
FIG. 19 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 19, a second interlayer insulation film 21 is formed on the first interlayer insulation film 15 and the first to fifth conductive contact plugs 16, 17, 18, 19, and 20 with the plasma enhanced chemical vapor deposition method (the plasma CVD method). The second interlayer insulation film 21 may be comprised of a multi-layer structure or a single-layer structure. Here, the multi-layer structure may be comprised of a tetraethoxysilane non-doped silicate glass film (a TEOS-NSG film) formed with the plasma CVD method, a silicon nitride film of 1000 Å in thickness formed on the TEOS-NSG film with the plasma CVD method, an $O_3$-TEOS-NSG film of 1500 Å in thickness formed on the silicon nitride film with the low pressure CVD, and an $O_3$-TEOS-NSG film of 1500 Å in thickness formed on the $O_3$-TEOS-NSG film with the high pressure CVD method. In addition, the above described single layer structure may be comprised of a TEOS-NSG film of 4000 Å in thickness formed with the plasma CVD method. Then, this TEOS-NSG film may be annealed in a nitrogen atmosphere at 700 degrees Celsius for 30 minutes.

Figure 20:
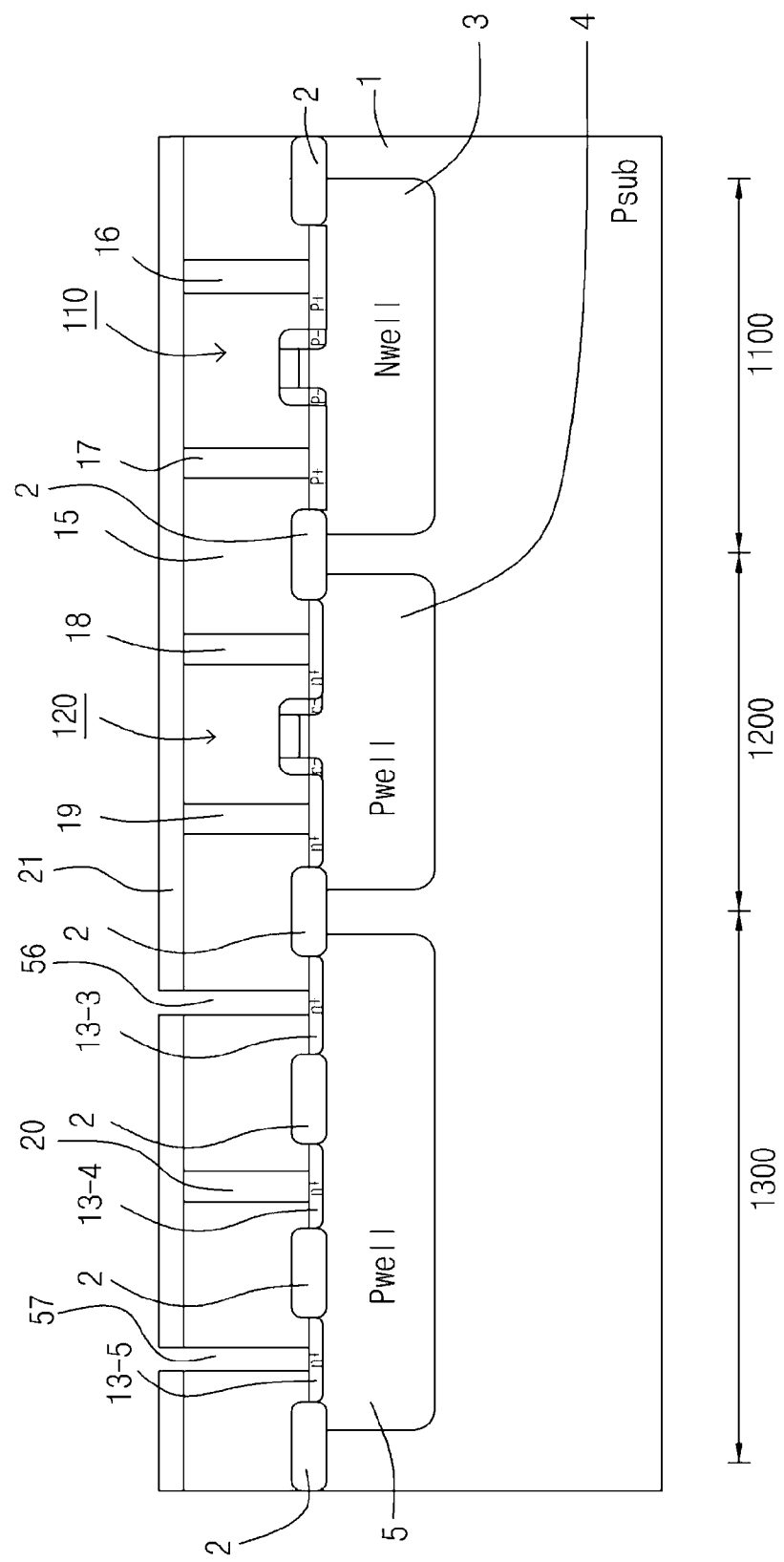
FIG. 20 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Next, a resist pattern is formed on the second interlayer insulation film 21 with a heretofore known lithography technique. This resist pattern has openings above the N⁺ high concentration impurity diffusion regions 13-3 and 13-5. As shown in FIG. 20, etching is conducted with respect to the second interlayer insulation film 21 and the first interlayer insulation film 15 by using this resist pattern as a mask. Thus the second interlayer insulation film 21 and the first interlayer insulation film 15 are selectively eliminated, and a sixth contact hole 56 and a seventh contact hole 57 are formed in the second interlayer insulation film 21 and the first interlayer insulation film 15. Here, the sixth contact hole 56 exposes a portion of the upper surface of the $N^+$ high concentration impurity diffusion region 13-3, and the seventh contact hole 57 exposes a portion of the upper surface of the $N^+$ high concentration impurity diffusion region 13-5.

Figure 21:
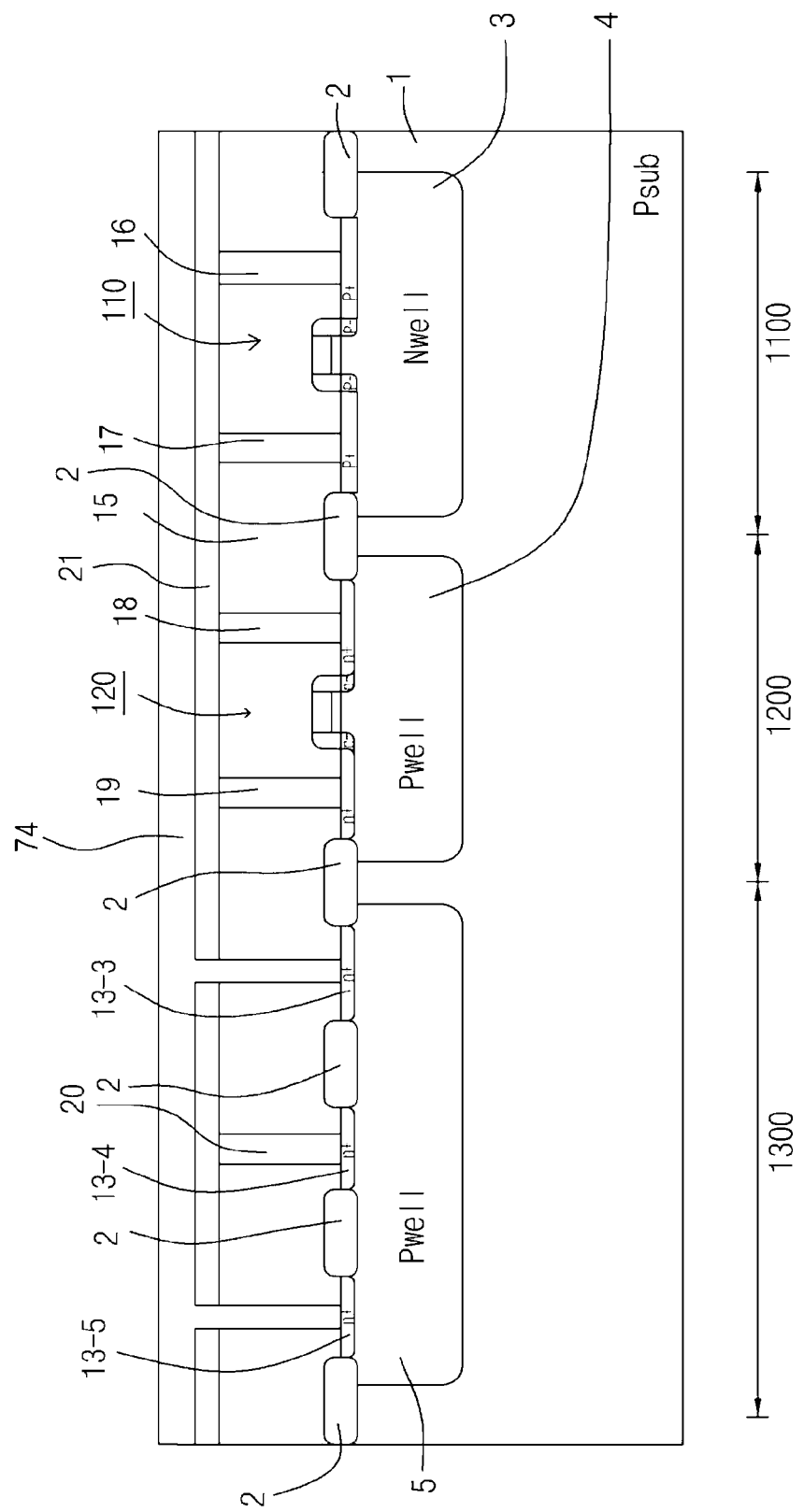
FIG. 21 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Next, the resist pattern is eliminated with a heretofore known method. Then, as shown in FIG. 21, a second conductive film 74 is formed on the second interlayer insulation film 21 and the sixth and seventh contact holes 56 and 57. Here, the sixth and seventh contact holes 56 and 57 are completely filled with the second conductive film 74. The second conductive film 74 can be comprised of a heretofore known material and a heretofore known layer structure. For example, the second conductive film 74 may be a laminated body that is comprised of a titanium layer of 150 Å in thickness formed with the CVD method, a titanium nitride layer of 200 Å in thickness formed on the titanium layer with the CVD method, and a tungsten layer of 6000 Å in thickness formed on the titanium nitride with the CVD method.

Figure 22:
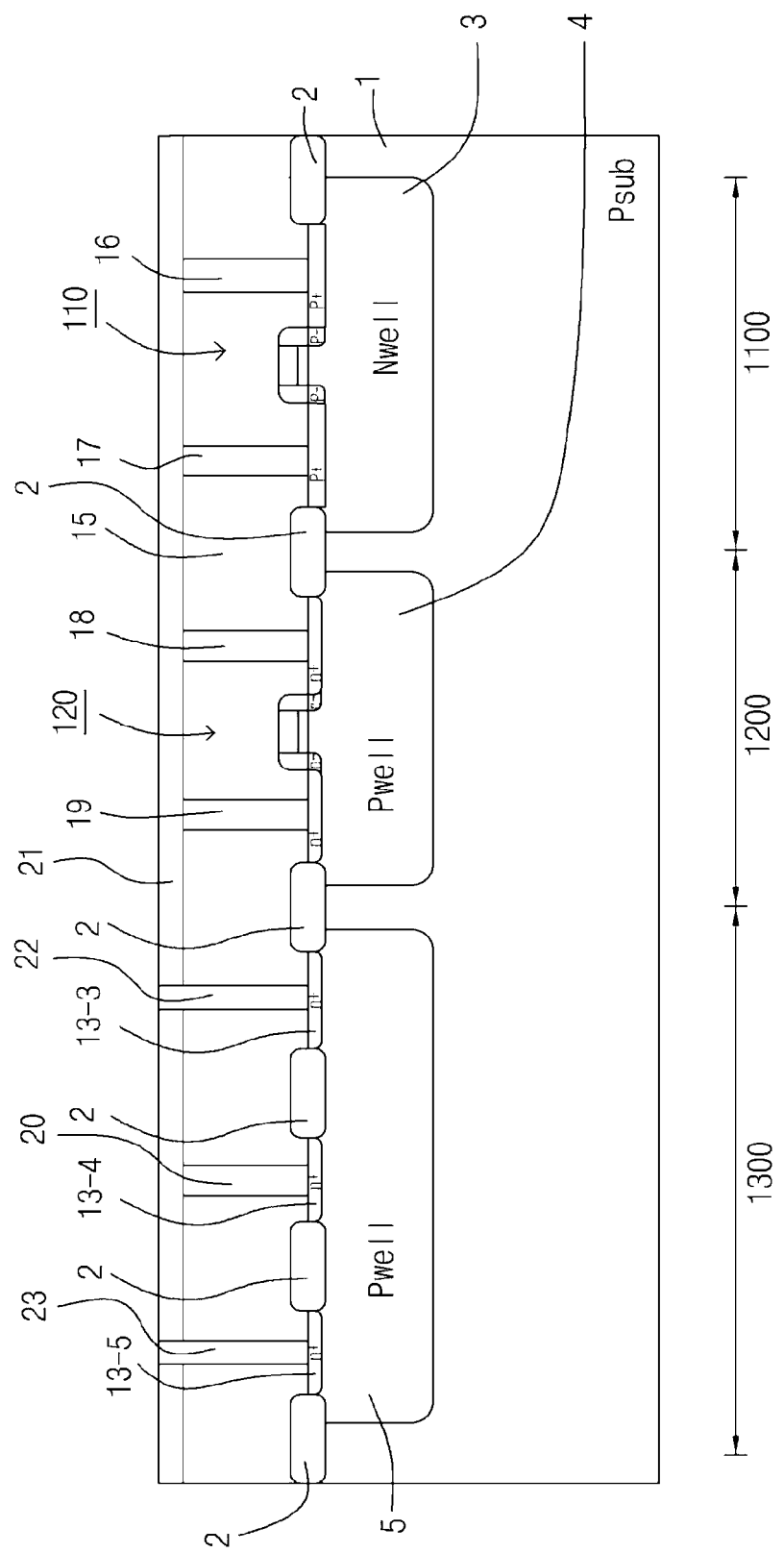
FIG. 22 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Next, as shown in FIG. 22, the second conductive film 74 is etched back with the CMP method. Thus a portion of the second conductive film 74, which is formed on the surface of the second interlayer insulation film 21, is eliminated. On the other hand, portions of the second conductive film 74, which are formed in the sixth and seventh contact holes 56 and 57, are left. Thus sixth and seventh conductive contact plugs 22 and 23 are formed in the sixth and seventh contact holes 56 and 57, respectively. Here, the sixth conductive contact plug 22 has an electric contact with the $N^+$ high concentration impurity diffusion region 13-3. The seventh conductive contact plug 23 has an electric contact with the $N^+$ high concentration impurity diffusion region 13-5. In addition, one planar surface is formed by the upper surface of the second interlayer insulation film 21 and the upper surfaces of the sixth and seventh conductive contact plugs 22 and 23.

Figure 23:
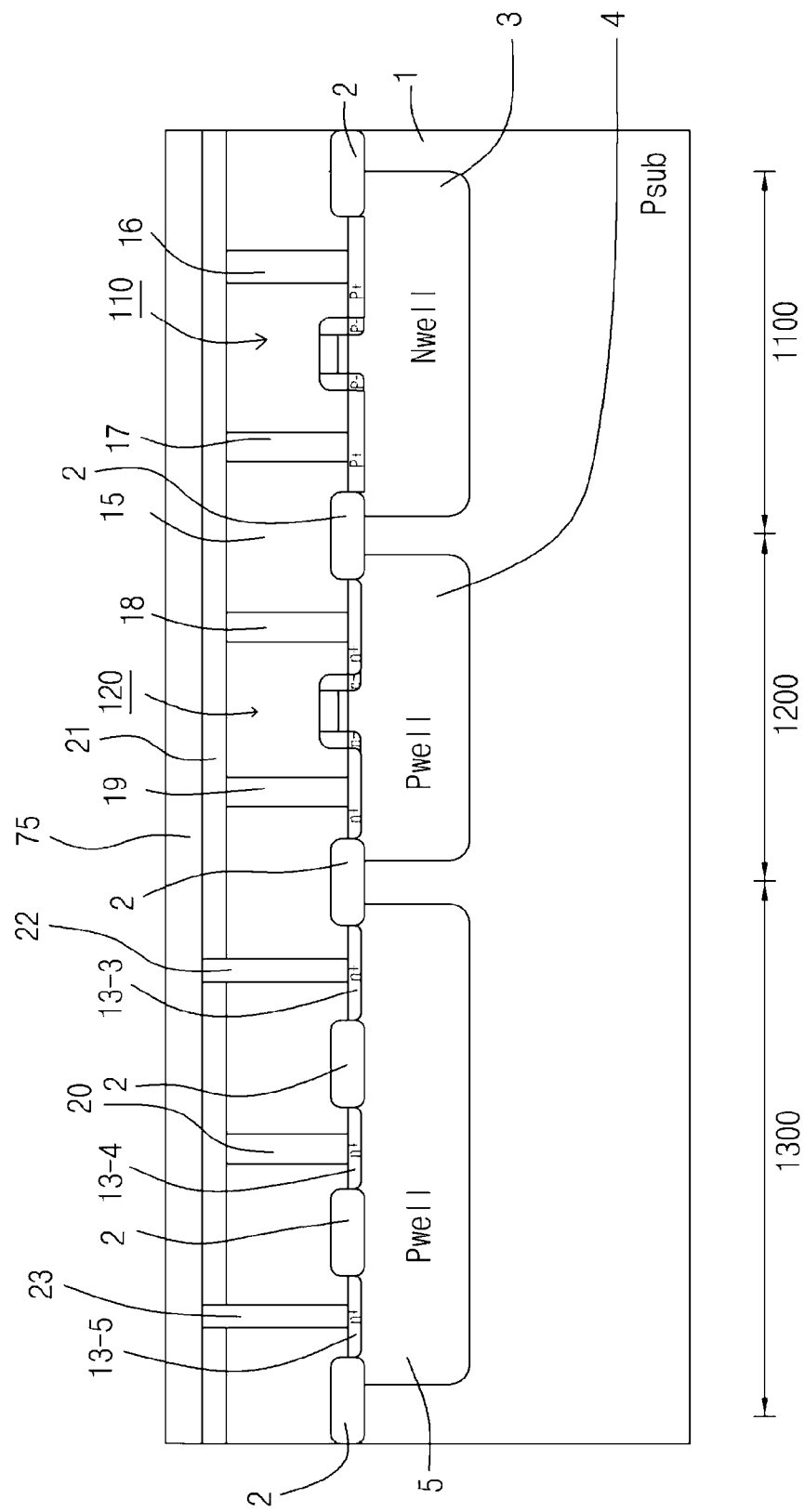
FIG. 23 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Next, as shown in FIG. 23, a third conductive film 75 is formed on the second interlayer insulation film 21 and the sixth and seventh conductive contact plugs 22 and 23 with the sputtering method. Here, the CVD method can be used instead of the sputtering method. This third conductive film 75 can be comprised of a conductive layer structure used for a lower electrode of a heretofore known capacitor. Specifically, this third conductive film 75 may be comprised of a multi-layer structure or a single-layer structure. Here, this multi-layer structure can be comprised of a TiAN layer of 500 Å formed with the sputtering method, an Ir layer of 1000 Å in thickness formed on the TiAN layer with the sputtering method, a IrO2 layer of 1000 Å in thickness formed on the Ir layer with the sputtering method, and a Pt layer of 500 Å in thickness formed on the $IrO_2$ layer with the sputtering method. Here, the TiAN layer comprises a conductive oxidized barrier layer. The $IrO_2$ layer is formed between the Ir layer and the Pt layer to prevent the Ir of the Ir layer and Pt of the Pt layer from chemically reacting with each other. In addition, the above described single-layer structure can be comprised of a Pt layer formed with the sputtering method.

Figure 24:
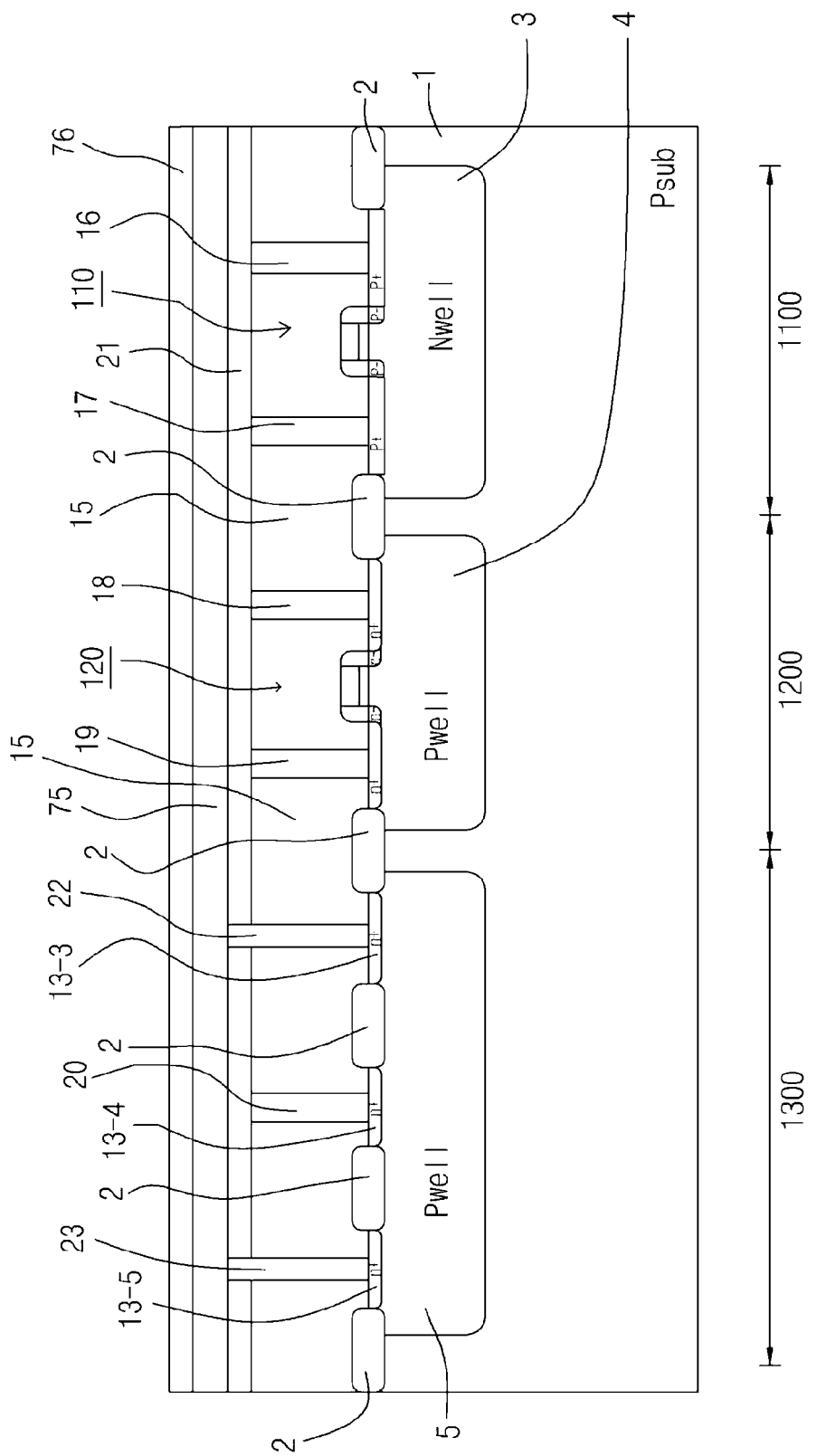
FIG. 24 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 24, a first dielectric film 76 is formed on the above described third conductive film 75. Here, the first dielectric film 76 may be annealed at 700 to 750 degrees Celsius after a dielectric film is formed with the spin-coating method. In addition, the CVD method can be used instead of the spin-coating method. It is preferable for the first dielectric film 76 to be comprised of a metal oxide ferroelectric film. More specifically, it is preferable for the first dielectric film 76 to be comprised of SBT of 1200 Å in thickness. However, the first dielectric film 76 may be comprised of high dielectrics instead of ferroelectrics.

Figure 25:
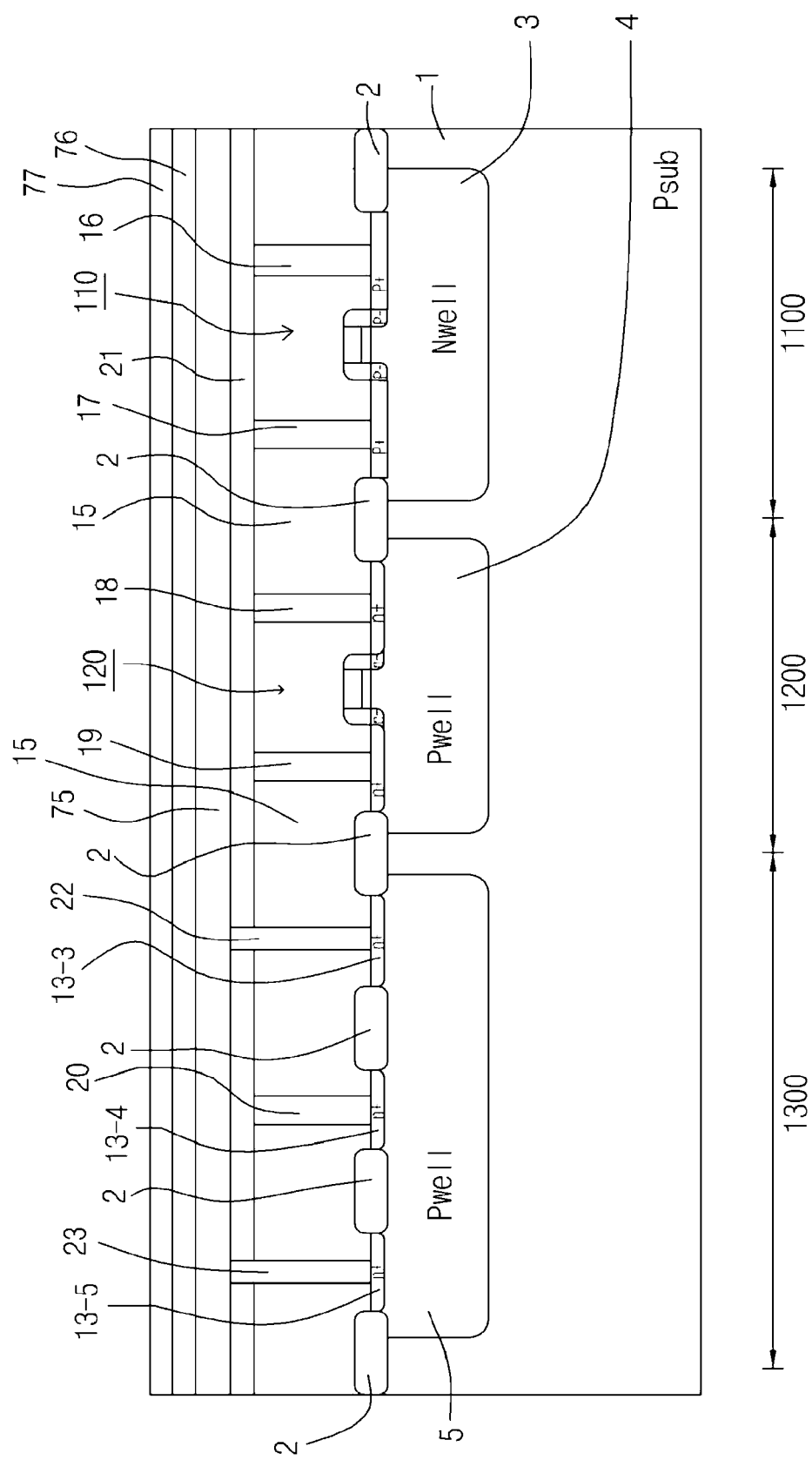
FIG. 25 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 25, a fourth conductive film 77 is formed on the above described first dielectric film 76 with the sputtering method. The CVD method may be used instead of the sputtering method. The fourth conductive film 77 can be comprised of a conductive layer structure used for an upper electrode of a heretofore known capacitor. As a typical example, it is preferable for the fourth conductive film 77 to be comprised of a Pt film of 1500 Å in thickness. The laminated structure comprised of the third conductive film 75, the first dielectric film 76, and fourth conductive film 77 has stress. In particular, a Pt film formed on the metal oxide ferroelectric film has a relatively large amount of stress. Therefore, it is desirable to reduce the stress with a thermal treatment. Therefore, the stress can be reduced by conducting annealing in an oxygen atmosphere at 700 degrees Celsius for one minute.

Figure 26:
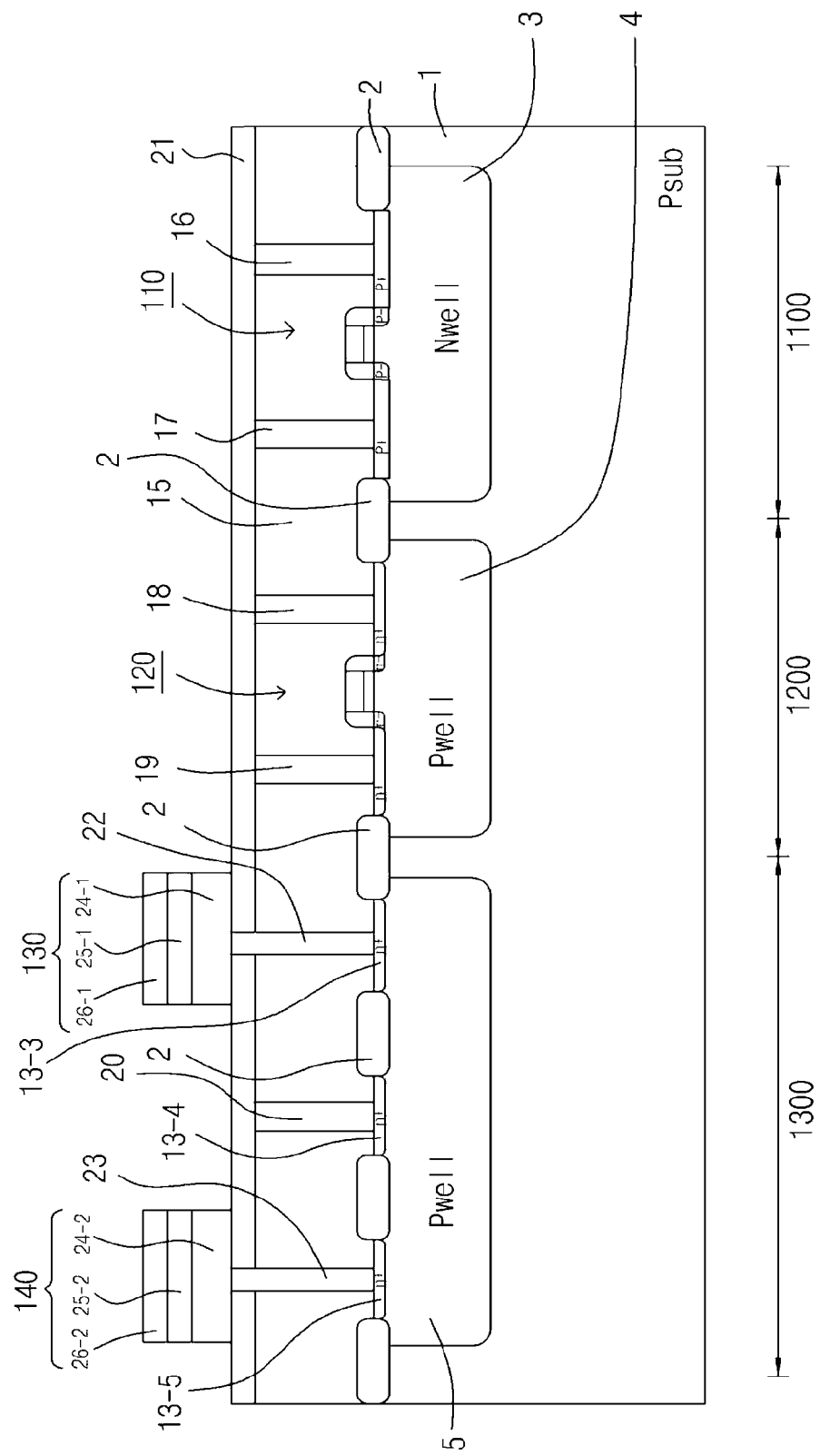
FIG. 26 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 27:
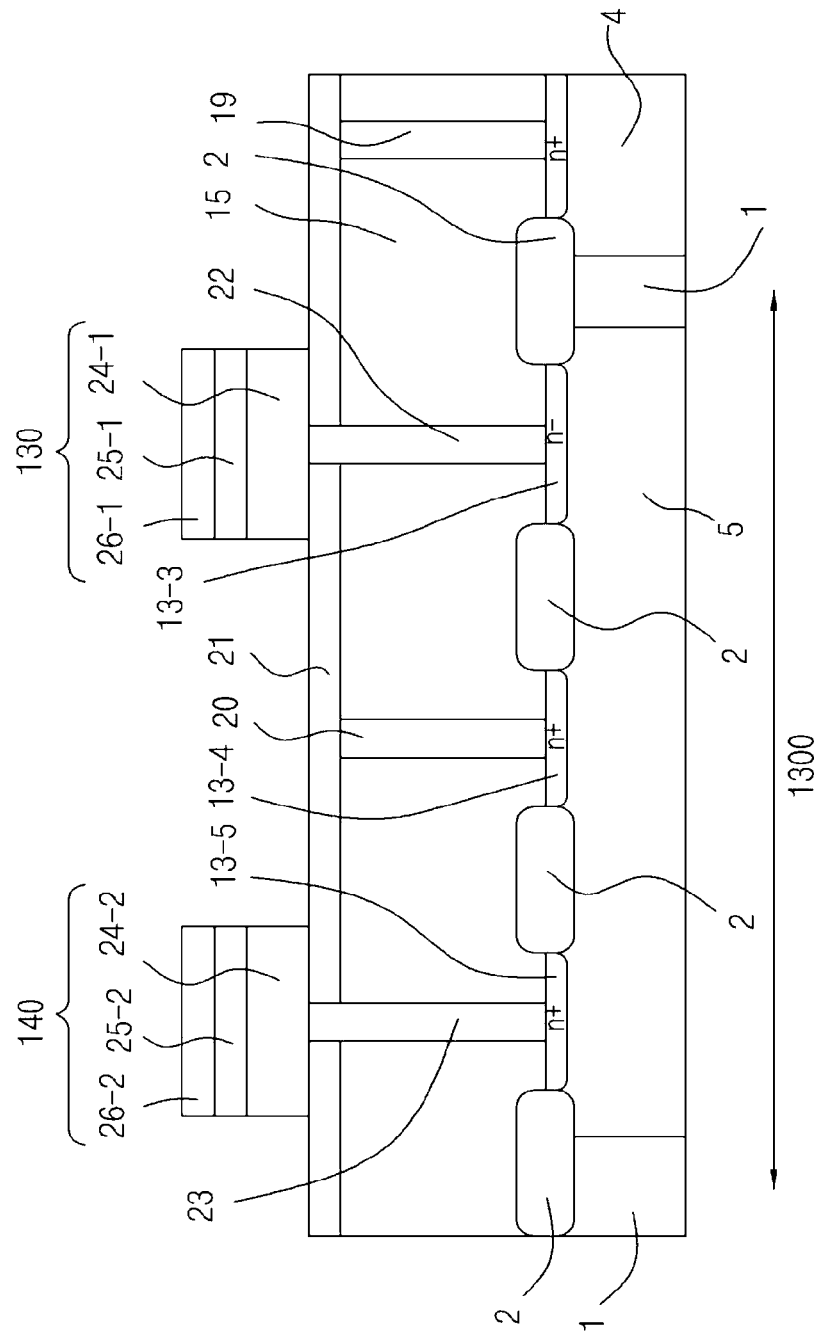
FIG. 27 is a partial enlarged vertical cross-section diagram of the pair of FeRAM cells shown in FIG. 26.

Next, a layer functioning as a hard mask is formed on the fourth conductive film 77. Specifically, a TiN film of 1000 Å in thickness is formed on the fourth conductive film 88. In addition, a tetraethoxysilane film (TEOS film) of 4000 Å in thickness is formed on the TiN film with the plasma CVD method. Furthermore, a TiN film of 1000 Å in thickness is formed on the TEOS film. Thus a three-layer structure is formed. This three-layer structure comprises a layer functioning as a hard mask. In addition, a resist pattern is formed on the three-layer structure with a heretofore known lithography technique. Etching is conducted with respect to this three-layer structure by using the resist pattern as a mask. Thus, a hard mask comprised of the three-layer structure is formed. Then, the resist pattern is eliminated with a heretofore known method. As shown in FIGS. 26 and 27, a laminated structure comprised of the third conductive film 75, the first dielectric film 76, and the fourth conductive film 77, is selectively etched by using the formed hard mask. Thus, a first capacitor 130 and a second capacitor 140 are formed.

The first capacitor 130 is comprised of a first lower electrode 24-1, a first metal oxide ferroelectric film 25-1 that is formed on the first lower electrode 24-1, and a first upper electrode 26-1 that is formed on the first metal oxide ferroelectric film 25-1. The first lower electrode 24-1 is electrically connected to the $N^+$ high concentration impurity diffusion region 13-3 through the sixth conductive contact plug 22. The first lower electrode 24-1 functions as a storage electrode. In addition, the first metal oxide ferroelectric film 25-1 functions as a insulator. The first upper electrode 26-1 functions as a counter electrode.

On the other hand, the second capacitor 140 is comprised of a first lower electrode 24-2, a second metal oxide ferroelectric film 25-2 that is formed on the first lower electrode 24-2, and a second upper electrode 26-2 that is formed on the second metal oxide ferroelectric film 25-2. The second lower electrode 24-2 is electrically connected to the $N^+$ high concentration impurity diffusion region 13-5 through the seventh conductive contact plug 23. The second lower electrode 24-2 functions as a storage electrode. The second metal oxide ferroelectric film 25-2 functions as an insulator. In addition, the second upper electrode 26-2 functions as a counter electrode. Next, the hard mask used for forming the first capacitor 130 and the second capacitor 140 is eliminated with a heretofore known method.

Figure 28:
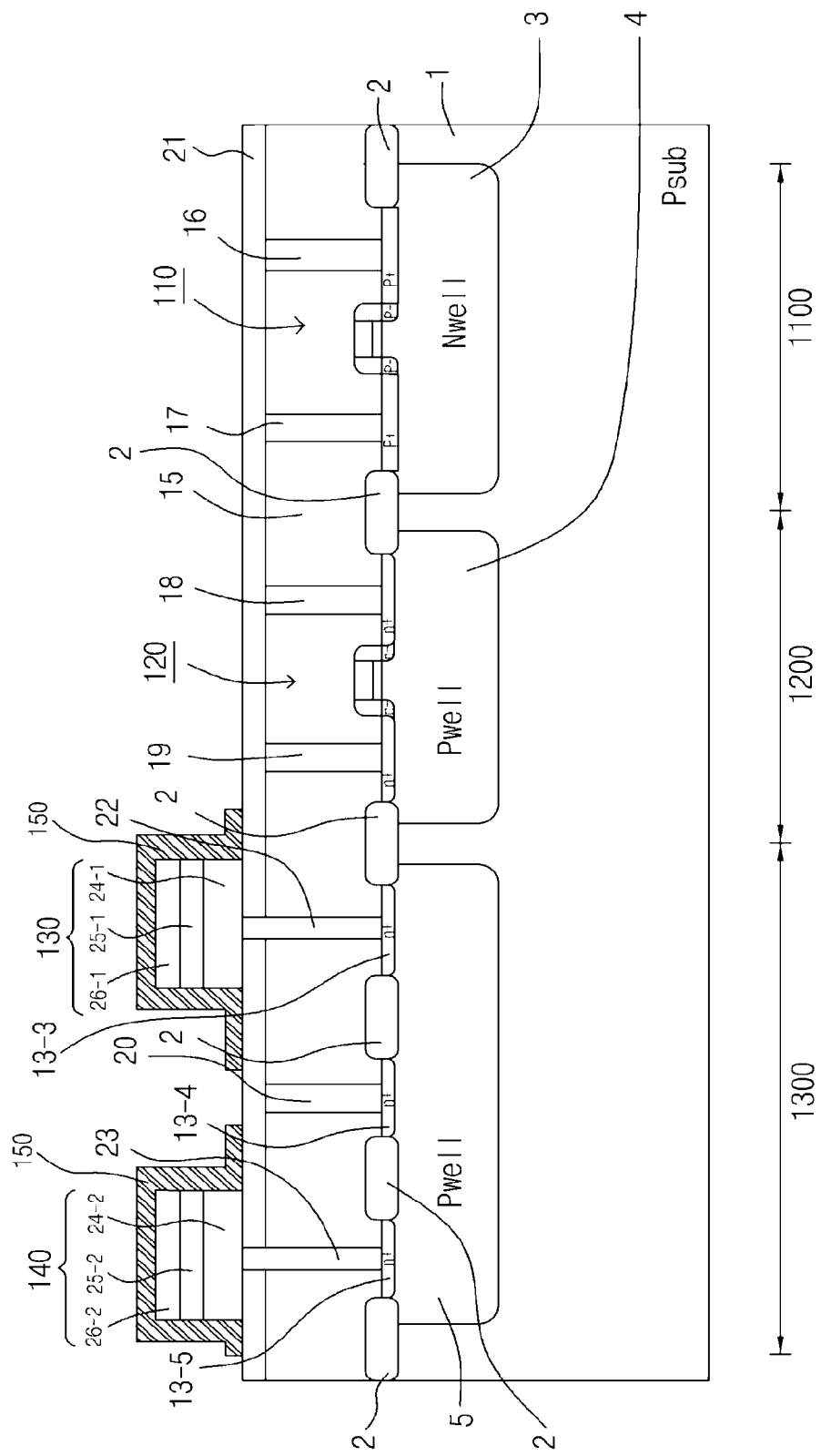
FIG. 28 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 29:
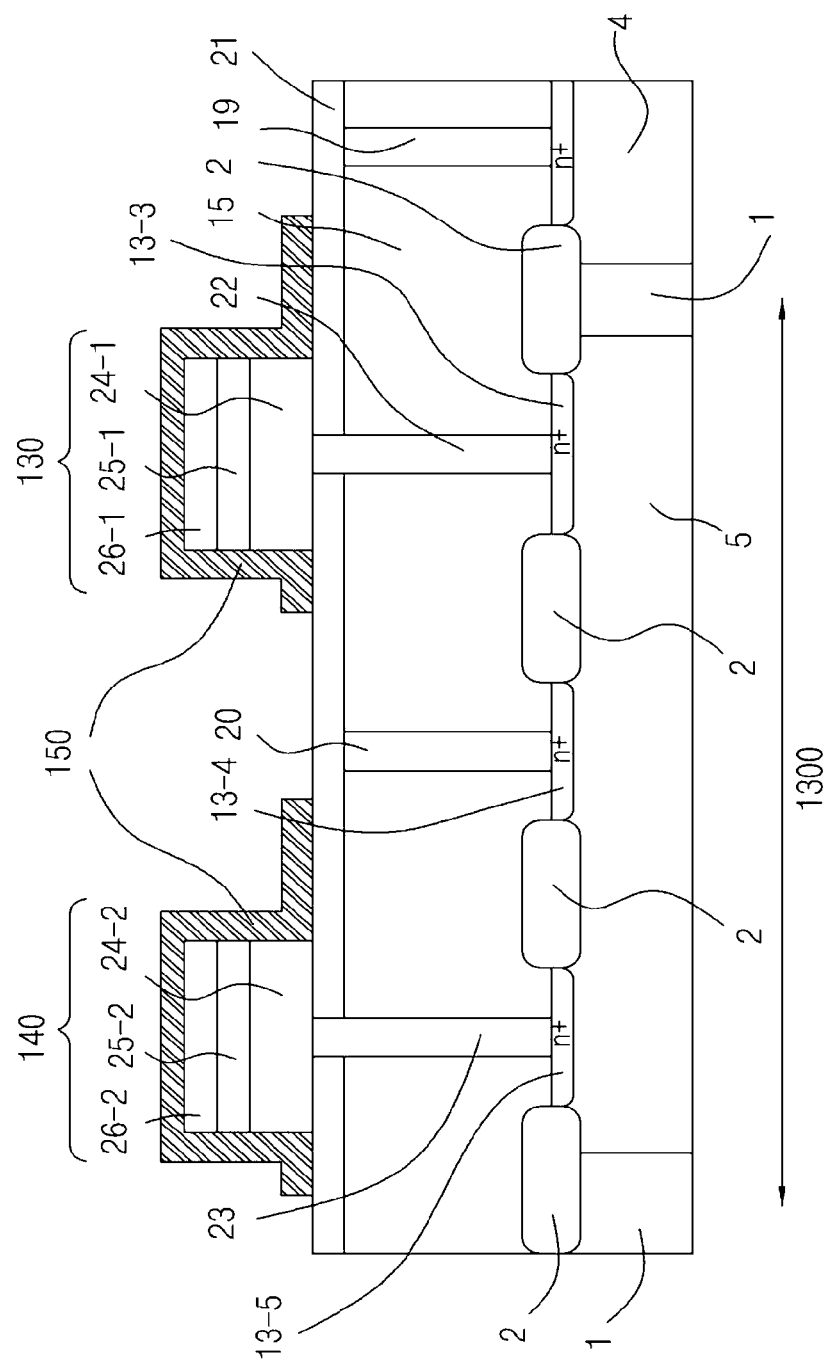
FIG. 29 is a partial enlarged vertical cross-section diagram of the pair of FeRAM cells shown in FIG. 28.

Next, an insulating hydrogen barrier film that has electrical insulating properties and hydrogen non-permeability is formed on the upper surfaces and the lateral surfaces of the first capacitor 130 and the second capacitor 140, and the upper surface of the second interlayer insulation film 21 with the CVD method. For example, it is preferable for the insulating hydrogen barrier film to be comprised of an alumina ($Al_2O_3$) film or a STO ($SrTiO_3$) film. Furthermore, for example, the insulating hydrogen barrier film can be comprised of an alumina ($Al_2O_3$) film of 500 Å in thickness. In addition, a TEOS film of 500 Å in thickness is formed on the insulating hydrogen barrier film with the plasma CVD method. Furthermore, a resist pattern is formed on the TEOS film with a heretofore known lithography technique. This TEOS film is etched by using the resist pattern as a mask, and thus a hard mask is formed. Then, this resist pattern is eliminated with a heretofore known method. Next, as shown in FIGS. 28 and 29, the alumina film is selectively etched by using the formed hard mask, and thus a first insulating hydrogen barrier layer 150 is formed. The first insulating hydrogen barrier layer 150 covers the surfaces of the first capacitor 130 and the second capacitor 140, and also covers portions of the second interlayer insulation film 21, which correspond to the outer vicinity region of the first capacitor 130 and that of the second capacitor 140, respectively. Then, the hard mask used for forming the first insulating hydrogen barrier layer 150 is eliminated with a heretofore known method.

Figure 30:
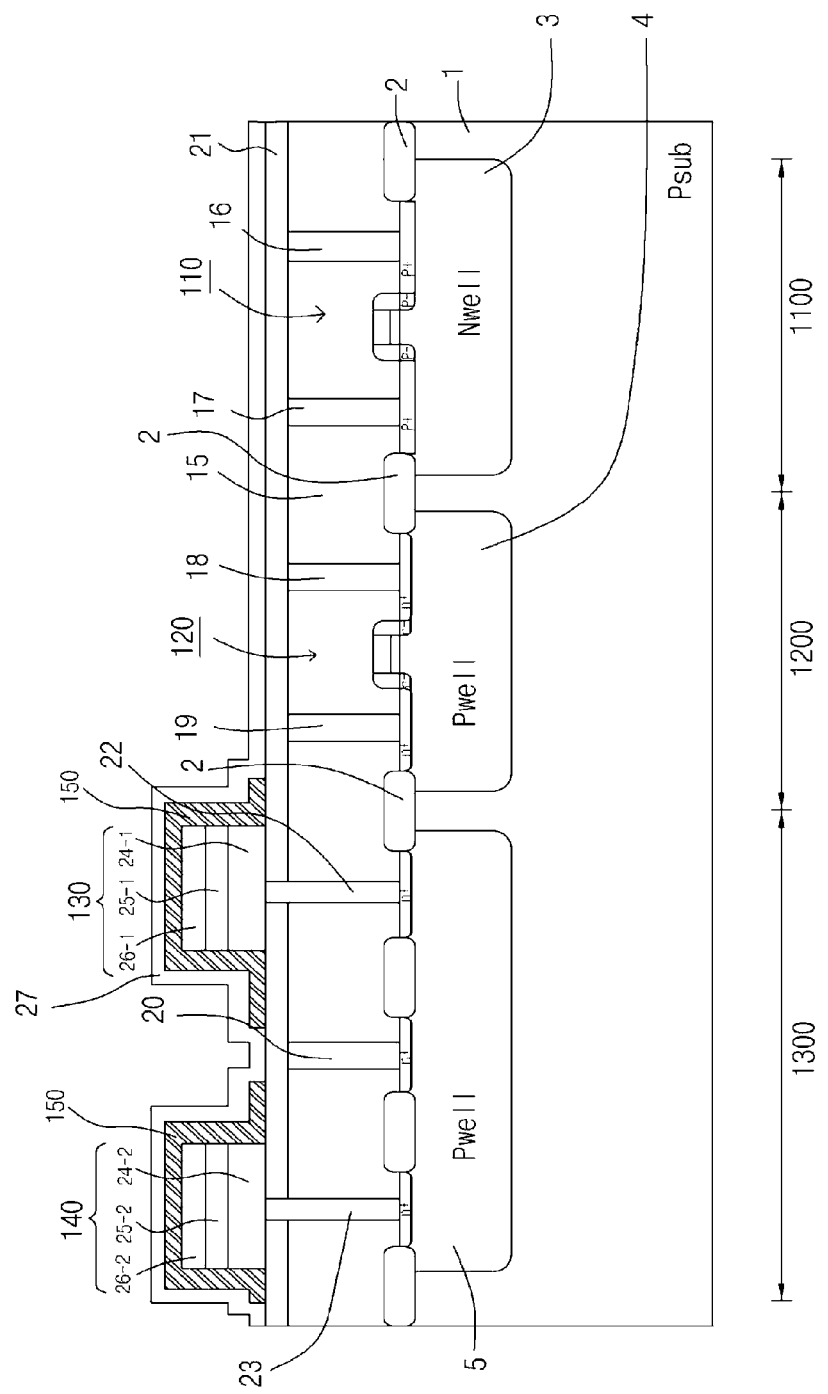
FIG. 30 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 30, a third interlayer insulation film 27 is formed on the first insulating hydrogen barrier layer 150 and the second interlayer insulation film 21. The third interlayer insulation film 27 can be comprised of a TEOS film of 2500 Å in thickness with the plasma CVD.

Figure 31:
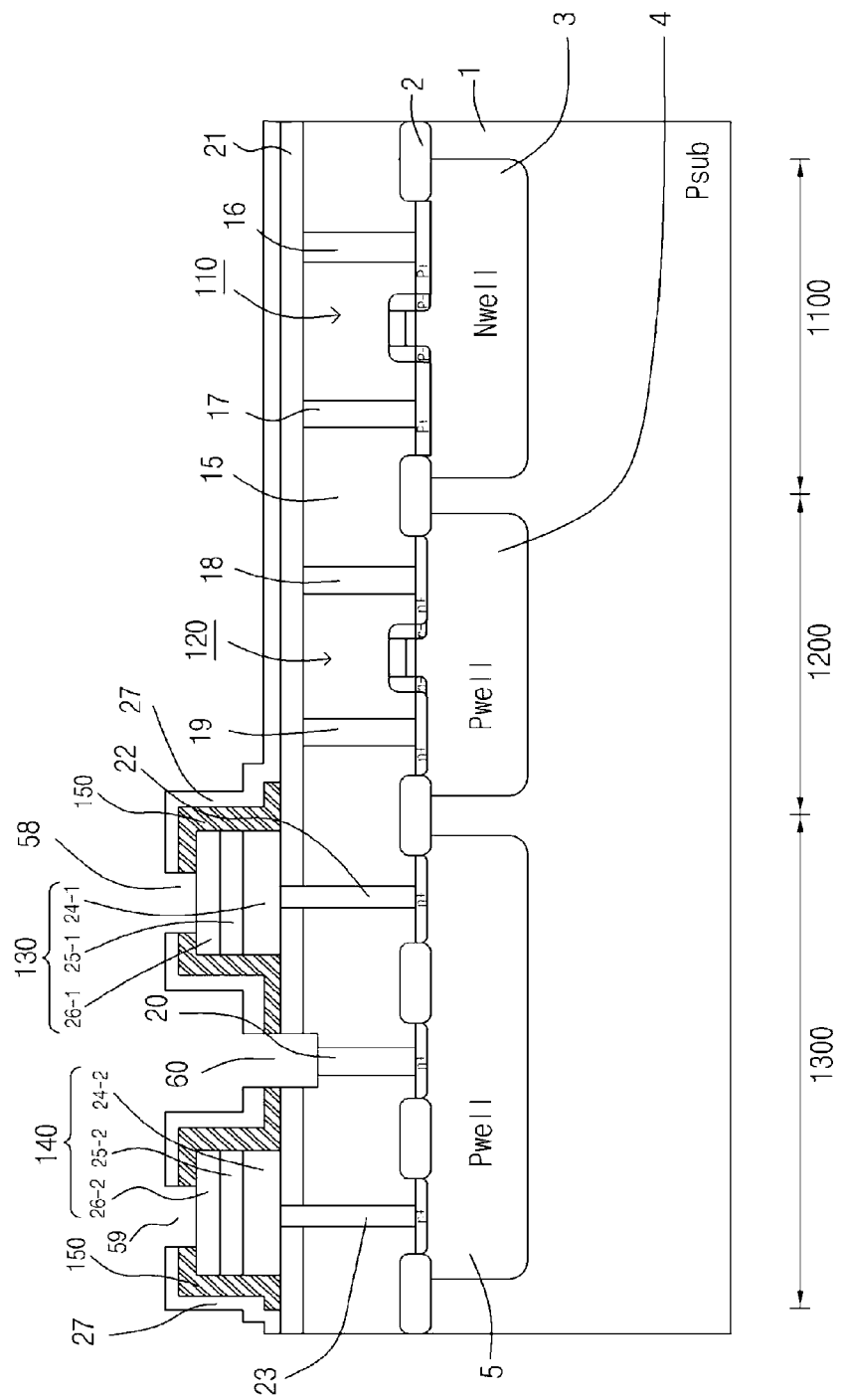
FIG. 31 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 32:
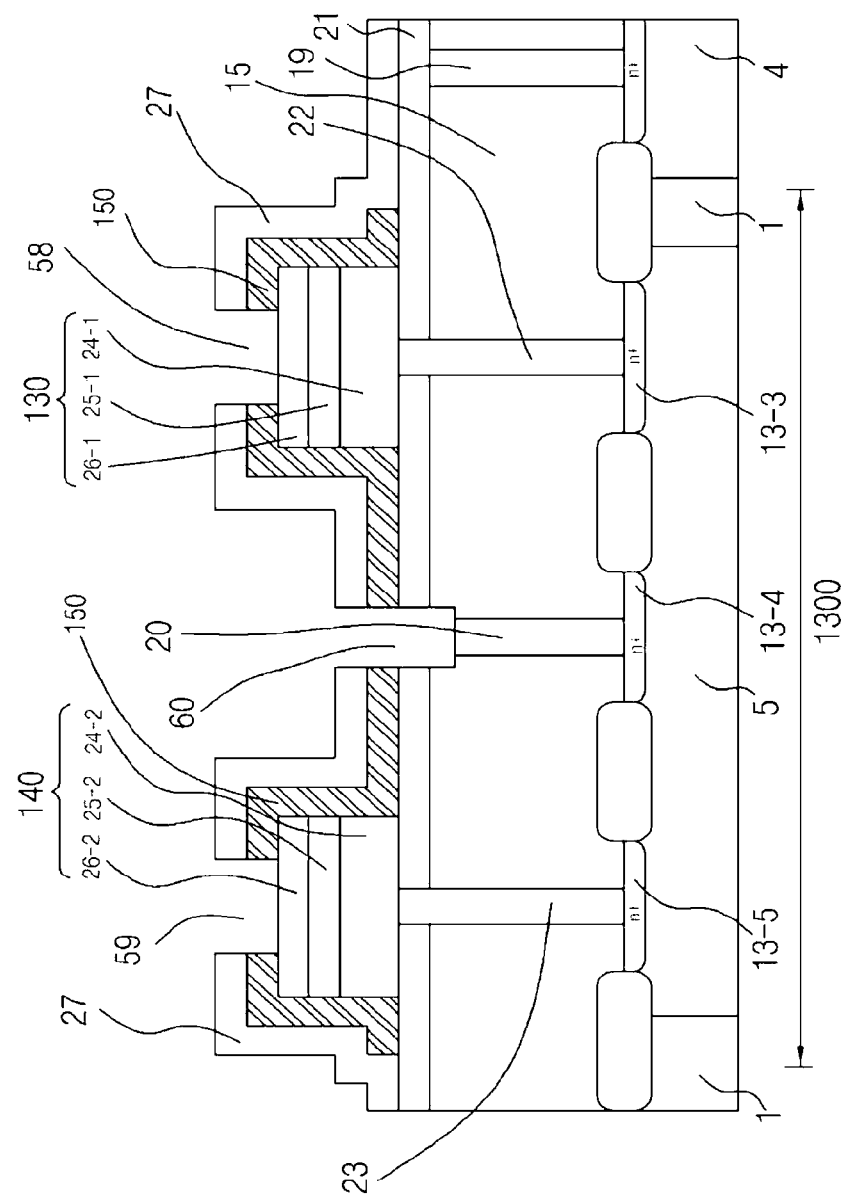
FIG. 32 is a partial enlarged vertical cross-section diagram of the pair of FeRAM cells shown in FIG. 31.

Next, a resist pattern is formed on the third interlayer insulation film 27 with a heretofore known lithography technique. This resist pattern has openings above the first upper electrode 26-1, the second upper electrode 26-2, and the fifth conductive contact plug 20. Then, as shown in FIGS. 31 and 32, portions of the third interlayer insulation film 27 and the first insulating hydrogen barrier layer 150, which are located above the first upper electrode 26-1 and the second upper electrode 26-2, are selectively etched by using the resist pattern as a mask. In addition, a portion of the third interlayer insulation film 27, the first insulating hydrogen barrier layer 150, and the second interlayer insulation film 21, which is located above the fifth conductive contact plug 20, is selectively etched. Furthermore, the upper portion of the fifth conductive contact plug 20 and a portion of the first interlayer insulation film 15 that surrounds the fifth conductive contact plug 20 are selectively etched. Thus, an eighth contact hole 58, which penetrates the third interlayer insulation film 27 and the first insulating hydrogen barrier layer 150 is formed above the first upper electrode 26-1. In addition, a ninth contact hole 59, which penetrates the third interlayer insulation film 27 and the first insulating hydrogen barrier layer 150, is formed above the second upper electrode 26-2. Furthermore, a tenth contact hole 60 is formed above the fifth conductive contact plug 20. The tenth contact hole 60 penetrates the third interlayer insulation film 27, the first insulating hydrogen barrier layer 150, and the second interlayer insulation film 21, and also reaches the upper portion of the fifth conductive contact plug 20 and the portion of the first interlayer insulation film 15 that surrounds the fifth conductive contact plug 20. As a result, a portion of the upper surface of the first upper electrode 26-1 is exposed through the eighth contact hole 58. Furthermore, a portion of the upper surface of the second upper electrode 26-2 is exposed through the ninth contact hole 59. Furthermore, the upper portion of the fifth conductive contact plug 20 is exposed through the tenth contact hole 60. Then, the resist pattern used for forming these contact holes is eliminated with a heretofore known method.

Figure 33:
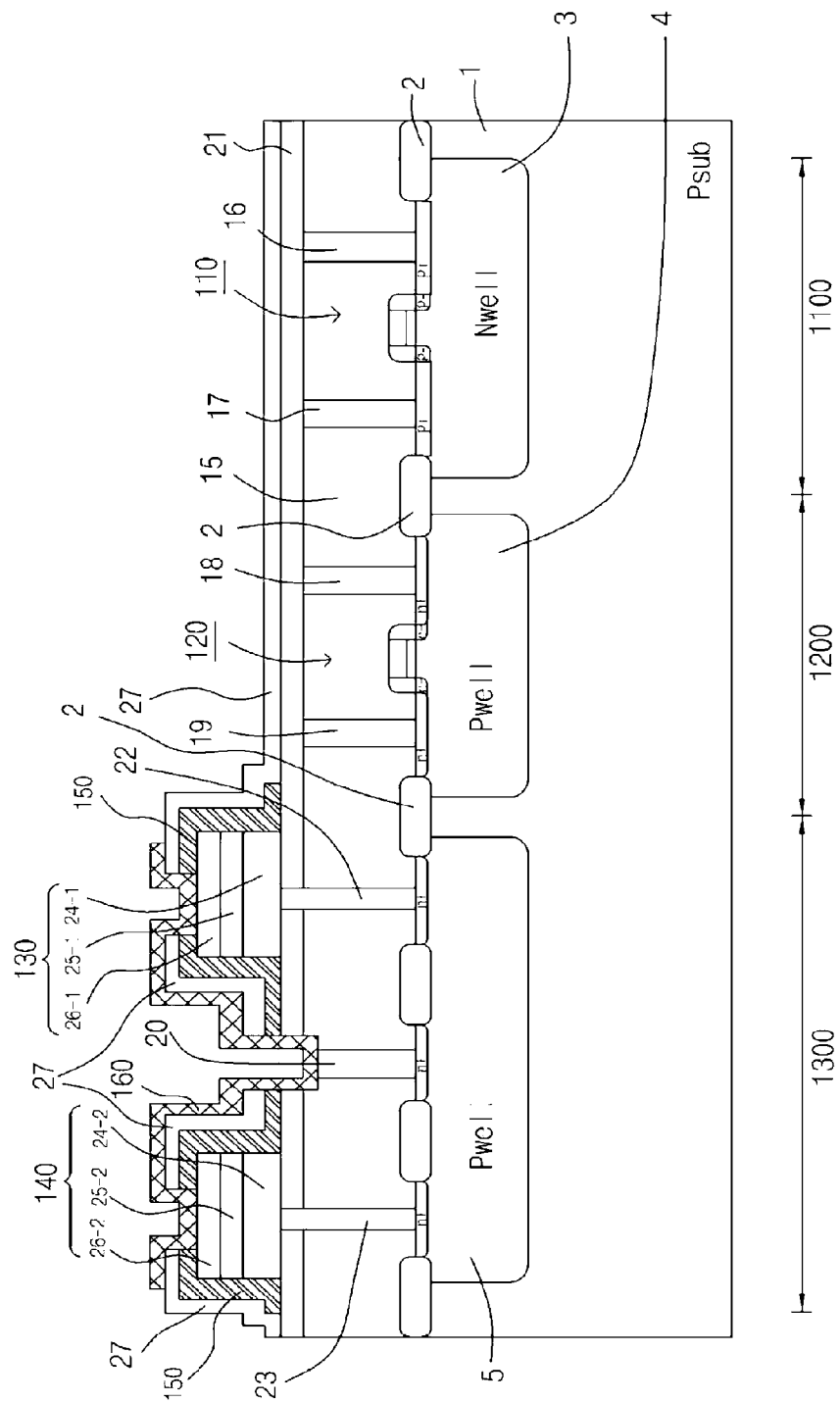
FIG. 33 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 34:
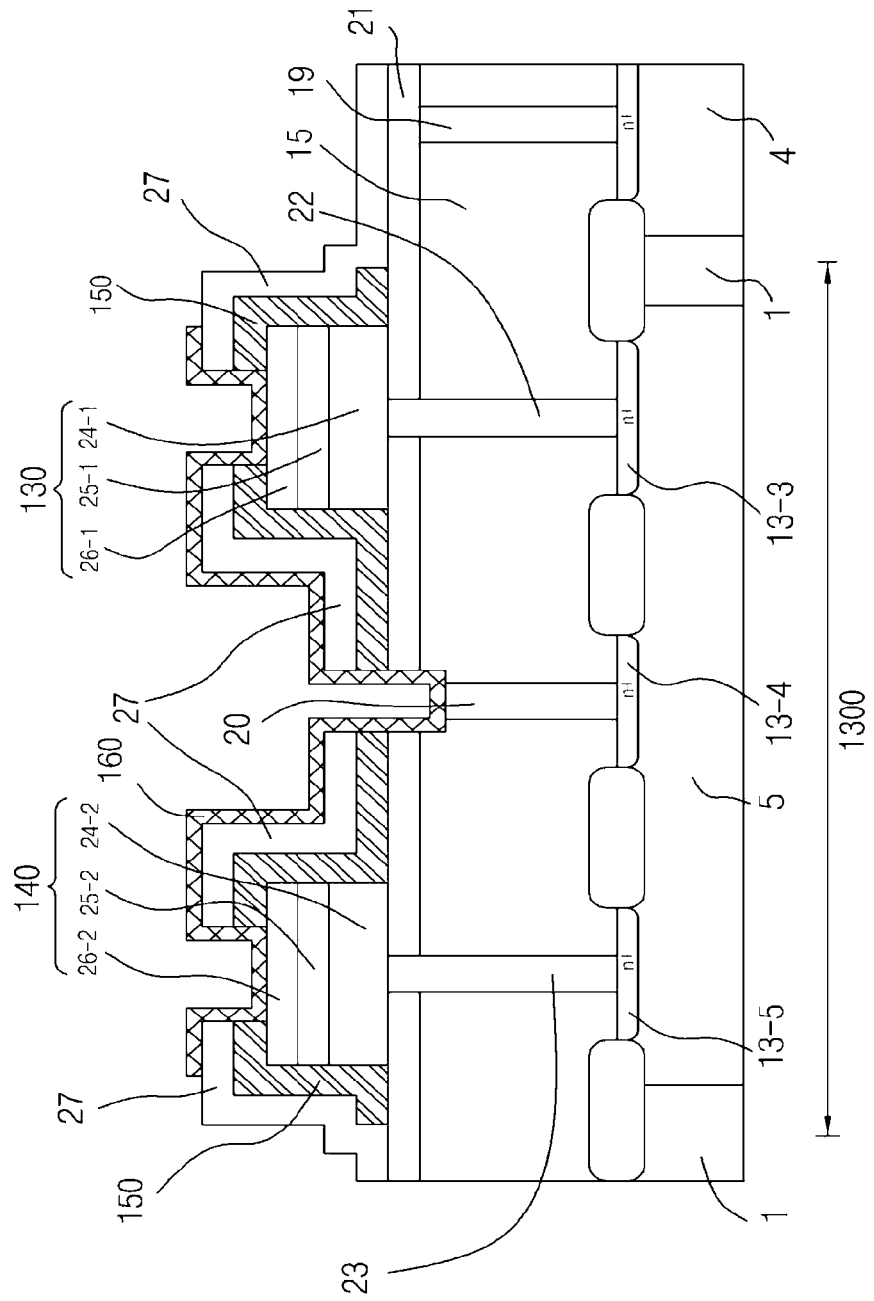
FIG. 34 is a partial enlarged vertical cross-section diagram of the pair of FeRAM cells shown in FIG. 33.

Next, a layer that has hydrogen permeability properties and conductive properties is formed on portions of the third interlayer insulation film 27 and in the eighth contact hole 58, the ninth contact hole 59, and the tenth contact hole 60. This layer functions as a local interconnection. Therefore, this layer has a low electrical conductivity, compared to a layer functioning as a global interconnection. In other words, this layer may be comprised of a material with high resistivity. For example, this layer can be comprised of a TiN layer of 2000 Å in thickness. When this layer is formed in the reducing atmosphere, hydrogen that is supplied in the reducing atmosphere diffuses above and into the first upper electrode 26-1 and the second upper electrode 26-2 through the above described eighth contact hole 58 and the above described ninth contact hole 59. Next, a resist pattern is formed on the TiN layer functioning as a local interconnection with a heretofore known lithography technique. This resist pattern has openings above the first upper electrode 26-1 and the second upper electrode 26-2, and between the first upper electrode 26-1 and the second upper electrode 26-2. As shown in FIGS. 33 and 34, the TiN layer functioning as a local interconnection is selectively etched by using this resist pattern as a mask. Thus a first local interconnection layer 160 is formed. This first local interconnection layer 160 is formed above the first upper electrode 26-1 and the second upper electrode 26-2, and between the first upper electrode 26-1 and the second upper electrode 26-2. In addition, this first local interconnection layer 160 is formed in the eighth contact hole 58, the ninth contact hole 59, and the tenth contact hole 60. The first local interconnection layer 160 has a contact with the first upper electrode 26-1 of the first capacitor 130 in the eighth contact hole 58. Furthermore, the first local interconnection layer 160 has a contact with the second upper electrode 26-2 of the second capacitor 140 in the ninth contact hole 59. In addition, the first local interconnection layer 160 has a contact with the fifth conductive contact plug 20 in the tenth contact hole 60. Furthermore, the first local interconnection layer 160 is electrically connected to the $N^+$ high concentration impurity diffusion region 13-4 through the fifth conductive contact plug 20.

As described above, the $N^+$ high concentration impurity diffusion region 13-4 comprises either of source/drain regions of a switching transistor formed between a plate line functioning as a global interconnection and a local interconnection. Therefore, the first local interconnection layer 160 is electrically connected to the switching transistor through the fifth conductive contact plug 20. In other words, the first local interconnection layer 160 provides an electrical connection between a counter electrode comprised of the first upper electrode 26-1 of the first capacitor 130 and a counter electrode comprised of the second upper electrode 26-2 of the second capacitor 140. In addition, the first local interconnection layer 160 provides an electrical connection between these counter electrodes and the switching transistor. Therefore, each of the counter electrodes of the first capacitor 130 and the second capacitor 140 is electrically connected to the switching transistor through the first local interconnection layer 160.

Figure 35:
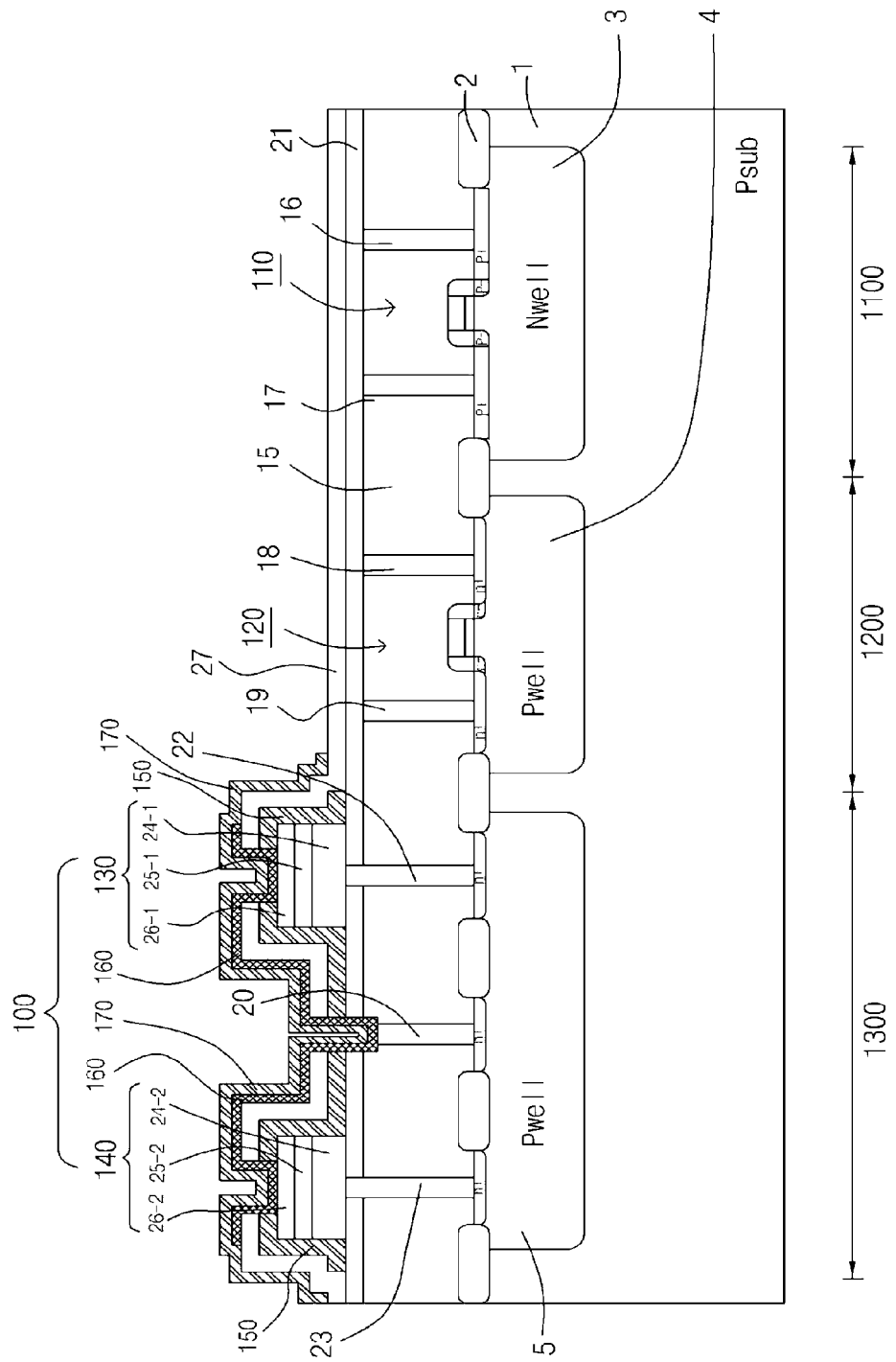
FIG. 35 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 36:
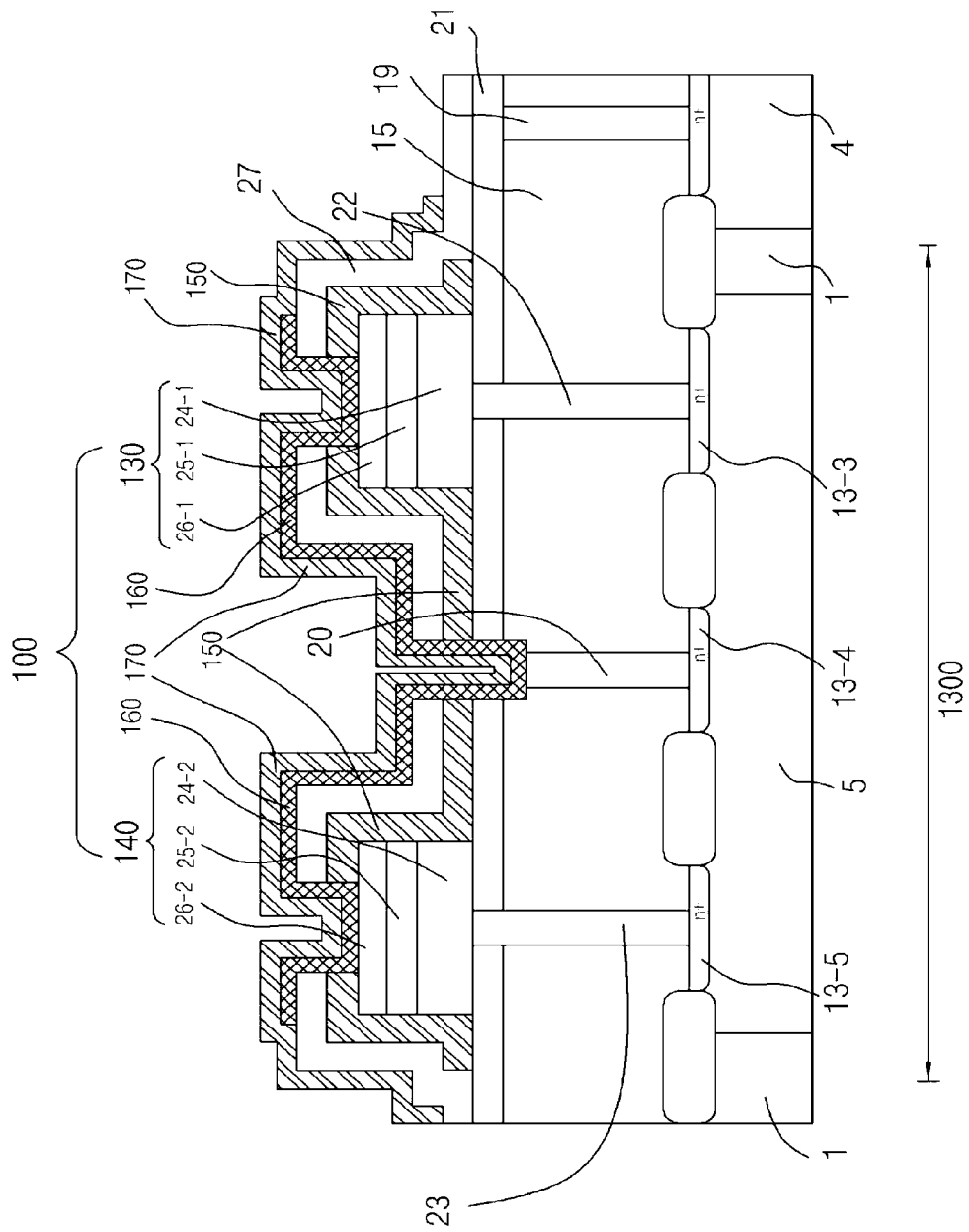
FIG. 36 is a partial enlarged vertical cross-section diagram of the pair of FeRAM cells shown in FIG. 35.

An insulating hydrogen barrier film that has electrical insulation properties and hydrogen non-permeability properties is formed on the first local interconnection layer 160 and the third interlayer insulation film 27 with the CVD method. For example, it is preferable for this insulating hydrogen barrier film to be comprised of an alumina ($Al_2O_3$) film or a STO ($SrTiO_3$) film. For example, the insulating hydrogen barrier film can be comprised of an alumina ($Al_2O_3$) film of 500 Å in thickness. Also, a TEOS film of 500 Å in thickness is formed on the insulating hydrogen barrier film with the plasma CVD method. Furthermore, a resist pattern is formed on the TEOS film with a heretofore known lithography technique. This TEOS film is etched by using this resist pattern as a mask, and thus a hard mask is formed. Then, the resist pattern is eliminated with a heretofore known method. Next, as shown in FIGS. 35 and 36, the alumina film is selectively etched by using the formed hard mask. Thus a second insulating hydrogen barrier layer 170 is formed. This second insulating hydrogen barrier layer 170 covers the whole surface of the first local interconnection layer 160, and also covers portions of the third interlayer insulation film 27 that correspond to the outer vicinity portions of the first local interconnection layer 160. Therefore, the second insulating hydrogen barrier layer 170 is formed within the third element region. In other words, the second insulating hydrogen barrier layer 170 is formed on the first local interconnection layer 160 and the portions of the third interlayer insulation film 27 that corresponds to the outer vicinity portion of the first local interconnection layer 160. Then, the hard mask used for forming the second insulating hydrogen barrier layer 170 is eliminated with a heretofore known method.

As described above, the second insulating hydrogen barrier layer 170 has electrical insulation properties and hydrogen non-permeability properties. In addition, the second insulating hydrogen barrier layer 170 is formed on the first local interconnection layer 160 and portions of the third interlayer insulation film 27 within the third element region 1300. In other words, the second insulating hydrogen barrier layer 170 entirely covers the first local interconnection layer 160. Furthermore, portion of the third interlayer insulation film 27, which is not covered with the first local interconnection layer 160 and formed adjacent to the first insulating hydrogen barrier layer 150, is covered with the second insulating hydrogen barrier layer 170.

Figure 37:
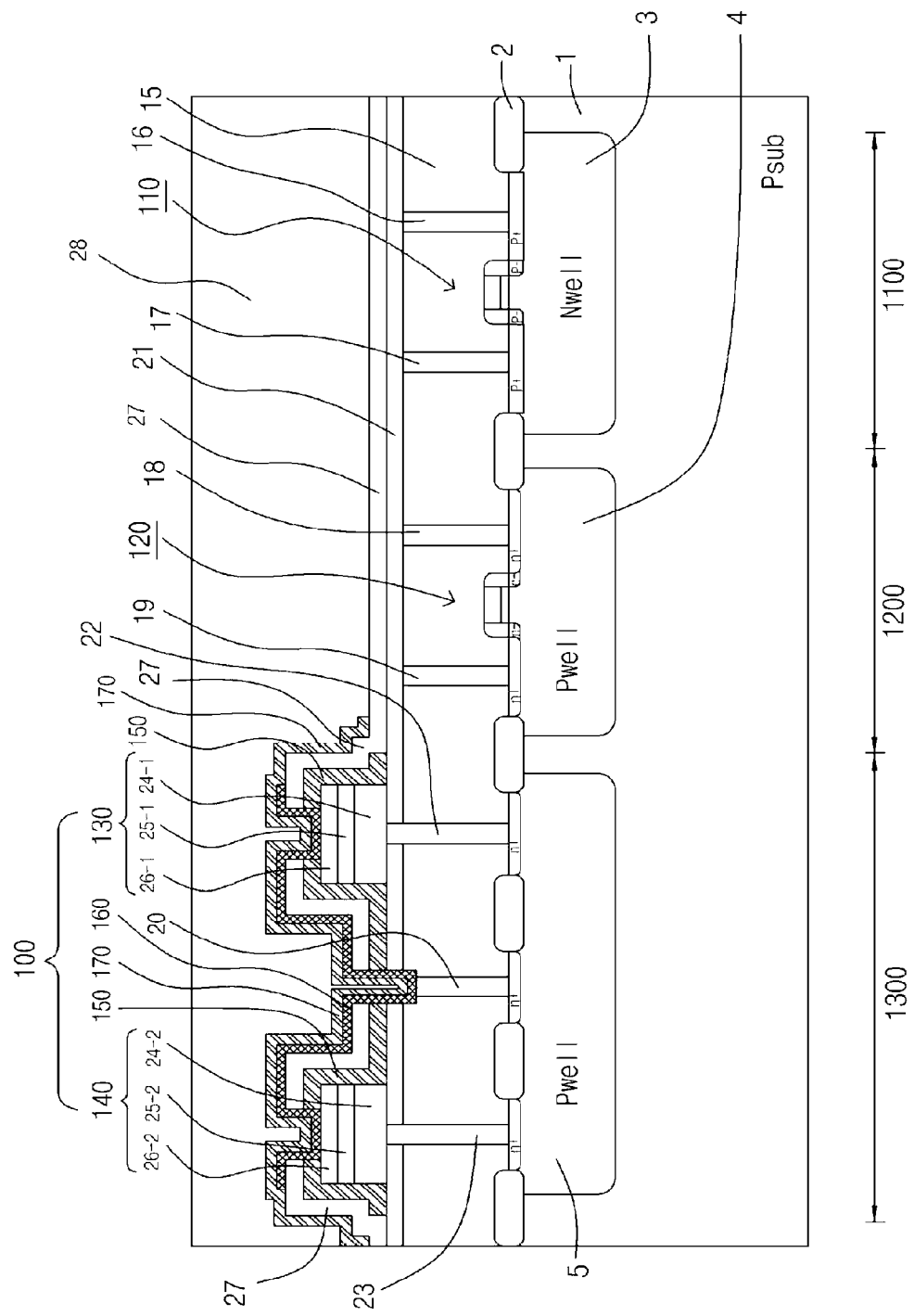
FIG. 37 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 37, a fourth interlayer insulation film 28 is formed on the second insulating hydrogen barrier layer 170 and the third interlayer insulation film 27. The fourth interlayer insulation film 28 can be comprised of a heretofore known interlayer insulation film. For example, the fourth interlayer insulation film 28 can be comprised of a TEOS film that is formed with the plasma CVD method and the subsequent CMP method.

Figure 38:
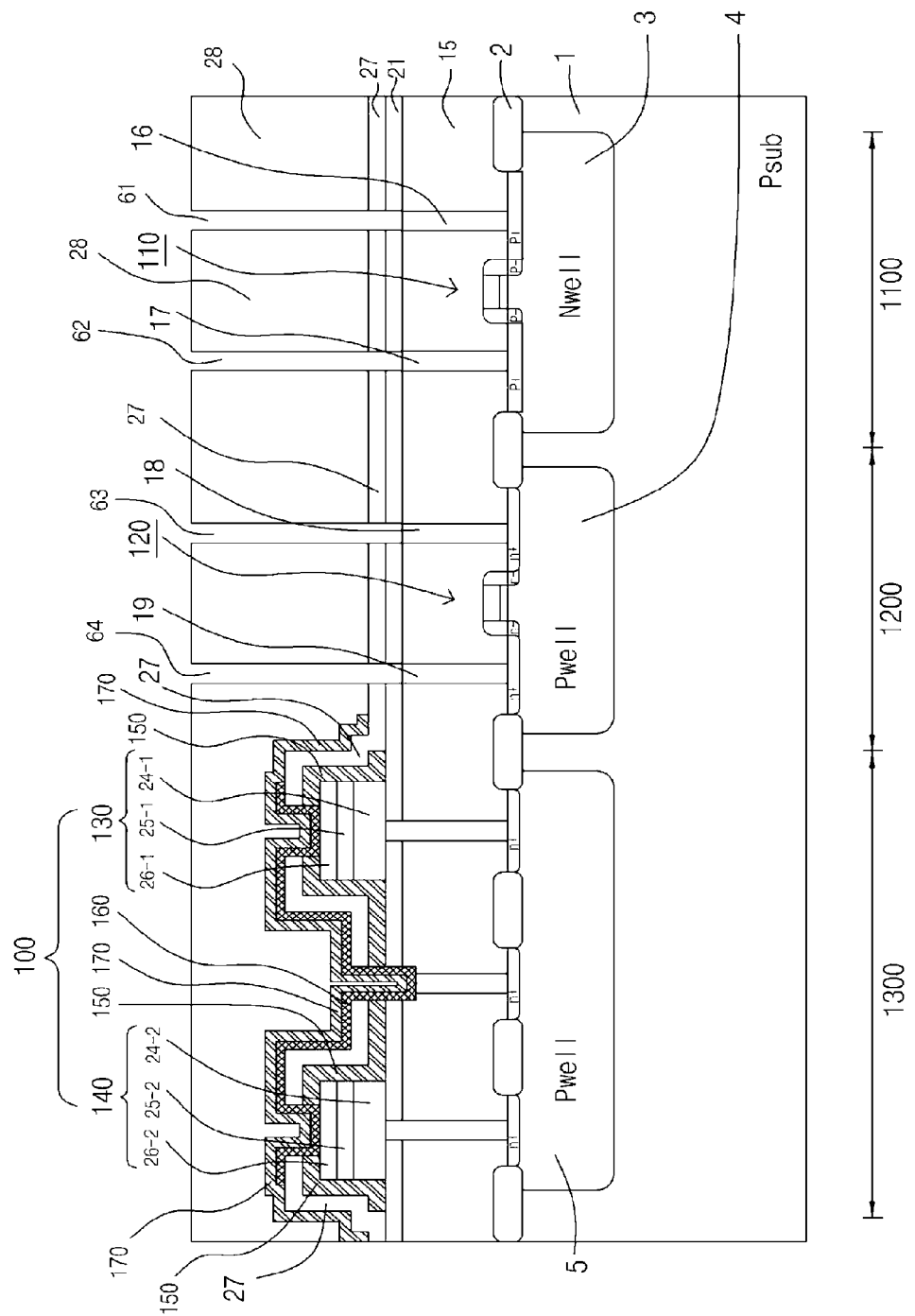
FIG. 38 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

Next, a resist pattern is formed on the fourth interlayer insulation film 28 with a heretofore known lithography technique. This resist pattern has openings which are formed above the first conductive contact plug 16, the second conductive contact plug 17, the third conductive contact plug 18, and the fourth conductive contact plug 19. As shown in FIG. 38, the fourth interlayer insulation film 28, the third interlayer insulation film 27, and the second interlayer insulation film 21 are selectively etched and eliminated by using this resist pattern as a mask. Thus an eleventh contact hole 61, a twelfth contact hole 62, a thirteenth contact hole 63, and a fourteenth contact hole 64 are formed in the fourth interlayer insulation film 28, the third interlayer insulation film 27, and the second interlayer insulation film 21. The eleventh contact hole 61 reaches the upper surface of the first conductive contact plug 16. The twelfth contact hole 62 reaches the upper surface of the second conductive contact plug 17. The thirteenth contact hole 63 reaches the upper surface of the third conductive contact plug 18. The fourteenth contact hole 64 reaches the upper surface of the fourth conductive contact plug 19.

Figure 39:
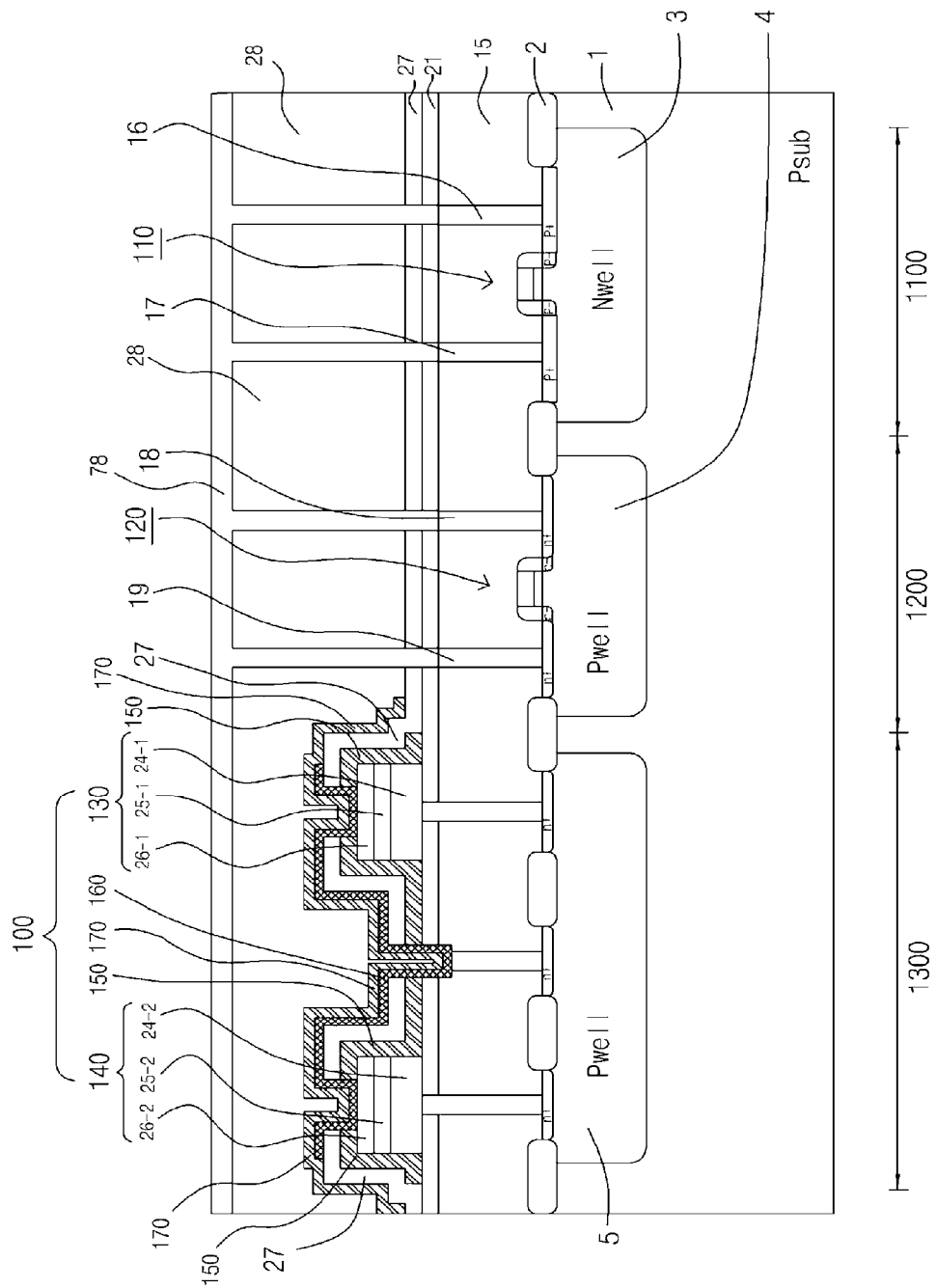
FIG. 39 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 39, a fifth conductive film 78 is formed on the fourth interlayer insulation film 28 and in the eleventh to fourteenth contact holes 61, 62, 63, and 64. The eleventh to fourteenth contact holes 61, 62, 63, and 64 are completely filled with the fifth conductive film 78. The fifth conductive film 78 can be comprised of a heretofore known layer structure and a heretofore known material. For example, the fifth conductive film 78 may be comprised of a tungsten layer formed with the CVD method.

Figure 40:
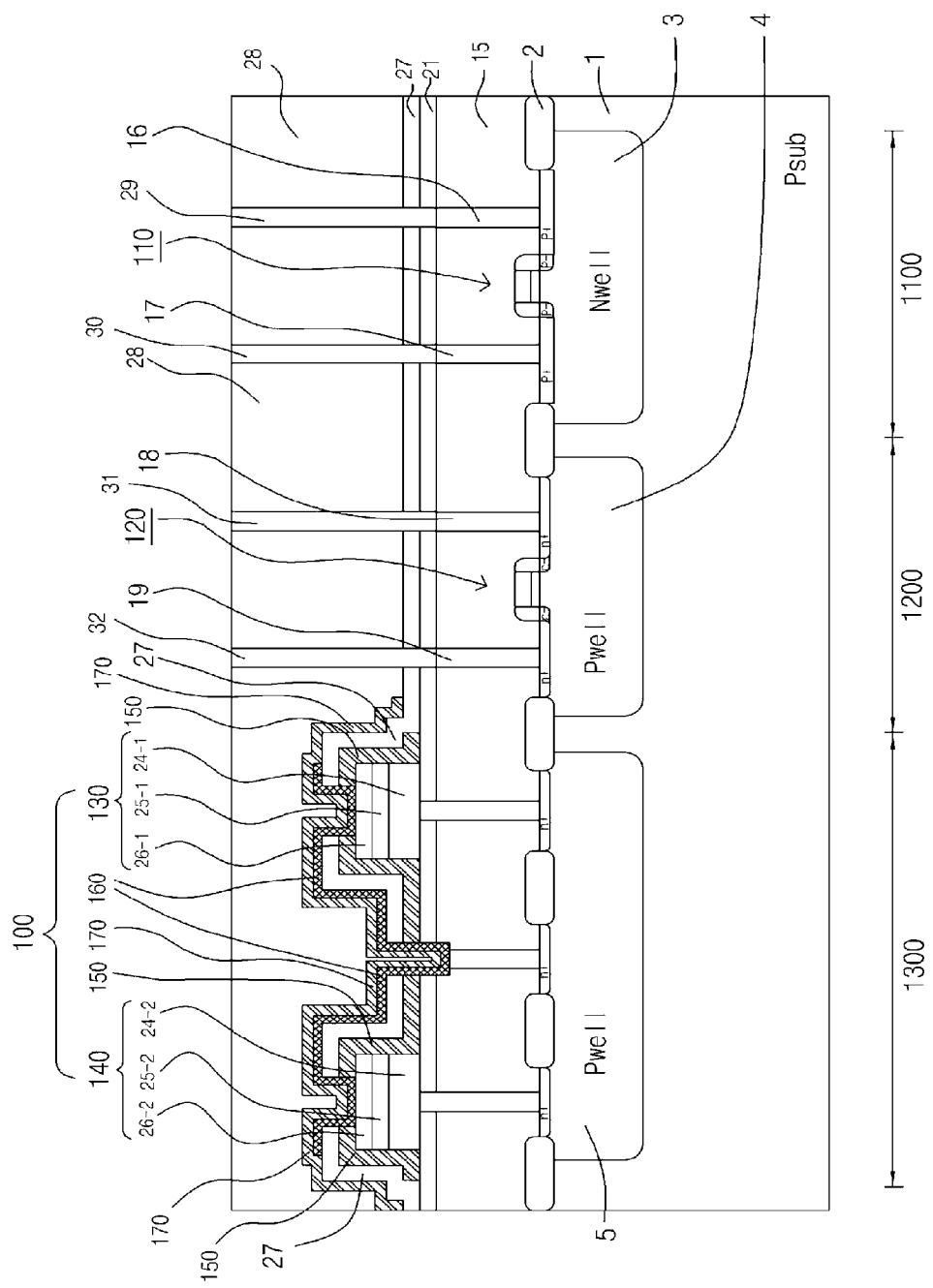
FIG. 40 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.

As shown in FIG. 40, the fifth conductive film 78 is etched back with the CMP method. Thus a portion of the fifth conductive film 78 which is formed on the fourth interlayer insulation film 28 is eliminated, and portions of the fifth conductive film 78 which are formed in the eleventh to fourteenth contact holes 61, 62, 63, and 64 are left. As a result, eighth to eleventh conductive contact plugs 29, 30, 31, and 32 are formed in the eleventh to fourteenth contact holes 61, 62, 63, and 64, respectively. The eighth conductive contact plug 29 is electrically connected to the $P^+$ high concentration impurity diffusion region 14-1 through the first conductive contact plug 16. The ninth conductive contact plug 30 is electrically connected to the $P^+$ high concentration impurity diffusion region 14-2 through the second conductive contact plug 17. The tenth conductive contact plug 31 is electrically connected to the $N^+$ high concentration impurity diffusion region 13-1 through the third conductive contact plug 18. The eleventh conductive contact plug 32 is electrically connected to the $N^+$ high concentration impurity diffusion region 13-2 through the fourth conductive contact plug 19. One planar surface is formed by the upper surface of the interlayer insulation film 28 and the upper surfaces of the eighth to eleventh conductive contact plugs 29, 30, 31, and 32.

Figure 41:
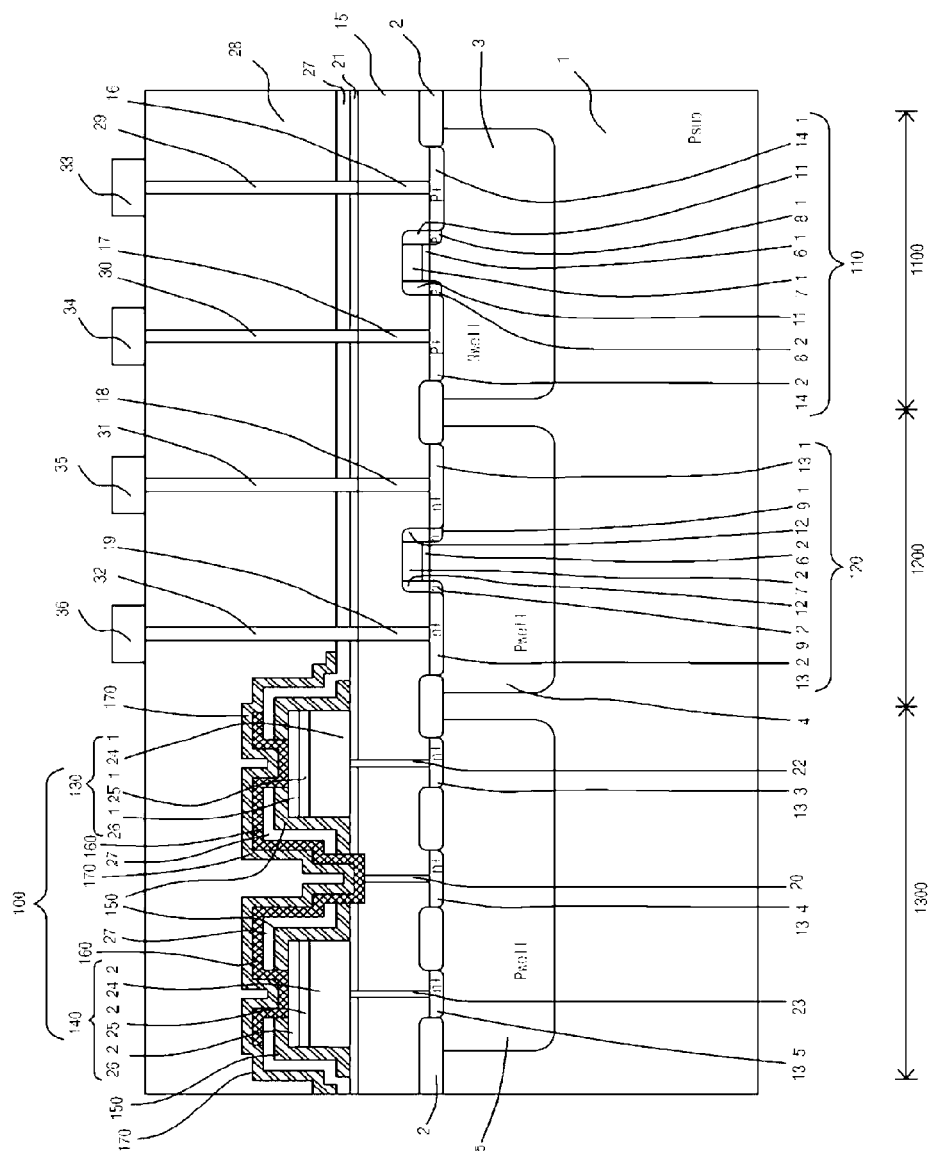
FIG. 41 is a partial vertical cross-section diagram showing a step of a manufacturing process of the semiconductor memory device, which includes the pair of FeRAM cells having a ferroelectric capacitor and a p-channel MOS transistor and a n-channel MOS transistor in a logical circuit in accordance with the first embodiment of the present invention.
Figure 42:
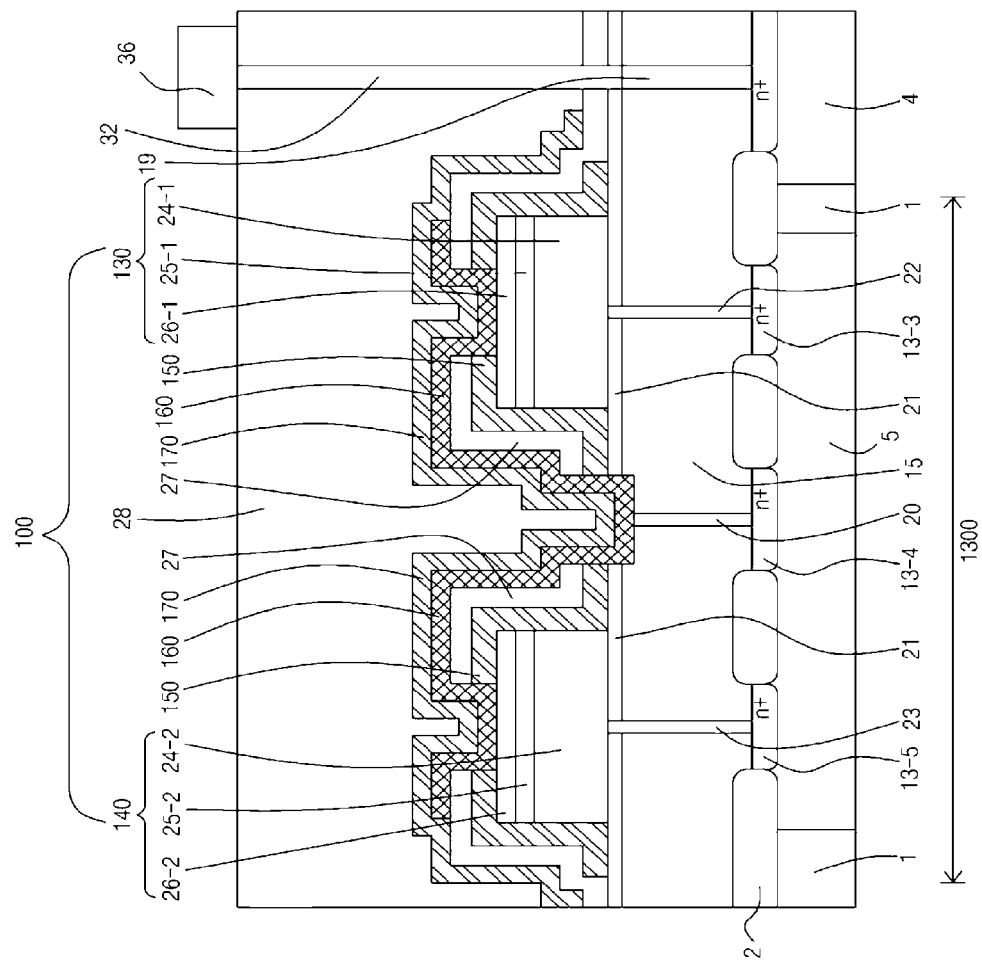
FIG. 42 is a partial enlarged vertical cross-section diagram of the pair of FeRAM cells shown in FIG. 41.

As shown in FIG. 41, first to fourth metal wiring layers 33, 34, 35, and 36, which function as a first level wiring layer, are formed on the fourth interlayer insulation film 28 with a heretofore known method. The first metal wiring layer 33 is formed on the fourth interlayer insulation film 28 and has a contact with the eighth conductive contact plug 29. The second metal wiring layer 34 is formed on the fourth interlayer insulation film 28 and has a contact with the ninth conductive contact plug 30. The third metal wiring layer 35 is formed on the fourth interlayer insulation film 28 and has a contact with the tenth conductive contact plug 31. The fourth metal wiring layer 36 is formed on the fourth interlayer insulation film 28 and has a contact with the eleventh conductive contact plug 32. The first metal wiring layer 33 is electrically connected to the $P^+$ high concentration impurity diffusion region 14-1 through the eighth conductive contact plug 29 and the first conductive contact plug 16. The second metal wiring layer 34 is electrically connected to the $P^+$ high concentration impurity diffusion region 14-2 through the ninth conductive contact plug 30 and the second conductive contact plug 17. The third metal wiring layer 35 is electrically connected to the $N^+$ high concentration impurity diffusion region 13-1 through the tenth conductive contact plug 31 and the third conductive contact plug 18. The fourth metal wiring layer 36 is electrically connected to $N^+$ high concentration impurity diffusion region 13-2 through the eleventh conductive contact plug 32 and the fourth conductive contact plug 19. Then, a multi-layer wiring structure is formed with a heretofore known method. Finally, a passivation film is formed and thus a semiconductor memory device is completed.

As shown in FIGS. 1 to 42, a pair of FeRAM cells 100 included in the semiconductor memory device in accordance with the above described first embodiment of the present invention has a hydrogen barrier structure, which prevents or inhibits the first and second metal oxide ferroelectric films 25-1 and 25-2 included in the first and second capacitors 130 and 140, respectively, from being exposed to diffusion of hydrogen provided by a reducing atmosphere.

As described above, according to the first embodiment of the present invention, the third and fourth interlayer insulation films 27 and 28, and the eighth to eleventh conductive contact plugs 29, 30, 31, and 32 are formed with the CVD method after the first capacitor 130 and the second capacitor 140 are formed. In addition, the fourth interlayer insulation film 28 and the eighth to eleventh conductive contact plugs 29, 30, 31, and 32 are formed with the CVD method after the first local interconnection layer 160 is formed. This step of the CVD method is conducted in a reducing atmosphere. Therefore, the first metal oxide ferroelectric film 25-1 and the second metal oxide ferroelectric film 25-2, both of which are included in the first capacitor 130 and the second capacitor 140, respectively, must be prevented from being reduced by the diffusion of hydrogen that functions as the reducing agent and is provided during the CVD method. The first upper electrode 26-1 and the second upper electrode 26-2 are comprised of a material that has electrical conductivity properties and hydrogen permeability properties (e.g., Pt). Therefore, there is a possibility that hydrogen will diffuse into the first metal oxide ferroelectric film 25-1 and the second metal oxide ferroelectric film 25-2 once hydrogen diffuses into the first upper electrode 26-1 and the second upper electrode 26-2. Therefore, hydrogen must be prevented from diffusing into the first upper electrode 26-1 and the second upper electrode 26-2. Furthermore, hydrogen must be prevented from directly entering the first metal oxide ferroelectric film 25-1 and the second metal oxide ferroelectric film 25-2 through the lateral surfaces of the first metal oxide ferroelectric film 25-1 and the second metal oxide ferroelectric film 25-2, respectively. Furthermore, it is preferable that the first lower electrode 24-1 and the second lower electrode 24-2 have a multi-layer structure, respectively, and that a bottom layer of this multi-layer structure has electrical conductivity properties and hydrogen non-permeability properties. However, hydrogen must be prevented from directly entering the first metal oxide ferroelectric film 25-1 and the second metal oxide ferroelectric film 25-2 through the other layers of this multi-layer structure except for the bottom layer. The above described first insulating hydrogen barrier layer 150 blocks these plurality of diffusion pathways of hydrogen.

However, the above described first local interconnection layer 160 that has electrical conductivity properties and hydrogen permeability properties provides a diffusion pathway of hydrogen. This first local interconnection layer 160 is formed only within the third element region 1300. In addition, as described above, the first local interconnection layer 160 is an exclusive interconnection that provides an interconnection between the first upper electrode 26-1 and the second upper electrode 26-2, both of which are included in the first capacitor 130 and the second capacitor 140 of a pair of the first FeRAM cell and the second FeRAM cell, respectively. This exclusive interconnection is different from a general global interconnection in that the exclusive interconnection provides an electrical interconnection which is limited to a specific region. The exclusive interconnection formed only in a specific region functions as a diffusion pathway of hydrogen, and has the first and second contact portions with the first upper electrode 26-1 and the second upper electrode 26-2, respectively. Therefore, it is required to prevent hydrogen from entering this diffusion pathway.

In addition, it is required to prevent hydrogen from diffusing into the first metal oxide ferroelectric film 25-1 and the second metal oxide ferroelectric film 25-2 sequentially through the diffusion pathway that is comprised of the first local interconnection layer 160, the contact portions between the first local interconnection layer 160 and the first and second upper electrodes 26-1 and 26-2, and the first upper electrode 26-1 and the second upper electrode 26-2.

Therefore, according to the first embodiment of the present invention, it is meaningful that the hydrogen diffusion pathway including the first local interconnection layer 160 is blocked by forming not only the first insulating hydrogen barrier layer 150 that covers the first capacitor 130 and the second capacitor 140, but also the second insulating hydrogen barrier layer 170 that preferably covers the whole of the first local interconnection layer 160 and covers at least the above described contact portions. It is almost certain that hydrogen functioning as the reducing agent will be prevented from diffusing into the first metal oxide ferroelectric film 25-1 and the second metal oxide ferroelectric film 25-2 by the combination of the above described first insulating hydrogen barrier layer 150 and the second insulating hydrogen barrier layer 170.

The diffusion pathway of hydrogen to the first metal oxide ferroelectric film 25-1 and the second metal oxide ferroelectric film 25-2 is almost completely blocked by the combination of the first insulating hydrogen barrier layer 150 and the second insulating hydrogen barrier layer 170. That is, hydrogen is prevented from diffusing into the first metal oxide ferroelectric film 25-1 and the second metal oxide ferroelectric film 25-2, and thus this combination of the first insulating hydrogen barrier layer 150 and the second insulating hydrogen barrier layer 170 can prevent the ferroelectric properties of the first metal oxide ferroelectric film 25-1 and the second metal oxide ferroelectric film 25-2 from being deteriorated by the reduction reactions with hydrogen.

Alternative Embodiment

As described above, the second insulation hydrogen barrier layer 170 is formed to prevent diffusion of hydrogen through the contact portion between the first local interconnection layer 160 and the first upper electrode 26-1 and the contact portion between the first local interconnection layer 160 and the second upper electrode 26-2. Therefore, the second insulation hydrogen barrier layer 170 is not necessarily formed to completely cover the whole of the first local interconnection layer 160, and a portion of the third interlayer insulation film 27 which is not covered by the first local interconnection layer 160, in other words, a portion of the third interlayer insulation film 27 which is formed adjacent to the first insulation hydrogen barrier layer 150.

The second insulation hydrogen barrier layer 170 is not necessarily formed to cover a portion of the third insulation film 27 that is not covered by the first local interconnection layer 160, in other words, a portion of the third interlayer insulation film 27 that is formed adjacent to the first insulation hydrogen barrier layer 150, if diffusion of hydrogen through the contact portion between the first local interconnection layer 160 and the first upper electrode 26-1 and the contact portion between the first local interconnection layer 160 and the second upper electrode 26-2 is prevented by the second insulation hydrogen barrier layer 170. In addition, it is not necessary to cover the whole of the first local interconnection layer 160. For example, diffusion of hydrogen through the contact portion between the first local interconnection layer 160 and the first upper electrode 26-1 and the contact portion between the first local interconnection layer 160 and the second upper electrode 26-2 may be inhibited by the second insulation hydrogen barrier layer 170 that covers the portions of the first local interconnection layer 160 which have connections with the upper electrode 26-1 and the second upper electrode 26-2. In other words, the second insulation hydrogen barrier layer 170 may be formed to cover at least the portions of the first local wiring layer 160 which have contacts with the first upper electrode 26-1 and the second upper electrode 26-2.

According to the present invention, a hydrogen barrier structure is provided to prevent or inhibit the dielectrics comprising the insulators in the first capacitor 130 and the second capacitor 140 from being deteriorated by reduction reaction with hydrogen. Therefore, the insulators in the first capacitor 130 and the second capacitor 140 are not limited to the metal oxide ferroelectric, and may be comprised of either an oxide ferroelectric or an oxide high dielectric. In other words, if the insulators of the first capacitor 130 and the second capacitor 140 are oxide dielectrics, it is meaningful to apply the hydrogen barrier structure in accordance with the present invention to a semiconductor memory device.

In addition, it is meaningful to apply the present invention to a semiconductor memory device if the dielectrics comprising the insulators in the first capacitor 130 and the second capacitor 140 include an oxide dielectric, or a portion of the insulators is comprised of an oxide dielectric. For example, the insulators in the first capacitor 130 and the second capacitor 140 are comprised of a multi-layer structure, and one layer of the multi-layer structure may be an oxide dielectric layer.

Furthermore, in the first embodiment of the present invention, the above described hydrogen barrier structure is applied to a stack-type capacitor of a FeRAM cell. However, the structure can be effectively applied to other types of capacitors such as a planer-type capacitor. Furthermore, the above described hydrogen barrier structure can be applied to a dielectric memory element except for a capacitor, in other words, a dielectric memory element including an oxide dielectric that must be protected from a reduction reaction.

This application claims priority to Japanese Patent Application No. 2005-129330. The entire disclosure of Japanese Patent Application No. 2005-129330 is hereby incorporated herein by reference.

The terms of degree used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A memory cell structure, comprising:
    a first memory capacitor that is formed within a first local area, the first memory capacitor being comprised of a first lower electrode, a first upper electrode, and a first oxide dielectric film formed between the first lower electrode and the first upper electrode;
    a second memory capacitor that is separated from the first memory capacitor and formed within the first local area, the second memory capacitor being comprised of a second lower electrode, a second upper electrode, and a second oxide dielectric film formed between the second lower electrode and the second upper electrode;
    a first local interconnection layer that is electrically conductive and permeable to hydrogen and is formed only within the first local area, the first local interconnection layer being comprised of a first contact portion that has a contact with the first upper electrode and is separated from the first oxide dielectric film through the first upper electrode, a second contact portion that has a contact with the second upper electrode and is separated from the second oxide dielectric film through the second upper electrode, and a first non-contact portion that connects the first contact portion and the second contact portion and is separated from the first memory capacitor and the second memory capacitor; and
    a first hydrogen barrier layer that is electrically insulating and impermeable to hydrogen, the first hydrogen barrier layer covering at least the first contact portion and the second contact portion of the first local interconnection layer.

2. The memory cell structure according to claim 1, further comprising a first isolation film that is separated from the first contact portion and the second contact portion through the first hydrogen barrier layer.

3. The memory cell structure according to claim 1, wherein the first hydrogen barrier layer covers the first non-contact portion.

4. The memory cell structure according to claim 3, further comprising a first isolation film that is separated from the first contact portion, the second contact portion, and the first non-contact portion through the first hydrogen barrier layer.

5. The memory cell structure according to claim 1, further comprising:
    a second hydrogen barrier layer that is electrically insulating and impermeable to hydrogen, the second hydrogen barrier layer surrounding the first contact portion, covering the lateral surface and the upper surface of the first memory capacitor, surrounding the second contact portion, and covering the lateral surface and the upper surface of the second memory capacitor; and
    a second isolation film that is electrically insulating and impermeable to hydrogen, the second isolation film being formed between the first non-contact portion and the second hydrogen barrier layer.

6. The memory cell structure according to claim 1, further comprising: a first switching transistor that has a first gate electrode electrically connected to a first word-line, and electrically connects a first non-inverted bit-line and the first lower electrode; a second switching transistor that has a second gate electrode electrically connected to the first word-line, and electrically connects a first inverted bit-line and the second lower electrode, and a third switching transistor that has a third gate electrode electrically connected to the first word-line, and electrically connects the first local interconnection layer and the first global interconnection layer.

7. A semiconductor memory device, comprising:
    a first word-line;
    a first non-inverted bit-line;
    a first inverted bit-line;
    a first global interconnection layer;
    a first memory capacitor that is comprised of a first storage electrode, a first counter electrode, and a first oxide dielectric film formed between the first storage electrode and the first counter electrode;

a second memory capacitor that is comprised of a second storage electrode, a second counter electrode, and a second oxide dielectric film formed between the second storage electrode and the second counter electrode;

a first local interconnection layer that is electrically conductive and permeable to hydrogen, the first local interconnection layer including a first contact portion that has a contact with the first counter electrode and is separated from the first oxide dielectric film through the first counter electrode, a second contact portion that has a contact with the second counter electrode and is separated from the second oxide dielectric film through the second counter electrode, and a first non-contact portion that connects the first contact portion and the second contact portion and is separated from the first memory capacitor and the second memory capacitor;

a first hydrogen barrier layer that is electrically insulating and impermeable to hydrogen, the first hydrogen barrier layer covering at least the first contact portion and the second contact portion of the first local interconnection layer;

a first switching transistor that has a first gate electrode electrically connected to the first word-line, the first switching transistor electrically connecting the first non-inverted bit-line and the first storage electrode;

a second switching transistor that has a second gate electrode electrically connected to the first word-line, the second switching transistor electrically connecting the first inverted bit-line and the second storage electrode; and a third switching transistor that has a third gate electrode electrically connected to the first word-line, the third switching transistor electrically connecting the first local interconnection layer and the first global interconnection layer.

8. The semiconductor memory device according to claim 7, further comprising a first insulation film that is separated from the first contact portion and the second contact portion through the first hydrogen barrier layer.

9. The semiconductor memory device according to claim 7, wherein the first hydrogen barrier layer further covers the first non-contact portion.

10. The semiconductor memory device according to claim 9, further comprising a first insulation film that is separated from the first contact portion, the second contact portion, and the first non-contact portion through the first hydrogen barrier layer.

11. The semiconductor memory device according to claim 7, further comprising:

a second hydrogen barrier layer that is electrically insulating and impermeable to hydrogen, the second hydrogen barrier layer surrounding the first contact portion, covering the lateral surface and the upper surface of the first memory capacitor, surrounding the second contact portion, and covering the lateral surface and the upper surface of the second memory capacitor, and a second insulation film that is electrically insulating and permeable to hydrogen, the second insulation film being formed between the first non-contact portion and the second hydrogen barrier layer.

\* \* \* \* \*